United States Patent [19]
Sakai

[11] Patent Number: 6,020,618
[45] Date of Patent: *Feb. 1, 2000

[54] SEMICONDUCTOR DEVICE IN WHICH THIN SILICON PORTIONS ARE FORMED BY ELECTROCHEMICAL STOP ETCHING METHOD

[75] Inventor: Minekazu Sakai, Kariya, Japan

[73] Assignee: Denso Corporation, Kariya, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/758,259

[22] Filed: Nov. 27, 1996

Related U.S. Application Data

[63] Continuation-in-part of application No. 08/415,373, Mar. 29, 1995, Pat. No. 5,677,248.

[30] Foreign Application Priority Data

| Mar. 30, 1994 | [JP] | Japan | 6-60756 |
| May 30, 1994 | [JP] | Japan | 6-117132 |
| May 25, 1994 | [JP] | Japan | 6-136591 |
| Nov. 30, 1995 | [JP] | Japan | 7-312450 |

[51] Int. Cl.[7] .............. H01L 29/82; H01L 29/06
[52] U.S. Cl. ............ 257/419; 257/619; 257/622; 438/53
[58] Field of Search ............... 257/419, 619, 257/622; 438/53

[56] References Cited

U.S. PATENT DOCUMENTS

| 4,505,799 | 3/1985 | Baxter | 204/416 |
| 5,172,207 | 12/1992 | Nojiri | |
| 5,420,458 | 5/1995 | Shimoji | 257/622 |
| 5,591,665 | 1/1997 | Bodensohn et al. | 437/61 |
| 5,614,753 | 3/1997 | Uchikoshi et al. | 257/417 |

FOREIGN PATENT DOCUMENTS

| 0 567 075 | 10/1993 | European Pat. Off. . |
| 1-251631 | 10/1989 | Japan . |
| 2-138740 | 5/1990 | Japan . |
| 3-209778 | 9/1991 | Japan . |
| 4-039969 | 2/1992 | Japan . |
| 4-050736 | 8/1992 | Japan . |
| 4-239183 | 8/1992 | Japan . |
| 5-027971 | 4/1993 | Japan . |
| 5-066728 | 9/1993 | Japan . |
| 5-283517 | 10/1993 | Japan . |
| 6-104454 | 4/1994 | Japan . |

*Primary Examiner*—Mahshid Saadat
*Assistant Examiner*—Allan R. Wilson
*Attorney, Agent, or Firm*—Pillsbury Madison & Sutro LLP

[57] ABSTRACT

A semiconductor device such as a semiconductor dynamic sensor which is produced at an improved chip yield is provided. Etching wiring having a main line and a branch line is formed on a chip region via an intervening insulating film. The chip region contains an N-type reduced thickness region and is surrounded by a P-type chip isolating layer. The etching wiring is formed with a gap (an etching wiring gap) from other etching wiring members or circuit wiring formed on the chip region via an intervening insulating film. The etching wiring gap is greater than any of the gaps between members of the circuit wiring.

32 Claims, 48 Drawing Sheets

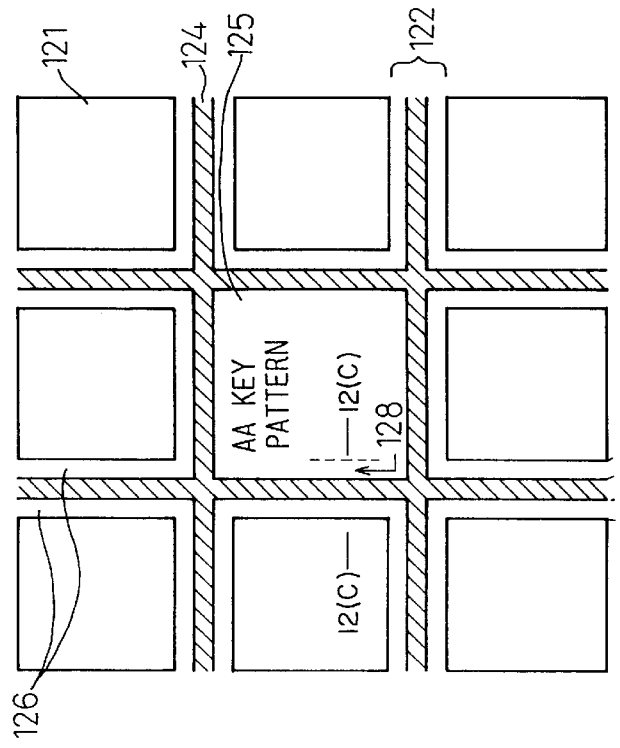
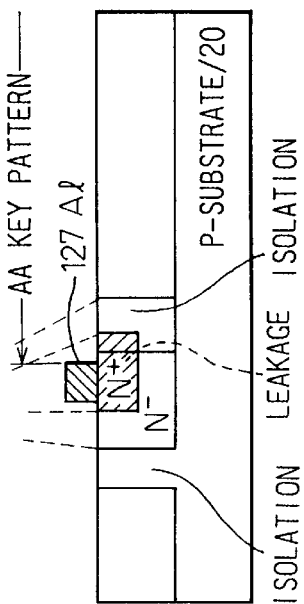
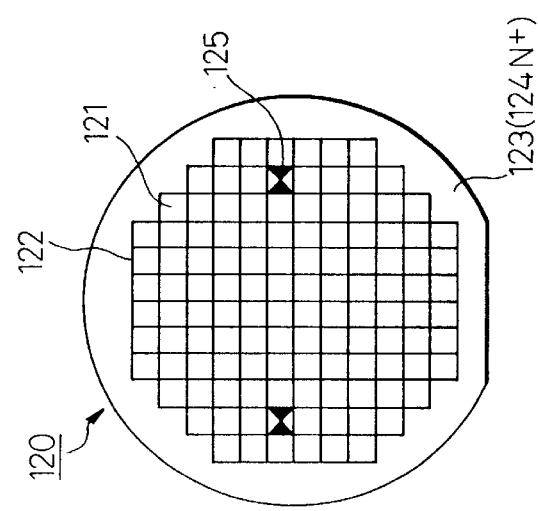

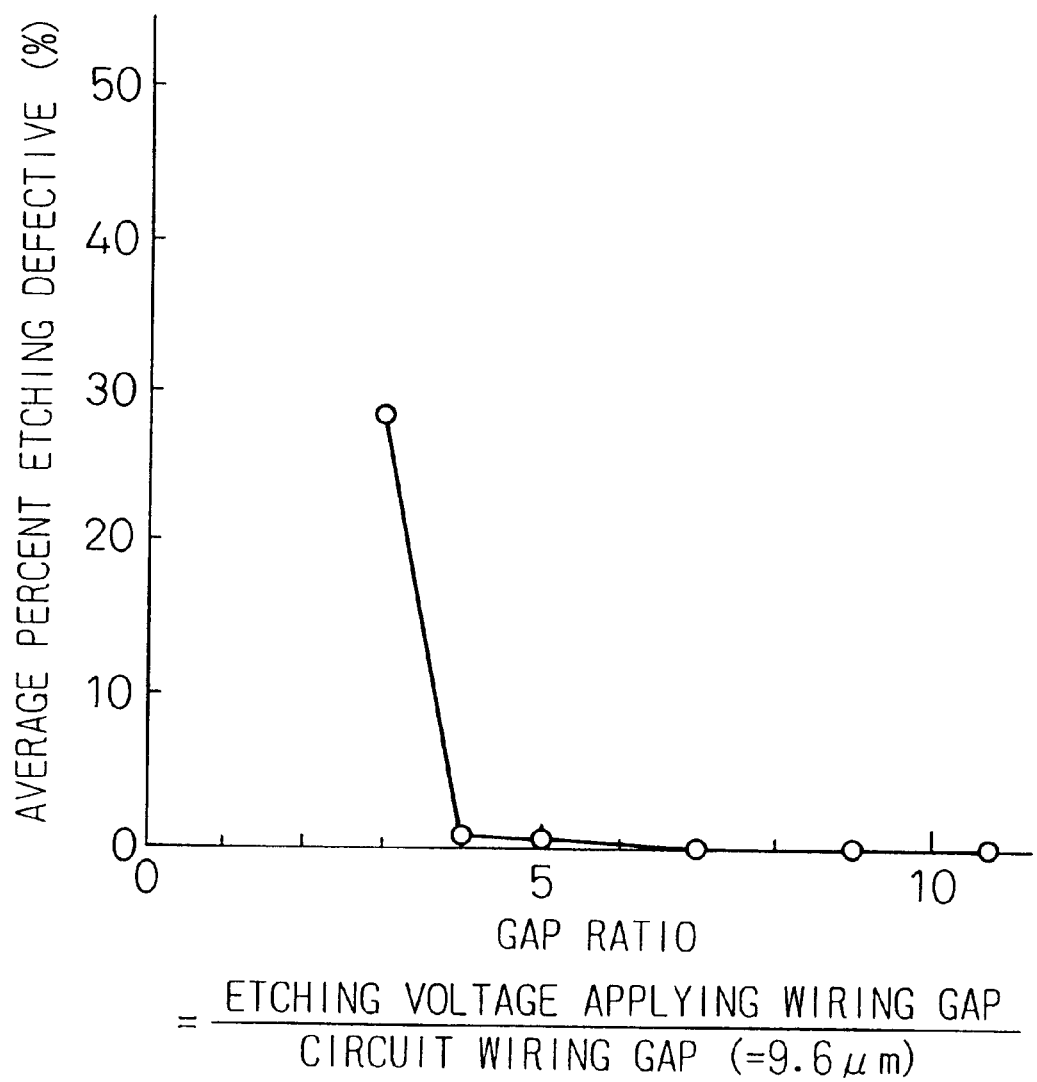

SEMICONDUCTOR DEVICE IN WHICH THIN SILICON PORTIONS ARE FORMED BY ELECTROCHEMICAL STOP ETCHING METHOD

CROSS-REFERENCES TO RELATED APPLICATION

This application is a continuation-in-part application of U.S. Ser. No. 08/415,373 filed on Mar. 29, 1995 now U.S. Pat. No. 5,677,248 issued on Oct. 14, 1997.

BACKGROUND OF THE INVENTION

1. Field of the Invention

The present invention relates to a semiconductor device in which thin silicon portions are formed by electrochemical stop etching and to a method of producing the same.

2. Description of the Related Art

In recent years, electrochemical stop etching technology has been employed in which, in forming a thin silicon portion on a semiconductor wafer, the etching is automatically stopped when the thickness of the thin silicon portion has reached a predetermined value. According to this electrochemical stop etching, a voltage fed from an external unit is controlled so that the thickness of the thin silicon portion is a desired value.

Described below, with reference to the drawings, is a wafer structure constituting a conventional semiconductor device used in the electrochemical stop etching technology. Also described below is a case where, for example, a diaphragm is formed as a thin silicon portion by electrochemical stop etching.

FIG. 7 is a plan view which schematically illustrates a semiconductor wafer 19, wherein a plurality of product chips (hereinafter referred to as chip patterns) 20, on which a diaphragm of a predetermined thickness will be formed (not shown), are provided on the surface of the wafer with scribes 21 between them, and a high N+ concentration region 22 (hereinafter referred to as low-resistance layer) is formed in the periphery of the wafer to surround all the chip patterns 20.

FIG. 8 illustrates, in cross section, the constitution between the chip patterns 20 in the semiconductor wafer 19, and is a sectional view along B-B of FIG. 7. An N-type epitaxial layer 23 is provided in the scribe regions between the chip patterns 20, a low-resistance layer 24 is provided as in the periphery of the wafer, and aluminum wiring 25 for etching are formed directly on the low-resistance layer 24. A positive voltage is fed from an external unit to the aluminum wirings 25 for etching in order to form a diaphragm (not shown) on the predetermined portions of the chip patterns 20 by etching. In the periphery of the chip pattern 20, furthermore, an aluminum wiring 26 for grounding (hereinafter referred to as GND aluminum wiring) is provided on a field oxide film 27 being connected to the isolation 28 (P+) region. The field oxide film 27 is formed on a predetermined portion other than the scribe region.

The low-resistance layer 24 is diffused in the scribe region because, even if the aluminum wiring 25 for etching is broken due to photo-defects or scars, the voltage is reliably applied to the N-epitaxial layer (not shown) of the diaphragm region in the chip pattern 20 by utilizing the low-resistance layer 24 during the etching. Furthermore, the field oxide film 27 is not formed on the whole scribe region from the standpoint of preventing a reduction in the life of the blade (not shown) during the cutting of the semiconductor wafer into dices in a subsequent step.

By employing the above-mentioned wafer structure, a voltage the same as the external voltage is applied to the epitaxial layer in the diaphragm-forming portions of all the product patterns.

By using the semiconductor wafer 19 of this constitution, the electrochemical stop etching is carried out by using the means shown in FIG. 9. The semiconductor wafer 19 is covered on its non-etching surface with a protection film 29 such as wax or the like, and is secured to a ceramic plate 30. In this state, the semiconductor wafer 19 is immersed in an etching solution 31 such as KOH in a manner that at least the portions to be etched are completely immersed therein. The low-resistance layers 22 or the aluminum wirings 25 for etching in the periphery of the wafer are directly connected to a platinum electrode 32, so that the positive voltage is supplied to the N-epitaxial layer of the diaphragm region in the chip pattern 20. Here, a negative voltage is applied to another platinum electrode 33 immersed in the etching solution 31. Thus, a diaphragm is formed in the chip patterns 20 of the semiconductor wafer 19.

According to the above-mentioned conventional semiconductor device, however, the following problems occur in the production process.

A first problem is that aluminum remains on a stepped portion of the oxide film between the aluminum wiring 25 for etching and the GND aluminum wiring 26, which makes it difficult to obtain a diaphragm of a desired thickness.

This state will be described with reference to FIG. 10(A).

The aluminum wirings 25 for etching and GND aluminum wiring 26 are deposited by aluminum vaporization or sputtering, and are patterned by using a photoresist. The GND aluminum wiring 26 is connected to the P-type substrate 34 via the field oxide film 27. Therefore, the aluminum wirings 25 for etching and the GND aluminum wiring 26 have different heights, and a step 35 of about 1 μm develops in the oxide film between them. When the aluminum wiring is subjected to the photo-etching, therefore, the resist fails to acquire a constant thickness at the stepped portion 35 of the oxide film. Therefore, there results a lack of exposure to light, and whereby resist remains and aluminum 36 remains on this portion as indicated by a broken line in the drawing. Thus, the GND aluminum wiring 26 and the aluminum wiring 25 for etching are short-circuited by the aluminum remainder 36.

When the etching is effected in this state, a current passage 37 is established as indicated by an arrow in the drawing since the GND aluminum wiring 26 is connected to the P-type substrate 34, and a current leaks toward the P-type substrate 34. Then, the potential rises at the leaking portion of the P-type substrate 34, and the thickness of the diaphragm becomes larger than the desired thickness around the short-circuited portion.

A second problem is that the low-resistance region 24 on the scribe 21 is connected to the isolation 28 in the product pattern due to photodefect making it difficult to obtain a diaphragm of a desired thickness as in the above-mentioned first problem.

This state will be described with reference to FIG. 10(B).

The low-resistance region 24 formed on a predetermined portion of the scribe region is obtained by using a photoresist, patterning a masking material and selectively dispersing impurities. When photodefect occurs in the production process, however, the low-resistance layer 24 on the scribe 21 and the isolation 28 in the chip pattern 20 are often short-circuited. In this case, the breakdown voltage at the short-circuited portion is about 5 V. Here, the above-mentioned short-circuiting is not a problem if as the electrochemical stop etching is carried out at a voltage which is not higher than the breakdown voltage.

When the thickness of the diaphragm is to be controlled by feeding a voltage from an external unit, however, a voltage of, for example, 7 V which is larger than the breakdown voltage will be applied to the aluminum wiring 25 for etching in order to obtain diaphragm having a desired thickness. In this case, however, a current passage 38 is formed as indicated by arrow in the drawing, and a current leaks from this portion toward the P-type substrate 34.

Even in this case, therefore, the thickness of the diaphragm becomes larger than a desired thickness around the short-circuited portion for the same reason as that of the above-mentioned first problem.

In a process which executes electrochemical stop etching relying upon the wafer structure of the conventional semiconductor device as described above, the wafer is not of acceptable quality or a chip pattern at that portion must be excluded if short-circuiting develops due to the remaining aluminum. Moreover, when it is attempted to obtain diaphragm having a desired thickness by feeding from an external unit a voltage larger than the breakdown voltage at which the low-resistance layer and the isolation layer are short-circuited and, when short-circuiting occurs, the wafer is not of acceptable quality or the chip pattern of this portion must be excluded.

Another problem arises in relation to the electrochemical stop etching technology that is employed for forming the above-mentioned diaphragms. Electrochemical stop etching technologies have been disclosed in, for example, Japanese Unexamined Patent Publication (Kokai) No. 4-239183 and Japanese Patent Publication (Kokoku) No. 4-50736 and these technologies will now be described in detail with reference to FIGS. 16 and 17. FIG. 16 is a plan view of a silicon wafer 200 of before the electrochemical etching is executed, and FIG. 17 is a sectional view along the line A—A in FIG. 16. An N-type epitaxial layer 202 is formed on a P-type silicon substrate 201, and is equipped with a diaphragm-forming region 203 and a peripheral circuit region 204. Four P-type impurity diffusion regions (piezo resistance layers) 205, 206, 207 and 208 are formed in the N-type epitaxial layer 202 on the diaphragm-forming region 203. The P-type impurity diffusion regions (piezo resistance layers) 205, 206, 207 and 208 are connected in bridge as shown in FIG. 18, a voltage Vcc is applied to a first connection terminal a, ground potential is applied to a second connection terminal b, and output Vout is taken out from third and fourth connection terminals c and d to an amplifier OP1. The amplifier OP1 is formed in a peripheral circuit region 104 in FIG. 17 and is constituted by elements such as NPN transistors 109 and the like which are isolated by a PN junction. On the surface of the silicon wafer 200 is extended, close to the scribe line, aluminum wiring 210 for ground potential to provide a ground potential at the PN junction and to provide a ground potential for the bridge of FIG. 18. To etch the P-type silicon substrate 201, furthermore, a voltage must be applied from the external unit. For this purpose, an aluminum wiring 211 for etching extends on the scribe line, and an aluminum wiring 212 is extended from the aluminum wiring 211 to the N-type epitaxial layer 202 in the diaphragm-forming region 203. In order to carry out the electrochemical etching, the silicon wafer 200 is immersed in an etching solution, a voltage is applied to the aluminum wirings 211 and 212 in order to remove the P-type silicon substrate 201 in the diaphragm-forming region 203 and to form a diaphragm.

However, the aluminum wirings 210, 211 and 212 have been formed by forming an aluminum film on the whole surface of the silicon wafer 200 and by simultaneously effecting the photo-etching using a piece of mask. Therefore, if a photodefect exists (e.g., defect caused by scars in the mask or particles) at the time of etching the aluminum wirings 210, 211 and 212, the aluminum wiring 210 for ground potential and the aluminum wiring 212 for etching are often short-circuited due to remaining aluminum 213 shown in FIGS. 16 and 17. Then, a current leaks from the aluminum wiring 211 for etching to the P-type silicon substrate 201 through aluminum wiring 210 for ground potential during the electrochemical etching. The occurrence of leakage current causes the potential of the P-type silicon substrate 201 to rise, resulting in the interruption of etching which makes it difficult to obtain a diaphragm having a desired thickness. That is, referring to FIG. 19, when a short-circuit does not take place during the electrochemical etching, the applied voltage abruptly decreases at the PN junction portion and a minimum etching potential Vth exists in the PN junction portion. Therefore, the etching stops at the PN junction portion. When the short-circuit occurs, however, the voltage distribution gradually decreases in the P-type silicon substrate 201 as represented by a broken line, the minimum etching potential Vth is set at a level corresponding to an intermediate thickness of the P-type silicon substrate 201, and the etching stops at a portion corresponding to the minimum etching potential Vth, making it difficult to obtain a diaphragm having a desired thickness.

According to the prior art as described above, the yield is inevitably low in the process for forming diaphragms using electrochemical stop etching.

In a conventional integrated pressure sensor in which a diaphragm is formed by an electrochemical stop etching, an N-type layer is disposed on a P-type substrate and has a chip isolating layer of a P-type material or an insulating material extending from the surface of the N-type layer to the P-type substrate and surrounding the entire side wall of a chip region (having an N-type epitaxial layer in which a diaphragm and an integrated circuit are formed), to isolate the chip region from a scribe region for scribing. The chip isolating layer may either be formed in the entire scribe region or may have a small width with the scribe region being an N-type layer.

When the N-type layer (the chip region) having a reduced thickness is isolated by the chip isolating layer from the chip side wall, special measures must be taken to apply an identical voltage to the N-type layers of the reduced thickness regions of the respective chips during electrochemical stop etching. To this end, it was conventionally necessary that an etching voltage applying wiring be provided on a wafer with an insulating layer interposed therebetween and be connected to the respective reduced thickness regions, as disclosed in Japanese Unexamined Patent Publication (Kokai) No. 4-39969.

FIG. 61 schematically illustrates an example of the etching voltage applying wiring. The reference numeral 600 denotes a chip isolating layer, 600 a chip region, 602 a scribe region, 603 a main line of an etching voltage applying wiring, 604 a branch line branched from the main line 603 and connected to an N-type layer of a reduced thickness in a chip region 601 via an insulating film not shown.

An inspection pad 605 is formed in the intermediate portion of the branch line 604 and is formed in the same process step as that in which the main line 603 and the branch line 604 are formed. Prior to electrochemical stop etching, a protective insulating film is formed to cover the etching voltage applying wiring and has an opening above the inspection pad 605 to expose the inspection pad 605. After the electrochemical stop etching, preferably after scribing, a inspection probe is brought into contact with the inspection pad, a high voltage is applied to an N-type layer of a diaphragm region, and a P-type substrate is then grounded to check junction leakage current therebetween for judging whether the electrochemical stop etching has been satisfactorily conducted. The judgment is easily done, because, if the electrochemical stop etching is incomplete, a large unetched area of a P-type substrate must be retained in contact with the N-type layer of the diaphragm to provide a remarkably increased PN junction area in comparison with that obtained by a normal or complete etching and the leakage current is also increased.

However, there still remains a problem that the chip yield of a wafer is sharply reduced when electrochemical stop etching is used to form a reduced thickness region in the chip region in a wafer in which a chip isolating layer is formed surrounding the side walls of the chip region, followed by scribing of the wafer into many chips.

The present invention, therefore, was accomplished in order to solve the above-mentioned problems and its object is to provide a method of etching semiconductor wafers while suppressing variance in the etching as a result of efficiently applying a desired voltage to all of the chip patterns.

Another object of the present invention is to provide a method, of producing semiconductor devices, which is capable of reliably forming a thin portion having a predetermined thickness by preventing the leakage of current from the conductor for electrochemical etching to the P-type silicon substrate.

A further object of the present invention is to favorably carry out the electrochemical stop etching without permitting the occurrence of current leakage that is caused by remaining aluminum.

A still further object of the present invention is to favorably carry out the electrochemical stop etching irrespective of the application of a voltage by avoiding a short-circuit between the low-resistance layer in the scribe region and the isolation.

Therefore, the fifth object of the present invention is to provide a semiconductor device in which the chip yield is remarkably improved and which is advantageously applied in the production of semiconductor dynamic sensors such as a semiconductor pressure sensor.

SUMMARY OF THE INVENTION

In order to accomplish the above-mentioned objects, the present invention provides the following technical constitution. That is, it provides a method of etching semiconductor wafers comprising:

a step for forming, on the main surface of a semiconductor wafer, a plurality of chip patterns that have a predetermined region for forming a thin portion and a first electrically conducting wiring member along the outer peripheries thereof; and a step for forming, on the main surface of the wafer, a second electrically conducting wiring member for etching at a predetermined distance from said first electrically conducting wiring member and having a height substantially the same as the height of said first electrically conducting wiring member.

An extended portion provided for a portion of said second electrically conducting wiring member, which avoids said first electrically conducting wiring member, is electrically connected to a predetermined region that forms a thin portion in the chip patterns, and a predetermined voltage is applied to the second electrically conducting wiring member from an external unit in order to form a desired thin portion in the predetermined region.

The present invention further provides, in addition to the above-mentioned technical constitution, a method of producing semiconductor wafers wherein the first electrically conducting wiring member is formed on an insulating layer, and the second electrically conducting wiring member is formed on an insulating layer having a thickness substantially the same as that of said insulating member.

According to the present invention, furthermore, the second electrically conducting wiring member can be formed in the shape of a lattice on the main surface of the semiconductor wafer. Moreover, the second electrically conducting wiring members may be so formed as to surround the outer peripheries of the individual chip patterns and may further be electrically connected together through third electrically conducting wiring members.

According to another aspect of the present invention, in addition to the above-mentioned basic technical constitution, the second electrically conducting wiring members and the third electrically conducting wiring members may be formed in the same step using the same material.

In the method of etching semiconductor wafers, a diode element may be formed in the extended portion that is provided in a portion of the second electrically conducting wiring member.

In the method of etching semiconductor wafers according to the present invention, the second electrically conducting wiring member is formed on the surface of the substrate maintaining a predetermined gap relative to, and having the same height as, the first electrically conducting wiring member, the second electrically conducting wiring member being formed close to the first electrically conducting wiring member, in order to carry out electrochemical stop etching by feeding a predetermined voltage to the second electrically conducting wiring member. In this case, a voltage nearly the same as the voltage fed through the second electrically conducting wiring member is applied to the chip patterns. Accordingly, no step is formed in the oxide film, no aluminum residue exists after the aluminum wiring is subjected to the photo-etching, and the electrochemical stop etching can be favorably carried out without permitting the occurrence of current leakage caused by the remaining aluminum.

Furthermore, the electrically conducting wiring members are formed via an insulating member so as to surround the outer peripheries of the chip patterns in which are formed a main circuit, the neighboring electrically conducting wiring members among the neighboring chip patterns being electrically connected together thereby to form a plurality of chip patterns that are forming a main circuit being surrounded by scribe regions, and the electrically conducting wiring members being formed as a lattice via an insulating member so as to extend along at least one side of each of the chip patterns in the scribe regions. In any case, the electrochemical stop etching is carried out by applying a predetermined voltage to the electrically conducting wiring members; i.e., a voltage nearly the same as the voltage applied through the electrically conducting wiring members is applied to the diaphragm regions.

According to the present invention, therefore, no photo-defect develops during the photo-etching of the aluminum wiring, short-circuits are avoided between the low-resistance layer and the isolation in the scribe regions, and the electrochemical stop etching can be favorably carried out by the application of any voltage.

To achieve the fifth object according to the present invention, the number of the process steps is reduced to improve the product yield by disposing an etching voltage applying wiring with a selected gap (referred to as "an etching voltage applying wiring gap") from the other wiring (referred to as "a circuit wiring") formed on a second conductivity type region. More specifically, the etching voltage applying wiring gap is greater than any gap between members of the circuit wiring (referred to as "a circuit wiring gap"). This provides a remarkable improvement in the chip yield for the following reasons.

The present inventors found that one reason for the reduction in the chip yield in the production of a semiconductor dynamic sensor is a short circuit or a layer short circuit between an etching voltage applying wiring and a circuit wiring.

Specifically, etching of a conducting layer for wiring is occasionally incomplete (hereinafter referred to as "incomplete etching") in a portion (which forms an etching voltage applying wiring gap) between an etching voltage applying wiring and a neighboring circuit wiring to provide conduction therebetween. In another case, because of a process defect (photodefect), a circuit wiring neighboring an etching voltage applying wiring is brought into a conducting state with a first conductivity type substrate, and both wirings are also brought into a conducting state with each other. On these occasions, the potential varies in the etching voltage applying wiring during electrochemical stop etching, so that the potential varies in the second conductivity region which forms a reduced thickness region and the termination time of the electrochemical etching varies and causes a defective electrochemical etching to occur. This abnormal potential in the etching voltage applying wiring causes an important problem in that the defect occurs not only in the chip in which the defective electrochemical etching has occurred but also in many chips in the surrounding wafer region, or occasionally in all of the chips on the wafer, to sharply reduce the chip yield, because the etching voltage applying wiring is commonly connected to the respective chips on the wafer.

To solve this problem according to the present invention, a gap between an etching voltage applying wiring and a neighboring circuit wiring (the gap referred to as "an etching voltage applying wiring gap") is greater than those between the circuit wiring members. Namely, even if a short circuit or a layer short circuit occurs between members of a circuit wiring in a chip, a defect only occurs in the chip alone, and therefore, the gaps between the circuit wiring members are formed small to improve the circuit integration with an increased chip number per wafer providing an increased number of chips of good quality. At the same time, the etching voltage applying wiring gap is formed greater than that between members of the circuit wiring to prevent sharp reduction of the chip yield from occurring upon a short circuit or a layer short circuit.

The present invention thus provides a most improved gross chip yield in the production of a semiconductor dynamic sensor using electrochemical stop etching.

Preferably, the etching voltage applying wiring gap is four times or more greater than the gap between members of the circuit wiring.

The gap between circuit wiring members is naturally equal to or greater than the minimum wiring rule ($\mu$m rule) defined by the nominal refining ability of the production process line. However, the gap between the circuit wiring members is hardly several times greater than the minimum wiring rule for ensuring an improved yield because of the reduction in the chip area. This is because an increase in the gap between members of the circuit wiring causes an increase in the chip area in proportion to square of the gap and the increased chip area induces the reduced chip yield and chip number per wafer due to other causes.

Experiments showed that an etching voltage applying wiring gap of four times or more greater than the circuit wiring gap substantially completely prevents a short circuit or a layer short circuit in the gap and the resulting sharp reduction in the chip yield.

Therefore, the etching voltage applying wiring gap must be from four to ten times greater than the circuit wiring gap. Then, the chip yield reduction due to short circuit or layer short circuit can substantially be prevented while preventing the chip yield reduction due to an increase in the chip area because of an extreme increase in the etching voltage applying wiring gap.

According to the present invention, an inspection pad is connected to an etching voltage applying wiring through an inspection pad connecting wiring member branched from an etching voltage applying wiring.

In this way, the present invention remarkably improves the chip yield as specifically described below.

The present inventors found through many experiments that one reason for the sharp reduction in the yield of the semiconductor dynamic sensor is that the conventional inspection pad formed at an intermediate portion of an etching voltage applying wiring (see FIG. 61) is disconnected by abnormal etching allowing electrochemical stop etching not to stop at the portion of the abnormal etching but to continue forming an opening in a wafer with the result that an etchant penetrates the wafer surface and propagates along the wafer surface to cause a sharp reduction in the chip yield.

The inspection pad is formed in order, for example, to detect the thickness of a reduced thickness region formed by electrochemical stop etching, i.e., the thickness of a first conductivity-type substrate that retains in the reduced thickness region through the amount of the junction leakage current. To this end, the surface of the inspection pad is exposed from a protective insulating film by the electrochemical etching. It is, of course, possible to selectively remove the protective insulating film in the portion on the inspection pad surface alone after the electrochemical stop etching, but it requires an elongated processing time and the resulting reduction in the chip yield. The inspection pad surface to be exposed is protected from an etchant for the electrochemical stop etching by an easily removable sealing means such as a wax.

However, when water is present on the wafer surface, the water provides a conduction path to electrically connect the inspection pad and the etchant or the P-type substrate, so that a metal material (aluminum) forming the inspection pad is ionized and dissolved in the water to effect etching of the inspection pad and to cause a breakage of the etching voltage applying wiring.

According to the present invention, an inspection pad is connected to an etching voltage applying wiring through an inspection pad connecting wiring, so that, even if the inspection pad is etched, the etching voltage applying wiring is not subjected to corrosion until the electrochemical stop etching is completed, thereby preventing the formation of an opening in the wafer and the resulting reduction in the chip yield.

BRIEF DESCRIPTION OF THE DRAWINGS

FIG. 11(A) is a diagram schematically illustrating the structure of a wafer in which the present invention is put into practice for an AA key pattern, wherein FIG. 11(A) is a sectional view along A–A' of FIG. 11(B);

FIGS. 12(A) and 12(B) are diagrams illustrating the current leakage occurring in a conventional wafer pattern, wherein FIG. 12(A) is a plan view of a semiconductor wafer, FIG. 12(B) is a plan view illustrating a major portion on an enlarged scale, and FIG. 12(C) is a sectional view B–B' of FIG. 12(B);

FIGS. 13(A) and 13(B) are diagrams illustrating the current leakage occurring in a conventional wafer pattern, wherein FIG. 13(A) is a plan view illustrating a major portion on an enlarged scale, and FIG. 13(A) is a sectional view along D–D' of FIG. 13(A);

FIG. 59 is a graph showing the relationship between the etching voltage applying wiring gap and the percent etching defective of the semiconductor pressure sensor shown in FIG. 55;

DETAILED DESCRIPTION OF THE PREFERRED EMBODIMENTS

Embodiments of the method of etching semiconductor wafers according to the present invention will now be described in detail with reference to the drawings.

Embodiment 1

Figure 7:
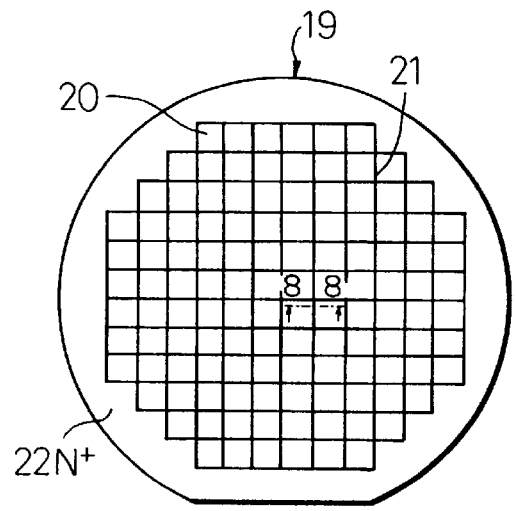
FIG. 7 is a plan view schematically illustrating a conventional semiconductor wafer.
Figure 8:
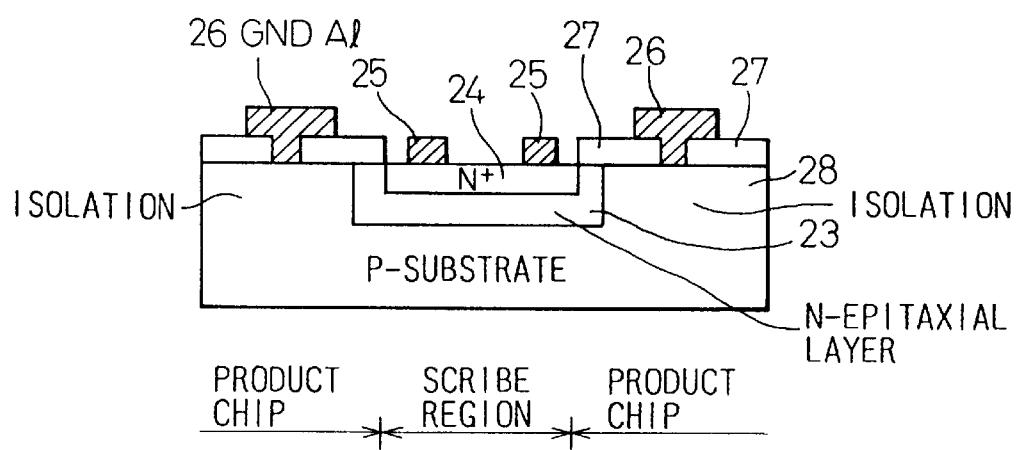
FIG. 8 is a sectional view along the line B—B in FIG. 7.
Figure 9:
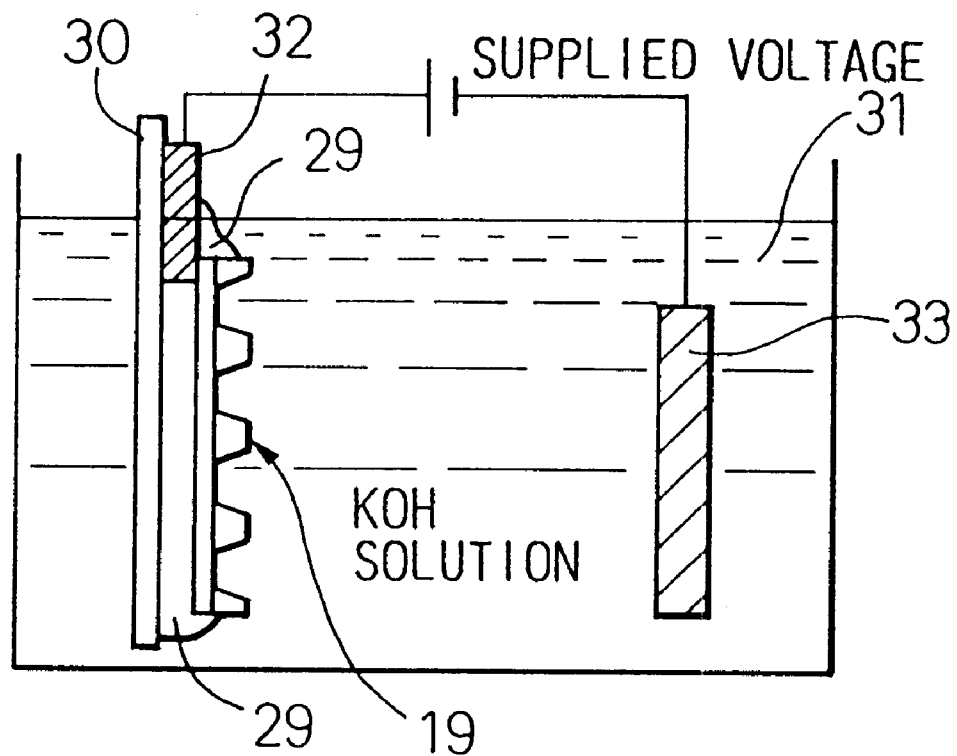
FIG. 9 is a diagram schematically illustrating an apparatus for electrochemical stop etching.

As in a conventional wafer structure, the wafer structure constituting a semiconductor device of this embodiment includes a plurality of chip patterns in which will be formed diaphragms of a predetermined thickness provided on the surface of a wafer with scribes between them, and has a low-resistance layer formed along the periphery of the wafer to surround the whole chip patterns (see FIG. 7). Even in the electrochemical stop etching for the semiconductor wafers, the semiconductor wafer of which the non-etching surface is protected is immersed in an etching solution such as KOH and a positive voltage is applied to the electrode for etching (see FIG. 9).

Therefore, the semiconductor wafer of this embodiment can be produced by a widely known process for producing semiconductors, and the electrochemical stop etching can be carried out relying upon conventional means. Chiefly described below therefore are those portions that include the features of the present invention.

Figure 1:
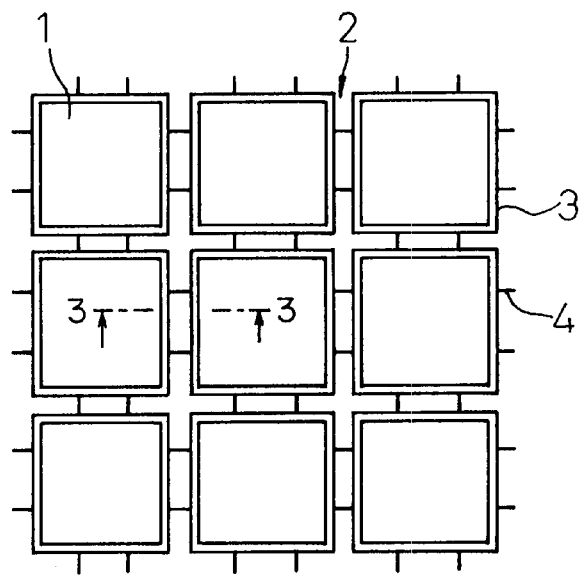
FIG. 1 is a plan view illustrating, on an enlarged scale, semiconductor wafers of the present invention.

FIG. 1 is a plan view schematically illustrating major portions of semiconductor wafers on an enlarged scale.

In FIG. 1, a plurality of product chips 1 (hereinafter referred to as chip patterns) in which will be formed major circuits such as gauge resistances and the processing circuits thereof, are provided on the surface of the wafer with scribes 2 between them. In other words, peripheries of the chip patterns 1 are surrounded by scribes 2. Aluminum wiring 3 for etching that corresponds to the second electrically conducting wiring member defined by the present invention is provided along the outer periphery of each of the chip patterns 1 as an electrically conducting wiring member for etching that supplies voltage necessary for effecting electrochemical stop etching. The aluminum wirings 3 for etching on the chip patterns 1 are electrically connected together through two sets of aluminum wiring 4 that correspond to a third electrically conducting wiring member between the chip patterns 1. In this embodiment, the aluminum wiring 3 for etching and the aluminum wiring 4 are referred to as second and third electrically conducting wiring members for a first electrically conducting wiring member that will be described later. In this embodiment, though two sets of aluminum wiring 4 are arranged among the neighboring chip patterns 1, the etching can be carried out to a sufficient degree if at least one aluminum wiring 4 is arranged. Moreover, the aluminum wiring 4 may be electrically conducting wiring members (not shown) having large wiring width. Or, the aluminum wiring 3 for etching and aluminum wiring 4 may be composed of any other metal.

The chip pattern of the semiconductor wafer will be described in further detail with reference to FIG. 2 which is a diagram on an enlarged scale.

Along the outer periphery on the chip pattern 1 is provided a GND aluminum wiring 5 which is a first electrically conducting wiring member in order to facilitate designing of circuit pattern and to protect the circuit (not shown) on the chip pattern 1 from external noise. The aluminum wiring 3 for etching described with reference to FIG. 1 is provided so as to surround the outer side of the GND aluminum wiring 5, and a portion thereof reaches an N-epitaxial layer (not shown) of a diaphragm region 6 in the chip pattern 1 without being connected to the GND aluminum wiring 5.

A diode element 3a is provided in an extended portion between the GND aluminum wiring 3 and the diaphragm region 6 to electrically isolate the chip from other chips at the time of WAT (electrical property checking) or to prevent leakage in the cross section of the chip after the semiconductor wafer is cut into dices.

In the diaphragm region 6, a voltage nearly the same as the external voltage applied to the aluminum wiring 3 for etching at the time of electrochemical stop etching, is applied to the N-type epitaxial layer only, and a diaphragm of a thickness corresponding to the voltage is formed in all chip patterns 1 of the semiconductor wafer.

Next, the cross-sectional structure between the chip patterns 1 of the semiconductor wafer will be described with reference to FIG. 3.

Figure 3:
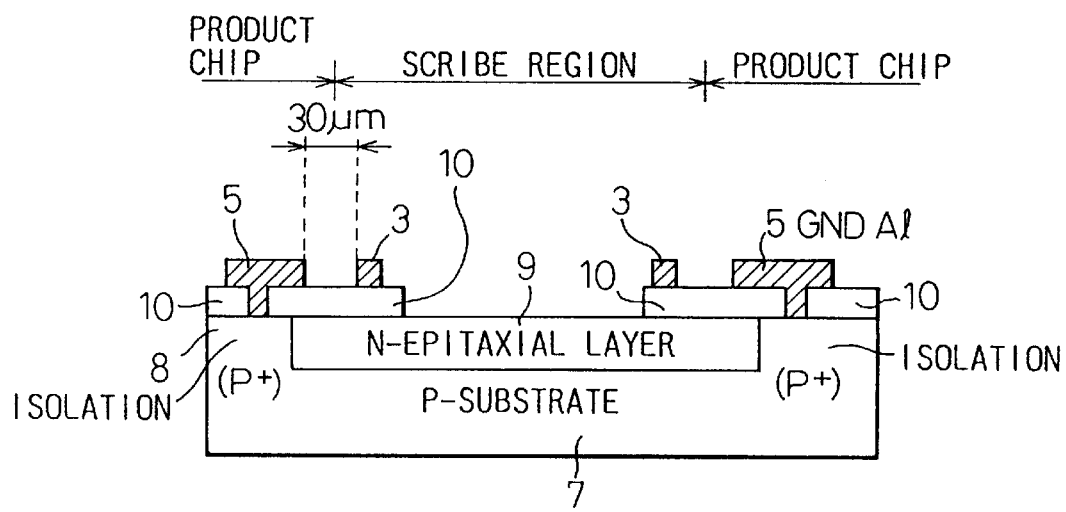
FIG. 3 is a sectional view along the line A—A in FIG. 1.

FIG. 3 is a sectional view along the line A—A of FIG. 1, and wherein the central portion is a scribe region formed on a P-type substrate 7, and portions on both sides are parts of the chip patterns 1 formed on the P-type substrate 7.

Very little impurity exists in the scribe region between the chip patterns 1 but an N-epitaxial layer 9 (N-layer) only is provided thereon and is insulated by an isolation 8 (P+- region). A field oxide film 10 is provided as an insulation member on the chip pattern 1 so as to reach at least a portion of the N-epitaxial layer 9. Furthermore, the GND aluminum wiring 5 is connected to the isolation 8 and is provided on the field oxide film 10. On the field oxide film 10 is provided the aluminum wiring 3 for etching near the GND aluminum wiring 5. A predetermined gap is maintained between the GND aluminum wiring 5 and the aluminum wiring 3 for etching in order to prevent short-circuits therebetween. Thus, at least the neighboring GND aluminum wiring 5 and the aluminum wiring 3 for etching are formed on the same field oxide film 10 to eliminate a step in the oxide film between the GND aluminum wiring 5 and the aluminum wiring 3 for etching. In this embodiment, a gap of 30 $\mu$m is maintained between the GND aluminum wiring 5 and the aluminum wiring 3 for etching, and it has been confirmed that, with this amount of gap, short-circuits rarely occur between the GND aluminum wiring 5 and the aluminum wiring 3 for etching.

In FIG. 3 as described above, at least the neighboring GND aluminum wiring 5 and the aluminum wiring 3 for etching are formed on the same field oxide film 10, so that no step will occur in the oxide film between them. In addition to this structure, however, a structure shown in FIG. 4 may be employed.

Figure 4:
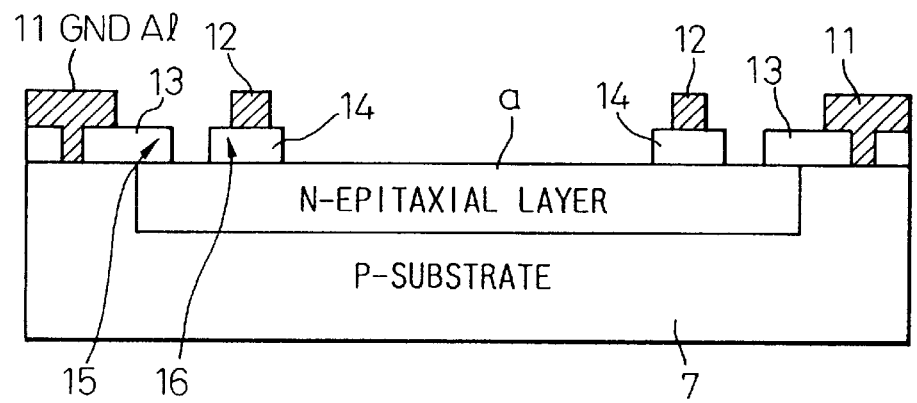
FIG. 4 is a diagram schematically illustrating in cross section the structure of the semiconductor wafer of the present invention.
Figure 10A:
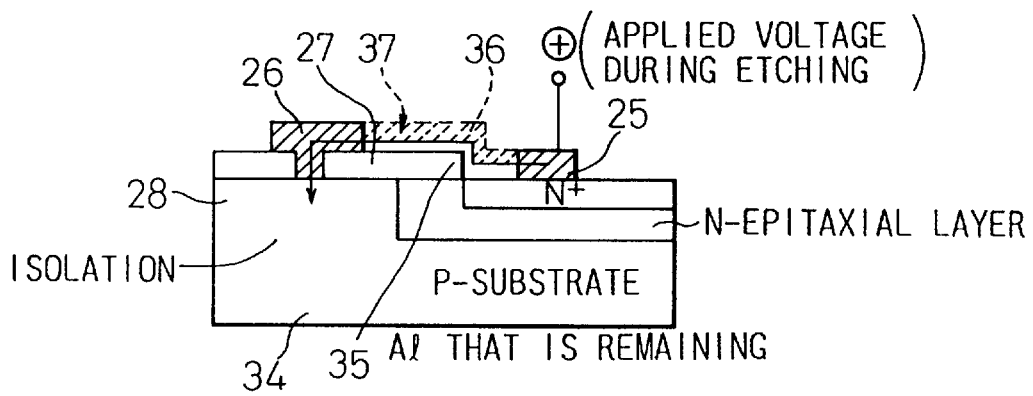
FIG. 10(A) is a diagram explaining the occurrence of current leakage caused by aluminum that is remaining after etching.
Figure 10B:
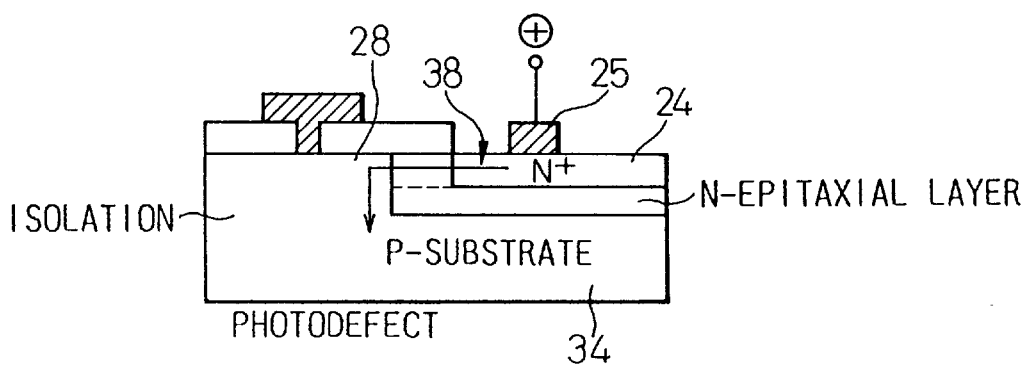
FIG. 10(B) is a diagram explaining the occurrence of current leakage caused by photodefect.

In FIG. 4, a GND aluminum wiring 11 and an aluminum wiring 12 for etching are provided via field oxide films 13 and 14 that are a first insulating member and a second insulating member and, hence, oxide film steps 15 and 16 are developed between the GND aluminum wiring 11 and the aluminum wiring 12 for etching. In this embodiment, however, at least the neighboring GND aluminum wiring 11 and the aluminum wiring 12 for etching are formed on the field oxide films 13 and 14 of the same thickness, so that the GND aluminum wiring 11 and the aluminum wiring 12 for etching will have the same height. Therefore, the oxide film steps 15 and 16 have a quite different meaning from that of the oxide film step 35 (see FIG. 10(*a*)) that was a problem in the prior art. Therefore, despite the fact that the oxide film steps 15, 16 exist, hardly any aluminum remains after the aluminum wiring is subjected to photo-etching. Even in this case, however, a predetermined gap is maintained between the GND aluminum wiring 11 and the aluminum wiring 12 for etching.

The field oxide films 10 and 14 (FIGS. 3 and 4) on the N-epitaxial layer 9 are located at positions where they will not be cut in the scribe region by a blade (not shown) at the time of cutting the wafer into dices in a subsequent step. Therefore, the field oxide films 10 and 14 do not affect the blade; i.e., the life of the blade is not shortened compared with that of the prior art.

In this embodiment, furthermore, no impurity is diffused in the scribe region. However, since the aluminum wirings 3 for etching are formed in the form of a lattice and are connected together through aluminum wirings 4 between the chip patterns 1, a voltage the same as the external voltage can be applied to all of the chip patterns 1 without arousing any problem even if the aluminum wirings 3 for etching are broken due to photodefects or scars. In the constitution of this embodiment, therefore, there is no need to form a low-resistance layer in case the aluminum wiring for etching is broken. In other words, according to this embodiment, a constitution can be employed in which no impurity is diffused into the scribe region between the chip patterns.

With the semiconductor wafer of this embodiment being constituted as described above, the following features are exhibited when the semiconductor wafer is subjected to the electrochemical stop etching.

First, no impurity is diffused in the scribe regions between the chip patterns and an N-type epitaxial layer only is provided to accomplish insulation by isolation, whereby a breakdown voltage of about 80 V is accomplished between the N-type epitaxial layer and the isolation. Therefore, though the voltage for etching was previously limited to not higher than 5 V, the range for supplying a voltage for etching can be increased, and the thickness of the diaphragm can be controlled by applying a voltage of higher than 5 V. Thus, there is obtained a diaphragm having a thickness corresponding to the voltage that is supplied.

Next, the GND aluminum wiring and the aluminum wiring for etching are provided both of them being adjacently arranged with a predetermined gap therebetween on the field oxide films, having the same height to eliminate a step in the oxide film between the two. Accordingly, aluminum does not remain in the process of production. Therefore, it becomes possible to prevent the occurrence of current leakage caused by the aluminum that remains, and a diaphragm having a desired thickness is obtained.

Even if there exists a step in the oxide film between the GND aluminum wiring and the aluminum wiring for etching, employment of the above-mentioned constitution shown in FIG. 4 helps remove aluminum that remains, and there is obtained a diaphragm having a desired thickness.

Moreover, the aluminum wirings for etching are provided in the form of a lattice for the chip patterns, and the aluminum wirings for etching of the neighboring chip patterns are connected together through aluminum wirings. Accordingly, even in case the aluminum wirings for etching are broken due to photodefect or scars, a voltage same as the voltage applied from the external unit can be applied to all of the chip patterns without using the low-resistance layer.

Figure 5:
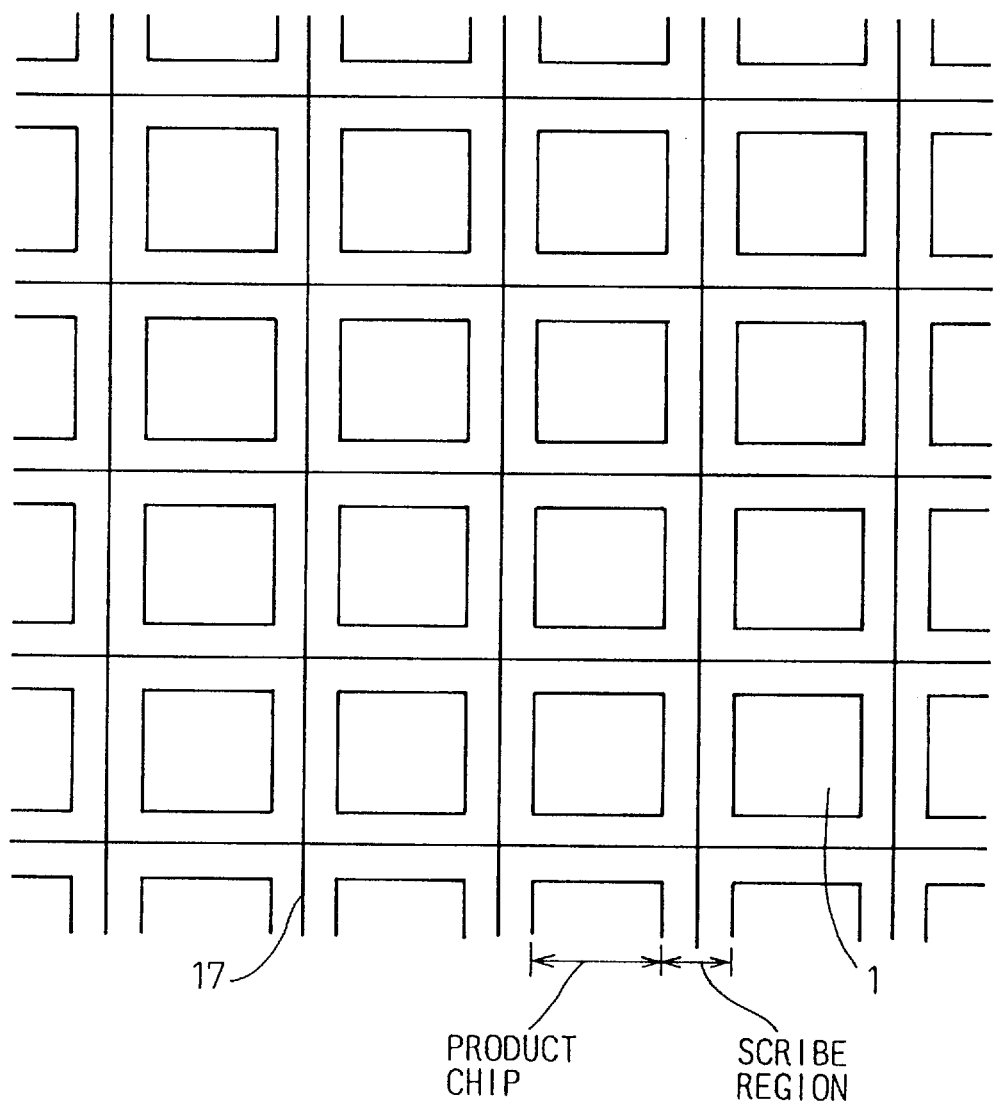
FIG. 5 is a diagram illustrating another example of aluminum wiring for etching of the present invention.

In the semiconductor wafer constituting the above-mentioned semiconductor device, the aluminum wiring for etching is provided on the outer side of the GND aluminum wiring surrounding the chip patterns. Instead of this constitution, however, the aluminum wiring for etching may be provided near the center of the scribe region as shown in FIG. 5 in the form of a lattice covering the whole semiconductor wafer.

As in the case of FIG. 4, the aluminum wiring 17 for etching is provided on the N-type epitaxial layer 9 formed on the P-type substrate 7 via the field oxide film 14 (see FIG. 4). Therefore, the aluminum wiring 17 for etching and the GND aluminum wiring 11 (see FIG. 4) are formed maintaining the same height, and aluminum does not almost remain after the aluminum wiring is photo-etched. Here, the field oxide film 14 under the aluminum wiring 17 for etching has a minimum thickness and a minimum width needed for providing the aluminum wiring 17 for etching. Therefore, the blade (not shown) is hardly affected during the cutting of the wafer into dices in a subsequent step, and the life of the blade is not shortened.

Here, the aluminum wirings 17 or 18 for etching are both referred to as second electrically conducting wiring members.

Figure 6:
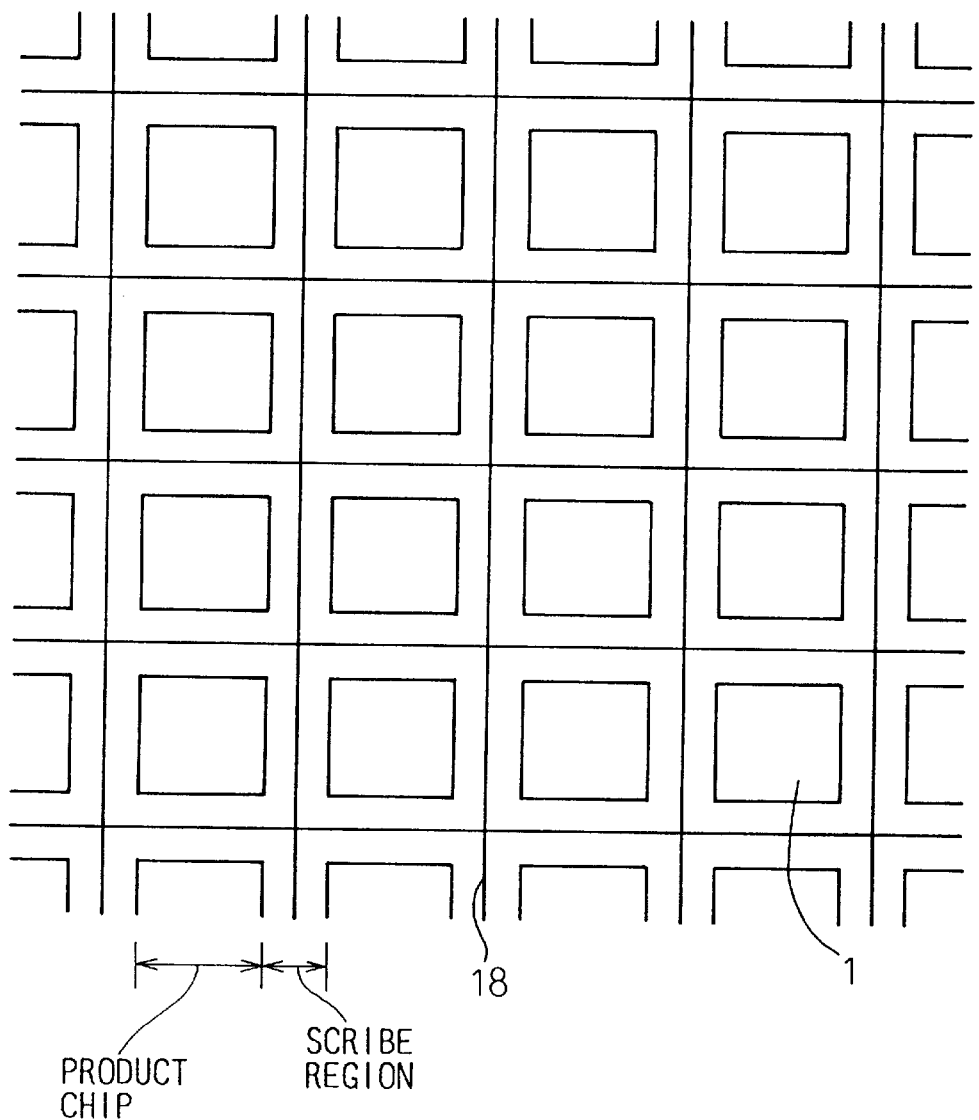
FIG. 6 is a diagram illustrating a further example of aluminum wiring for etching of the present invention.

Furthermore, the aluminum wiring 18 for etching may be provided in a manner as shown in FIG. 6. Even in this case, as in FIG. 5, the aluminum wiring 18 for etching and the GND aluminum wiring 11 have the same height owing to the field oxide film 14, so that no aluminum remains after the aluminum wiring is subjected to photo-etching. Similarly, furthermore, the field oxide film 14 under the aluminum wiring 18 for etching has the minimum thickness and the minimum width needed for providing the aluminum wiring 18 for etching, so that the life of the blade is not shortened.

After all, according to this embodiment, as will be obvious from FIGS. 1, 5 and 6, the aluminum wiring for etching needs be provided to run along at least one side of the individual chip patterns 1. With the aluminum wiring for etching is thus arranged, all the chip patterns 1 can be subjected to the electrochemical stop etching to a sufficient degree.

Figure 2:
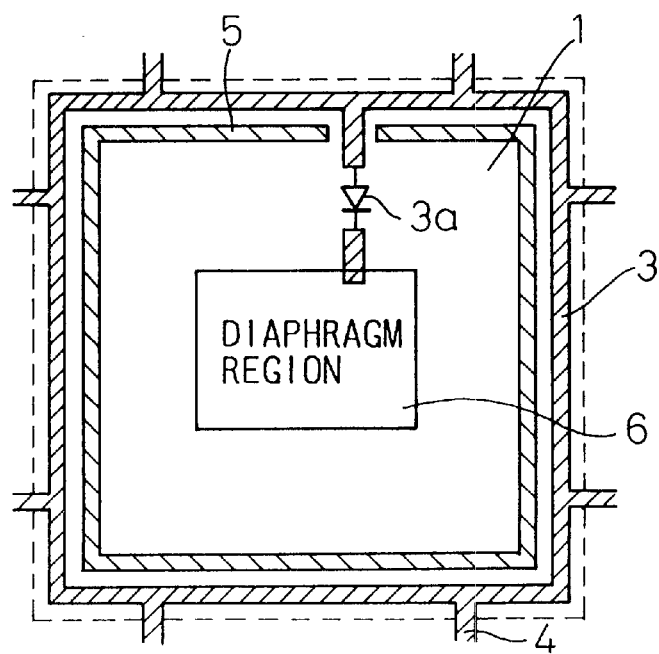
FIG. 2 is a plan view illustrating, on an enlarged scale, a chip pattern of a semiconductor wafer of the present invention.

Though not shown in FIGS. 5 and 6, the aluminum wiring 17 and 18 for etching the chip patterns 1 are connected to the N-type epitaxial layer in the diaphragm region formed in the chip patterns 1 without being connected to the GND aluminum wirings 5, 11 in the same manner as in FIG. 2.

Though various constitutions and features of the semiconductor device of the present invention were described above in detail by way of an embodiment, it should be noted that the invention can be changed in any form provided it does not depart from the spirit and scope of the invention.

In the embodiment of the present invention shown in FIGS. 5 and 6, the above-mentioned third electrically conducting wiring member is often not required. In this case, therefore, the aluminum wiring 17 or 18 for etching shown in FIGS. 5 and 6 works as the second electrically conducting wiring member.

Summarized below is the method of etching semiconductor wafers according to the first aspect of the present invention. That is, in a method of producing semiconductor devices by electrochemical stop etching, at least one chip pattern is formed on at least one surface of a substrate, the chip pattern having a major circuit formed therein and having a first electrically conducting wiring member formed therein, a second electrically conducting wiring member is formed near said first electrically conducting wiring member maintaining a predetermined gap relative thereto on the same surface of the substrate where said chip pattern is formed, said second electrically conducting wiring member having the same height as said first electrically conducting wiring member, a predetermined voltage is applied to said second electrically conducting wiring member to effect the electrochemical stop etching and, as required, at least said first electrically conducting wiring member and said second electrically conducting wiring member neighboring each other are both formed on the insulating members having the same thickness.

In the method of producing semiconductor devices by the electrochemical stop etching according to another embodiment, a plurality of chip patterns are formed on at least one surface of a substrate, the plurality of chip patterns having a major circuit formed therein and being surrounded by scribe regions, electrically conducting wiring members are formed in said scribe regions so as to surround the outer peripheries of said chip patterns via an insulating member, the electrically conducting wiring members close to one another among said chip patterns that are neighboring one another are electrically connected together, and a predetermined voltage is applied to said electrically conducting wiring members to effect the electrochemical stop etching.

In the method of producing semiconductor devices by the electrochemical stop etching according to a further embodiment, a plurality of chip patterns are formed on at least one surface of a substrate, the plurality of chip patterns having a major circuit formed therein and being surrounded by scribe regions, electrically conducting wiring members are formed in the form of a lattice on said scribe regions via an insulating member so as to extend along at least one side of each of said chip patterns, and a predetermined voltage is applied to said electrically conducting wiring members to effect electrochemical stop etching.

In the method of producing semiconductor devices by the electrochemical stop etching according to a still further embodiment, a plurality of chip patterns are formed on at least one surface of a substrate, the chip patterns having a major circuit formed therein and having a first electrically conducting wiring member formed therein and further being surrounded by scribe regions, a second electrically conducting wiring member being formed near said first electrically conducting wiring member via an insulating member maintaining a predetermined gap relative thereto on the same surface of the substrate where said chip patterns are formed, said second electrically conducting wiring member having the same height as said first electrically conducting wiring member and surrounding said chip patterns in said scribe regions, said second electrically conducting wiring members neighboring one another being electrically connected together among said chip patterns neighboring one another, and predetermined voltage being applied to said second electrically conducting wiring members to effect the electrochemical stop etching.

In the method of producing semiconductor devices by the electrochemical stop etching according to a yet further embodiment, a plurality of chip patterns are formed on at least one surface of a substrate, the chip patterns having a major circuit formed therein and having a first electrically conducting wiring member formed therein and further being surrounded by scribe regions, a second electrically conducting wiring member being formed in said scribe regions near said first electrically conducting wiring member via an insulating member maintaining a predetermined gap relative thereto on the same surface of the substrate where said chip patterns are formed, said second electrically conducting wiring member extending along at least one side of each of said chip patterns and having the same height as said first electrically conducting wiring member, and a predetermined voltage being applied to said second electrically conducting wiring member to effect the electrochemical stop etching.

A semiconductor device produced by the method of the above-mentioned embodiments comprises a plurality of chip patterns formed on at least one surface of a substrate, the plurality of chip patterns having a major circuit formed therein, first electrically conducting wiring members formed on said chip patterns via a first insulating member so as to surround the outer peripheries of the chip patterns, N-type epitaxial layers formed among said chip patterns on the surface of said substrate, and second electrically conducting wiring members for electrochemical stop etching formed in the shape of a lattice on said N-type epitaxial layers via a second insulating member among said chip patterns, wherein the thickness of said first insulating member is the same as the thickness of said second insulating member, and a predetermined gap is maintained between said first electrically conducting wiring members and said second electrically conducting wiring members.

Embodiment 2

An embodiment of the method of etching semiconductor wafers according to another aspect of the present invention will be described next with reference to FIGS. 11 to 15.

That is, according to an embodiment of this aspect, the method of etching semiconductor wafers comprises:

a step for surrounding sub-patterns by isolation regions, said sub-patterns being formed on the main surface of a semiconductor wafer, being used for a purpose different from that of the chip patterns, and are removed after the semiconductor wafer is cut into individual chip patterns; and a step for surrounding the peripheries of said isolation regions by epitaxial layers.

In the method of etching semiconductor wafers, furthermore, the sub-patterns are automatic alignment patterns for automatically positioning the photomasks at the time of forming chip patterns, a variety of TEG patterns for testing the chip patterns or electrode patterns to be attached to the glass seats, isolation regions are provided surrounding all of the sub-patterns, and epitaxial layers are provided surrounding the isolation regions.

In the method of producing semiconductor wafers according to a further embodiment, the second electrically conducting wiring member is formed on an electrically conducting low-resistance layer formed by introducing impurities into the main surface of the wafer, and the epitaxial layer is so formed that the width from an end of the electrically conducting low-resistance layer to an end of the isolation region will have a predetermined breakdown voltage.

Concretely described below is a method of etching semiconductor wafers according to the second aspect of the present invention.

FIG. 12(A) is a plan view schematically illustrating a semiconductor wafer 120, wherein a plurality of product chip patterns 121 (hereinafter called chip patterns) having a diaphragm (not shown) of a predetermined thickness are provided with scribes 122 between them on the p-type wafer which has an n-type epitaxial layer formed on the surface thereof, and an n+-type region 124 of a high concentration (hereinafter often referred to as low-resistance layer) is provided on the outer peripheral portion 123 of the wafer to surround all of the chip patterns.

Figure 15:
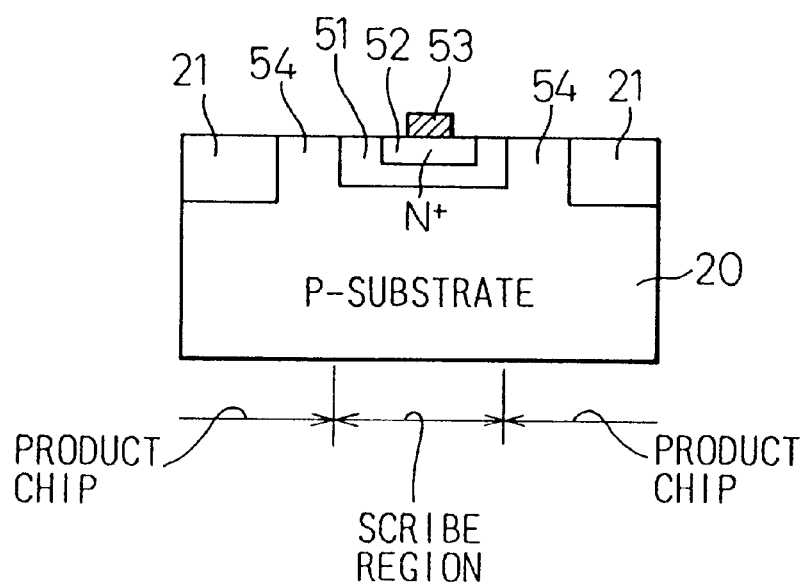
FIG. 15 is a diagram schematically illustrating the structure a scribe region for putting the electrochemical top etching into practice.
Figure 16:
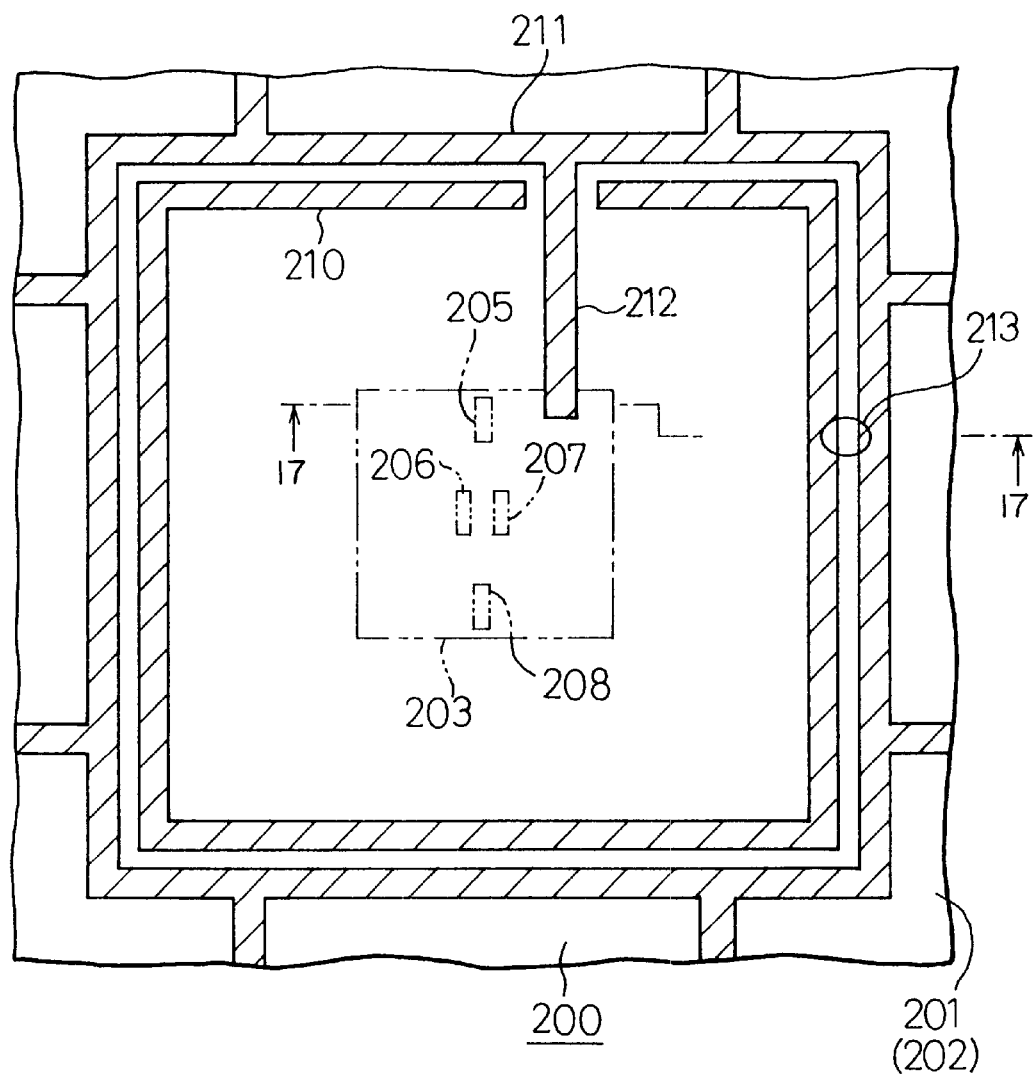
FIG. 16 is a plan view of a silicon wafer for explaining a prior art.
Figure 17:
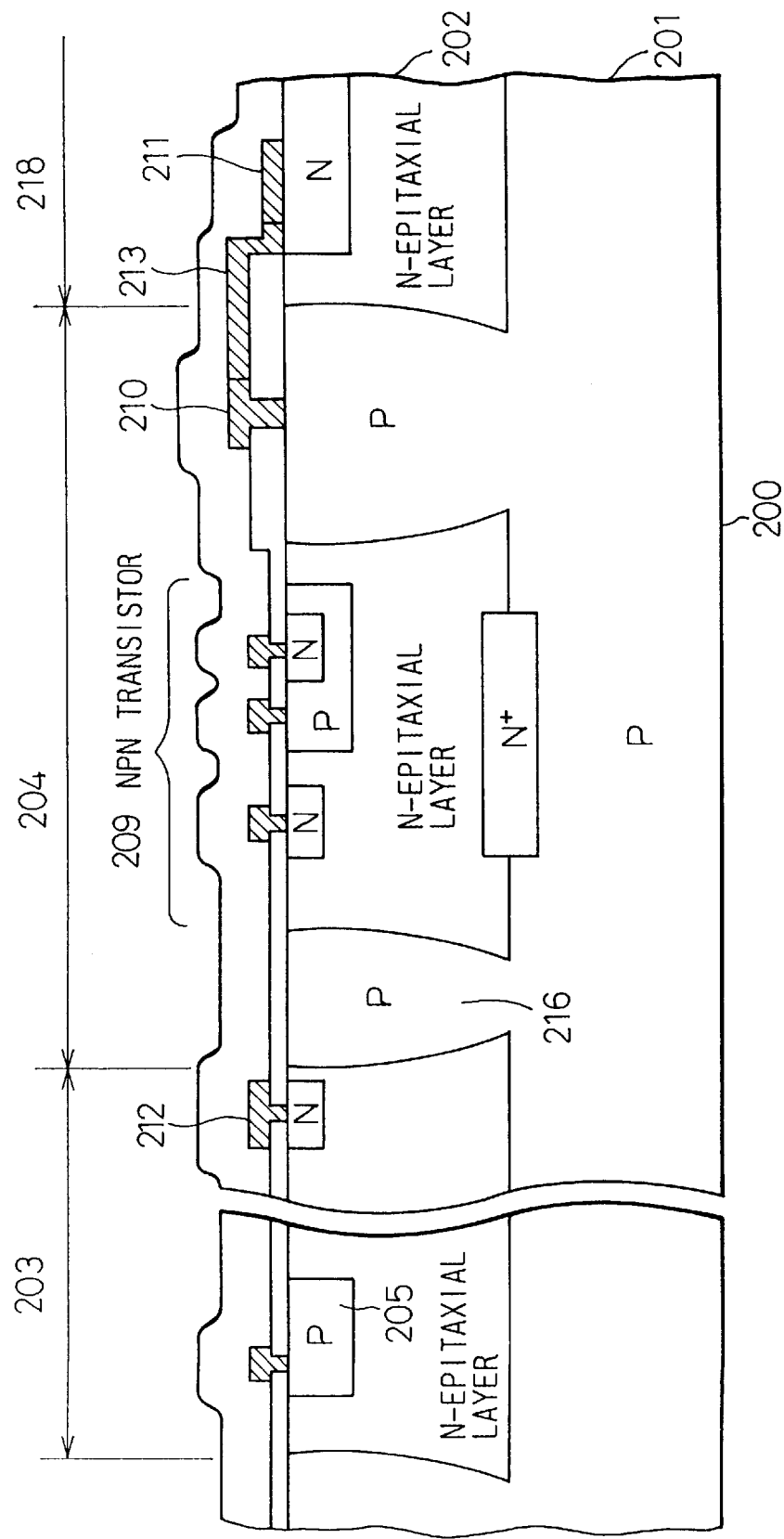
FIG. 17 is a sectional view along the line A—A of FIG. 16.
Figure 18:
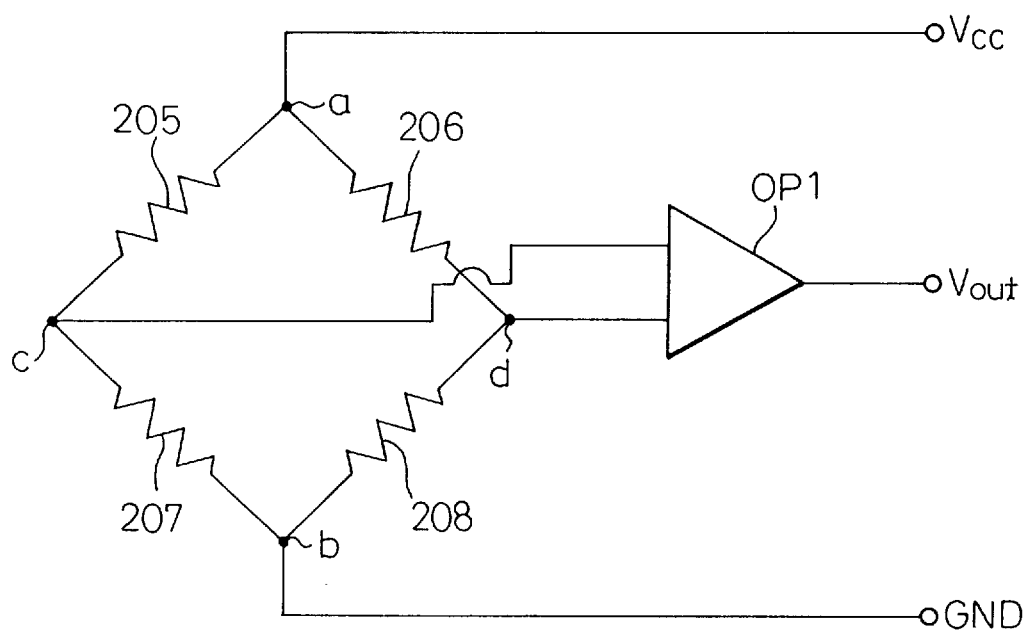
FIG. 18 is a diagram of an electric circuit of a semiconductor pressure sensor.
Figure 19:
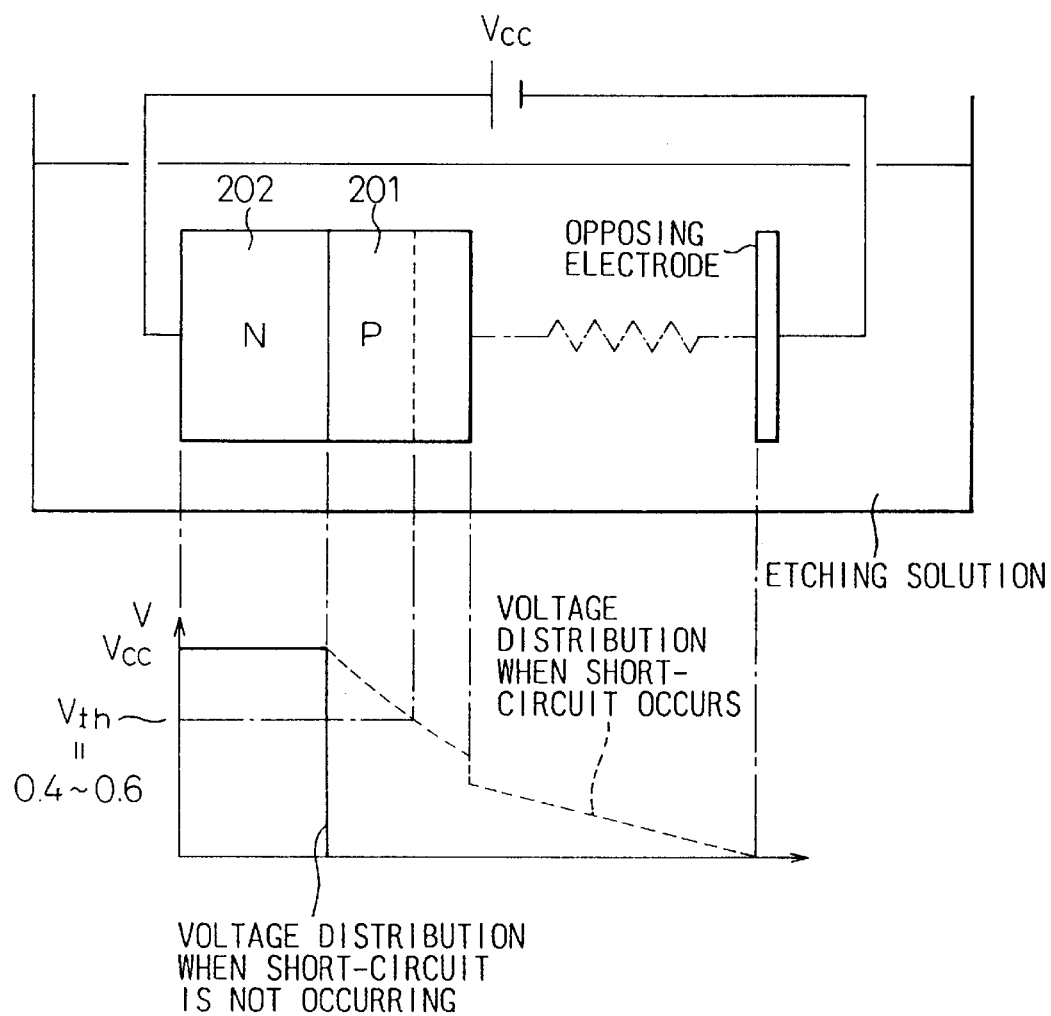
FIG. 19 is a diagram for explaining the prior art.

FIG. 12(B) is a sectional view between the chip patterns of the semiconductor wafer 120 which has a constitution as shown in FIG. 15. In the scribe region 122 between the chip patterns 121 is left an n-type epitaxial layer 151 and on which is further formed a low-resistance layer 152 as in the wafer outer peripheral portion 123. An aluminum wiring 153 for etching is formed directly on the low-resistance layer 152. A positive voltage is applied from an external unit to the aluminum wiring 153 for etching, whereby predetermined portions of the chip patterns 121 are etched to form a diaphragm (not shown).

The voltage applied from the external unit during the etching is determined by a relation between the applied voltage (Vd) and the diaphragm thickness, $$t_{dia}=K(Vd)^{1/2} \quad (K: \text{constant}) \quad (1)$$

that is derived from the extension of depletion layer of pn junction and a voltage applied to this junction. Therefore, the etching is effected by applying a voltage for obtaining a desired diaphragm thickness. The etching ceases to proceed at the moment when an electrochemical equilibrium is reached and, whereby, a predetermined diaphragm thickness is automatically obtained. The electrochemical stop etching process is named after this effect.

The low-resistance layer 52 is diffused in the scribe region 22 from such a standpoint that even when the aluminum wiring 53 for etching is broken due to photodefects or scars, the voltage is reliably applied during etching to the n-type epitaxial layer (not shown), which is the etching region in the diaphragm region (not shown) in the chip patterns 121, by utilizing the low-resistance layer 152. On the scribe region 122 a field oxide film is not formed to cover the entire scribe region. This is to prevent the life of the blade (not shown) from being shortened while cutting the semiconductor wafer into dices in a subsequent step.

Figure 14:
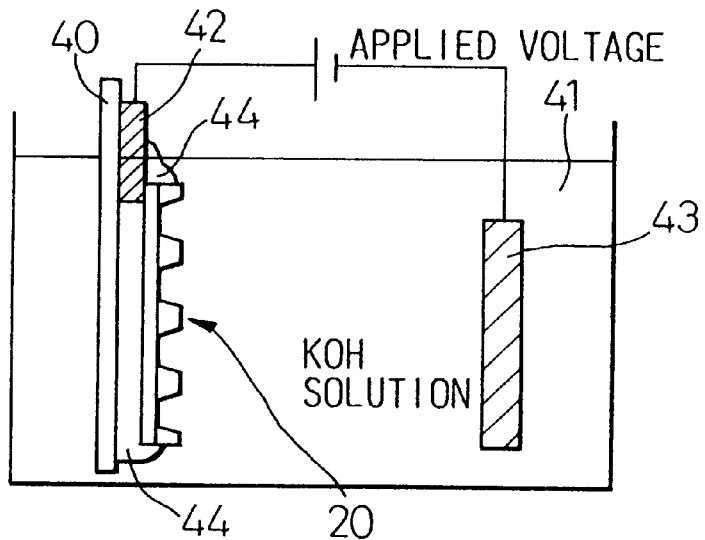
FIG. 14 is a diagram for explaining the electrochemical p etching.

By employing the above-mentioned wafer structure, a voltage which is the same as the voltage applied from the external source is applied to the n-type epitaxial layer in the diaphragm-forming portion of all of the product patterns. By using the semiconductor wafer 120 of this constitution, the electrochemical stop etching is carried out using a means that is shown in FIG. 14. The semiconductor wafer 120 is covered on its non-etching surface by a protection film 144 such as wax or the like and is secured to a ceramic plate 140. In this state, the semiconductor wafer 120 is immersed in an etching solution 141 such as KOH in a manner such that at least the portions to be etched are completely immersed therein. The low-resistance layer 124 or the aluminum wiring 153 for etching in the wafer peripheral portion is directly connected to a Pt (platinum) electrode 142, whereby the positive voltage is applied to the n-type epitaxial layer of the diaphragm region in the chip patterns 121. At this time, a negative voltage or 0 V is applied to the other Pt electrode 143 immersed in the etching solution 141. Thus, the diaphragm is formed in the chip patterns 121 of the semiconductor wafer 120 maintaining a thickness determined by the above-mentioned relationship.

In the conventional semiconductor device as described above, the n+-type region 24 of a high concentration (low-resistance layer) is formed in the scribe region 122 between the chips and in the wafer outer peripheral portion 123 and, besides, the aluminum wiring 153 is formed on the low-resistance layer. This is to decrease the difference between the voltage fed from the external unit and the voltage applied to the chips, during the etching, in order to decrease variation in the thickness of the finished diaphragms. In the wafers, however, there are formed not only the chips having the same pattern (major pattern) but also sub-patterns such as a photomask alignment recognition pattern 125 (all-alignment key, hereinafter referred to as AA key pattern), various TEG (test element group) patterns (not shown) for testing the main pattern by taking out a portion thereof, electrode patterns (not shown) to be connected to the glass sheet when anode junction is used and the like. The sub-patterns do not necessarily have the same chip size or the chip peripheral structure as those of the major chip pattern. Accordingly, there may be formed a chip arrangement as shown in FIGS. 12(A) and 12(B) or in FIGS. 13(A) and 13(B).

Figure 13A:
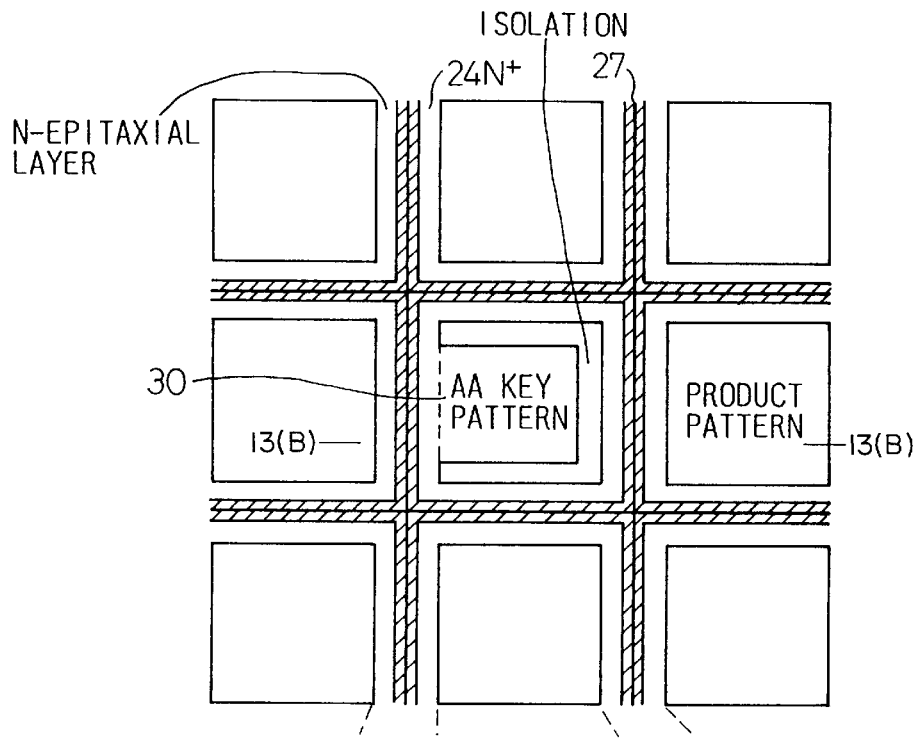
Figure 13B:
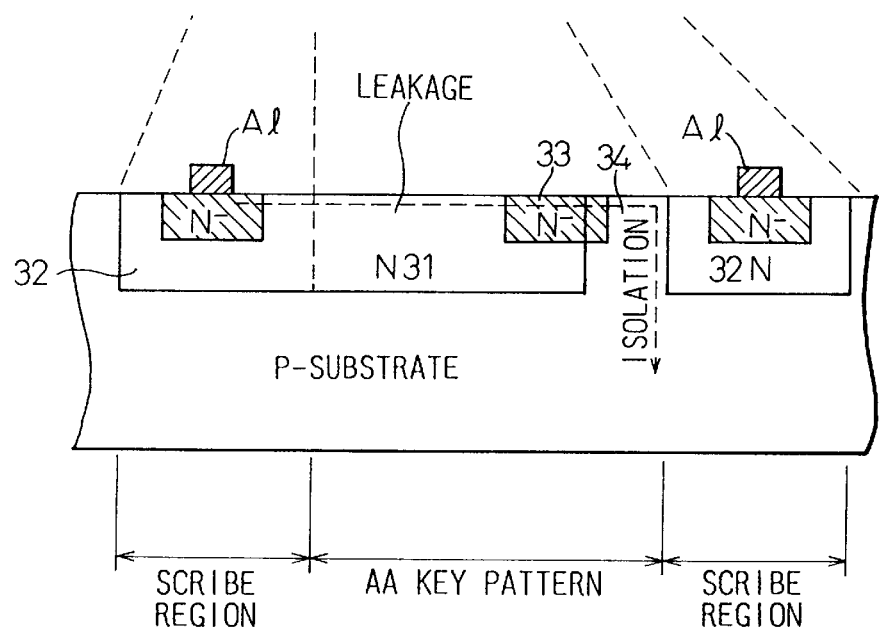

FIGS. 12(A) and 12(B) illustrate a state where the width of the scribe region 122, which is usually from 200 to 300 μm, is narrow near the AA key pattern 125 due to the isolation portion 128 of AA key pattern, and the n+-type region 124 of a high concentration which is the low-resistance layer has protruded into the isolation region 128. FIGS. 13(A) and 13(B) illustrate a state where the n-type epitaxial layer 131 in the AA key pattern 130 is not separated but is continuous to a portion of the n-type epitaxial layer 132 in the scribe region, and an n+-type region 133 of a high concentration, which is one of the layers diffused into the AA key pattern 130 during each photoetching step, is overlapped on the isolation region 134 of any of the AA key patterns.

In either case, as described above, the low-resistance layer 124 or the aluminum wiring 127 for etching formed on the scribe region 122 may overlap on the AA key patterns 125, 130, various TEG patterns or in the isolation regions 128, 134 in the electrode patterns. The breakdown voltage becomes about 5 V in the overlapped portions. That is, since the breakdown voltage becomes 5 V between the low-resistance layer 124 in the scribe region 122 and the isolations 128, 134, it is not possible to effect the electrochemical stop etching with a voltage of higher than 5 V. If the etching is effected with a higher voltage, e.g., 7 V, an electric current leaks from the aluminum wiring 127 for etching into the p-type substrate 120 (Arrows shown in FIGS. 12(A), 12(B) and 13(A), 13(B). However, the passage of leakage is not limited to the ones that are diagramed.). When the current leaks, the potential of the p-type substrate at the leaking portion rises, and a desired etching voltage is accomplished earlier than a predetermined time in a chip pattern near the leaking portion. That is, the etching ceases earlier than at other portions and the diaphragm has a thickness larger than a desired thickness; i.e., the chip becomes defective.

In the prior art, the above-mentioned problem occurs because the electrochemical stop etching is not performed. Electrochemical stop etching was introduced only in recent years to accomplish etching with high precision. In employing electrochemical stop etching technology, however, a higher voltage has been applied to obtain a predetermined film thickness causing another problem that did not occur in the prior art.

In an embodiment of the present invention, therefore, there is provided a semiconductor device obtained using electrochemical stop etching while suppressing variance in the etching and a method of producing the semiconductor device.

In order to solve the above-mentioned problem, the invention provides a constitution in which sub-patterns (AA key patterns, TEG patterns, etc.) other than the major patterns are surrounded by isolation regions, and the periphery of the isolation regions is not brought into contact with a semiconductor layer (second electrically conducting low-resistance layer of a high concentration) that is formed by the introduction of impurities. According to the invention, furthermore, the semiconductor device is obtained having such a constitution.

With the sub-patterns such as AA key patterns being surrounded by the isolation region, short-circuits do not occur between the p-type substrate and the scribe region or the region impressed with the voltage during electrochemical stop etching owing to the presence of the isolation region surrounding the sub-patterns irrespective of the formation of any AA key pattern (sub-pattern). Accordingly, no current leaks irrespective of the application of any desired etching voltage during the etching, and the chip patterns are uniformly etched without the need of raising the substrate potential.

According to the above-mentioned embodiment of the invention and when reference is made to the p-type substrate, an isolation region is formed surrounding the sub-patterns that are formed on the p-type substrate, an n-type epitaxial layer is necessarily formed surrounding them, and an n+-type low-resistance layer is formed. In machining the semiconductor using upon electrochemical stop etching, therefore, a breakdown voltage is maintained between the isolation and the n+-type low-resistance layer to which a voltage is applied at the time of electrochemical stop etching, and variance in the etching, that is caused by the leakage of current is suppressed. Therefore, the diaphragms are formed maintaining a predetermined thickness making it possible to obtain products having improved precision and quality, as well as to increase efficiency of utilizing the semiconductor wafers. This holds even for the epitaxial wafers such as npn substrates, pnp substrates, etc.

According to another embodiment of the invention, a variation in the etching is suppressed by the constitution of the invention irrespective of sub-patterns which may be automatic alignment patterns for automatically aligning photomasks, electrode patterns for joining electrodes, various TEG patterns for testing chip patterns, or any other patterns.

According to the production method of the above-mentioned embodiment of the invention, a semiconductor device having the above-mentioned constitution is formed, i.e., chips that previously turned out to be defective can be obtained as acceptable products maintaining good yields without waste, and the cost of production can be lowered.

The above-mentioned embodiment of the invention will be described in further detail.

Figure 11A:
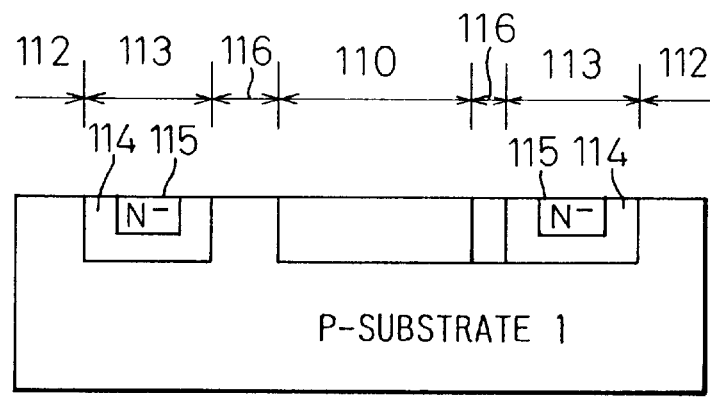
Figure 11B:
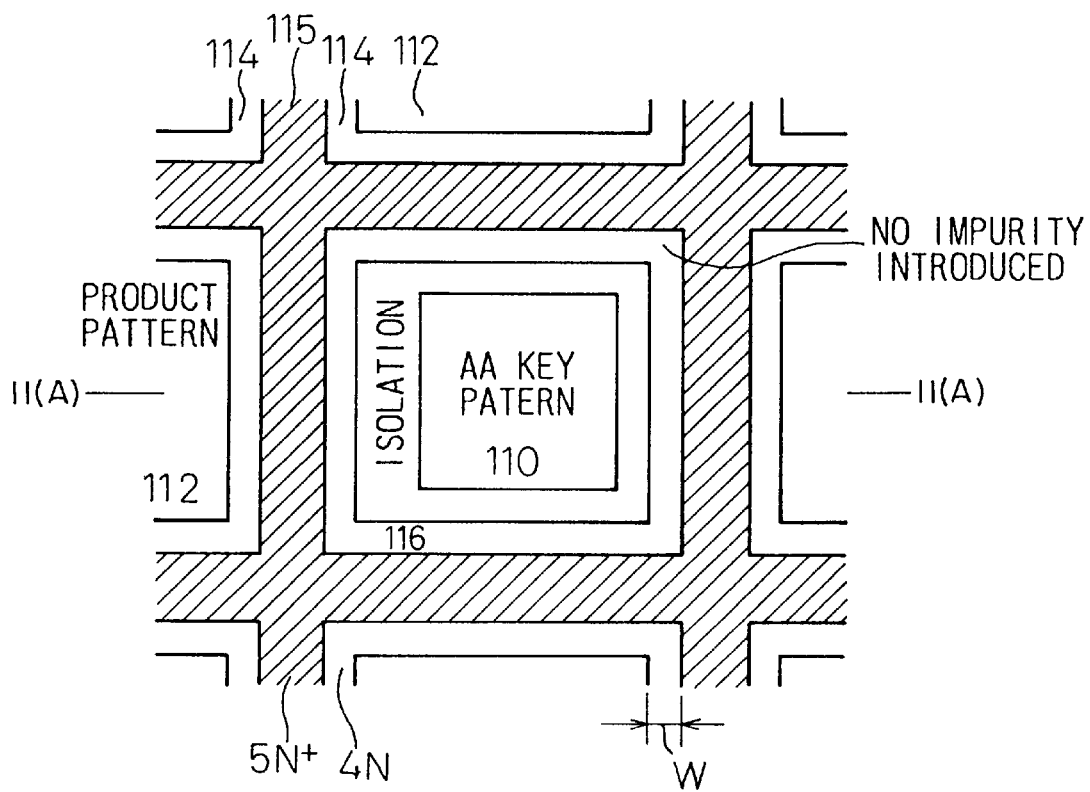
FIG. 11B is a plan view illustrating a major portion on an enlarged scale.

FIG. 11 illustrates the structure of a p-type wafer according to the present invention. FIG. 11(A) is a sectional view along the line A—A' of FIG. 11(B). In FIG. 11(A), an AA key pattern 110 which is a sub-pattern is formed in a p-type substrate 111 in which are formed product patterns 112, an isolation 116 is formed surrounding the AA key pattern 110, but no semiconductor layer, into which impurities are introduced, is formed to surround the isolation 116. When the AA key pattern 110 is larger than the product pattern 112, the constitution of the present invention will be provided on a plurality product patterns.

The width of the semiconductor layer (W in FIG. 11(B)) in which no impurities are introduced is determined by the breakdown voltage between the isolation 116 surrounding the AA key pattern 110 and the low-resistance layer 115 (n+-region). The breakdown voltage must be greater than the voltage applied by the external unit during the etching. When the width W is, for example, 10 μm, a breakdown voltage of 80 V is obtained though it may vary depending upon the p-type substrate 111 and the impurity concentration in the n-epitaxial layer 114.

Described below is a procedure for forming the structure shown in FIGS. 11(A) and 11(B). The semiconductor device is produced by utilizing the steps employed in a conventional process for producing semiconductor devices. The feature of the invention resides in the steps for forming the above-mentioned constitution.

(1) On one surface of an n-type epitaxial/p-type silicon wafer, AA key patterns are used for aligning the photomasks to form chip patterns and to form, as required, electrode patterns for joining electrodes or various TEG patterns as sub-patterns. In this case, isolation regions are formed to surround sub-patterns such as AA key patterns.

(2) The surroundings of the sub-patterns are subjected to patterning to form isolation regions.

(3) An n+-type region that serves as a low-resistance layer is formed in a predetermined portion of the n-epitaxial layer in the scribe region while leaving the n-type epitaxial layer in which impurities have not been introduced by a predetermined width from the edge thereof.

(4) An aluminum wiring for etching is formed by patterning on the low-resistance layer (this step may be omitted).

(5) Predetermined portions of the wafer are removed by the electrochemical stop etching to obtain a desired shape.

(6) Thereafter, the wafer is divided into chips by a known process for producing semiconductor devices in order to obtain products.

According to the constitution shown in FIGS. 11(A) and (B), the low-resistance layer 115 in the scribe region 113 does not overlap the isolation 116 in the AA key pattern 110.

Accordingly, no current leaks during the electrochemical stop etching, the potential does not lose uniformity with respect to the substrate, and diaphragms having a desired uniform thickness can be formed in the chip patterns on the surface of the wafer.

In addition to the AA key patterns, a variety of TEG patterns and electrode patterns for joining anodes may be surrounded by isolations which are kept off the contact with the semiconductor layer (n+-type low-resistance layer or p+-type layer) which is surrounding the isolations and in which have been introduced impurities. This structure can be adapted to forming any semiconductor device by employing electrochemical stop etching.

As described above, the constitution of the present invention can be adapted to not only forming diaphragms but also to producing semiconductor devices of any kind relying upon electrochemical stop etching. Thus, the constitution of the invention is not limited to particular semiconductor devices only but can be used for general applications.

In this specification, introduction of impurities, in the case of an n-type epitaxial/p-type substrate, stands for introducing impurities into the n-type epitaxial layer to render its surface to be n+-type low-resistance layer or p+-type layer, but does not stand for impurities that are contained in the n-type epitaxial layer. In addition to those mentioned above, furthermore, the sub-patterns will include all patterns other than the object product patterns.

In the above-mentioned aspect, the present invention provides a semiconductor device comprising a plurality of chip patterns having a major circuit constituted on the side of an epitaxial layer of a second type of conduction by photolithography relative to a substrate of a first type of conduction on the surface of which is formed said epitaxial layer of the second type of conduction, scribe regions formed on said substrate surrounding said chip patterns, an epitaxial layer of the second type of conduction left on said scribe regions, and a low-resistance layer of a high concentration having the second type of conduction formed in said epitaxial layer of the second type of conduction, which further comprises:

an isolation region surrounding pattern regions in which are formed sub-patterns that will be used for a different purpose instead of said chip patterns; and an epitaxial layer of the second type of conduction which surrounds said isolation region and is coupled to the epitaxial layer of the second type of conduction in said scribe regions.

The width of the epitaxial layer of the second type of conduction from an end of said high-concentration low-resistance layer of the second type of conduction included in the epitaxial layer of the second type of conduction in said scribe regions to an end of said isolation region is the one that produces a breakdown voltage resistance that withstands a voltage applied across said high-concentration low-resistance layer of the second type of conduction and said substrate at the time of electrochemical stop etching and that is determined by said layers and by the impurity concentration in said substrate.

Here, the sub-patterns may be automatic alignment patterns for automatically effecting photomask alignment, electrode patterns for joining anodes, or various TEG patterns for testing chip patterns.

The present invention further provides a method of producing semiconductor devices having a plurality of chip patterns constituting a major circuit in at least one surface of a substrate of a first type of conduction on the surface of which is formed an epitaxial layer of a second type of conduction, scribe regions formed on said substrate surrounding said chip patterns, an epitaxial layer of the second type of conduction on said scribe regions, and a low-resistance layer of a high concentration having the second type of conduction formed in said epitaxial layer of the second type of conduction.

Pattern regions are surrounded by isolation regions, said pattern regions forming sub-patterns that will be used for a different object instead of forming said chip patterns.

The isolation regions are surrounded by the epitaxial layers of the second type of conduction of said scribe regions.

The width of the epitaxial layer of the second type of conduction from an end of said high-concentration low-resistance layer of the second type of conduction included in the epitaxial layer of the second type of conduction is selected to be the one that produces a breakdown voltage that withstands a voltage applied across said low-resistance layer of the second type of conduction and said substrate and that is determined by said layers and by the impurity concentration in said substrate.

Described below is a third aspect which is an embodiment for realizing a further object of the present invention. That is, according to this aspect, the invention provides a method of producing semiconductor devices having an n-type silicon layer formed on a p-type silicon substrate, a thin portion formed by removing said p-type silicon substrate, and metal wiring, for connection to the substrate, that is extended on the surface of said n-type silicon layer and is electrically connected to said p-type silicon substrate, said method of producing semiconductor devices comprising a first step for forming metal wiring material on the whole surface of a silicon wafer made up of the p-type silicon substrate on which the n-type silicon layer is formed, a second step for simultaneously photoetching said metal wiring material, using a mask, leaving said metal wiring for connection to the substrate and a metal wiring for electrochemical etching that is electrically connected to the n-type silicon layer, a third step for forming a resist pattern having an opening between the metal wiring for connection to the substrate and the metal wiring for electrochemical etching and then effecting the photoetching through said opening, and a fourth step for forming a thin portion by electrochemically etching the p-type silicon substrate by applying a voltage to the metal wiring for electrochemical etching.

In the technical constitution of this aspect, the first step forms the metal wiring material on the whole surface of the silicon wafer made up of the p-type silicon substrate on which the n-type silicon layer is formed, and the second step simultaneously photoetches the metal wiring material by using a piece of mask leaving the metal wiring for connection to substrate and the metal wiring for electrochemical etching electrically connected to the n-type silicon layer. Then, the third step forms a resist pattern having an opening formed between the metal wiring for connection to the substrate and the metal wiring for electrochemical etching, and effects the photoetching through the opening. Therefore, the metal wiring for connection to the substrate and the metal wiring for electrochemical etching are not electrically connected together. The fourth step then applies a voltage to the metal wiring for electrochemical etching in order to electrochemically etch the p-type silicon substrate and to form a thin portion. During the electrochemical etching, short-circuits are avoided between the metal wiring for connection to substrate and the metal wiring for electrochemical etching, and no current leaks from the metal wiring for electrochemical etching to the p-type silicon substrate.

An embodiment according to the third aspect of the invention will now be described with reference to the drawings.

Embodiment 3

The method of producing a semiconductor pressure sensor according to the third embodiment will now be described with reference to FIGS. 20 to 34.

Figure 20:
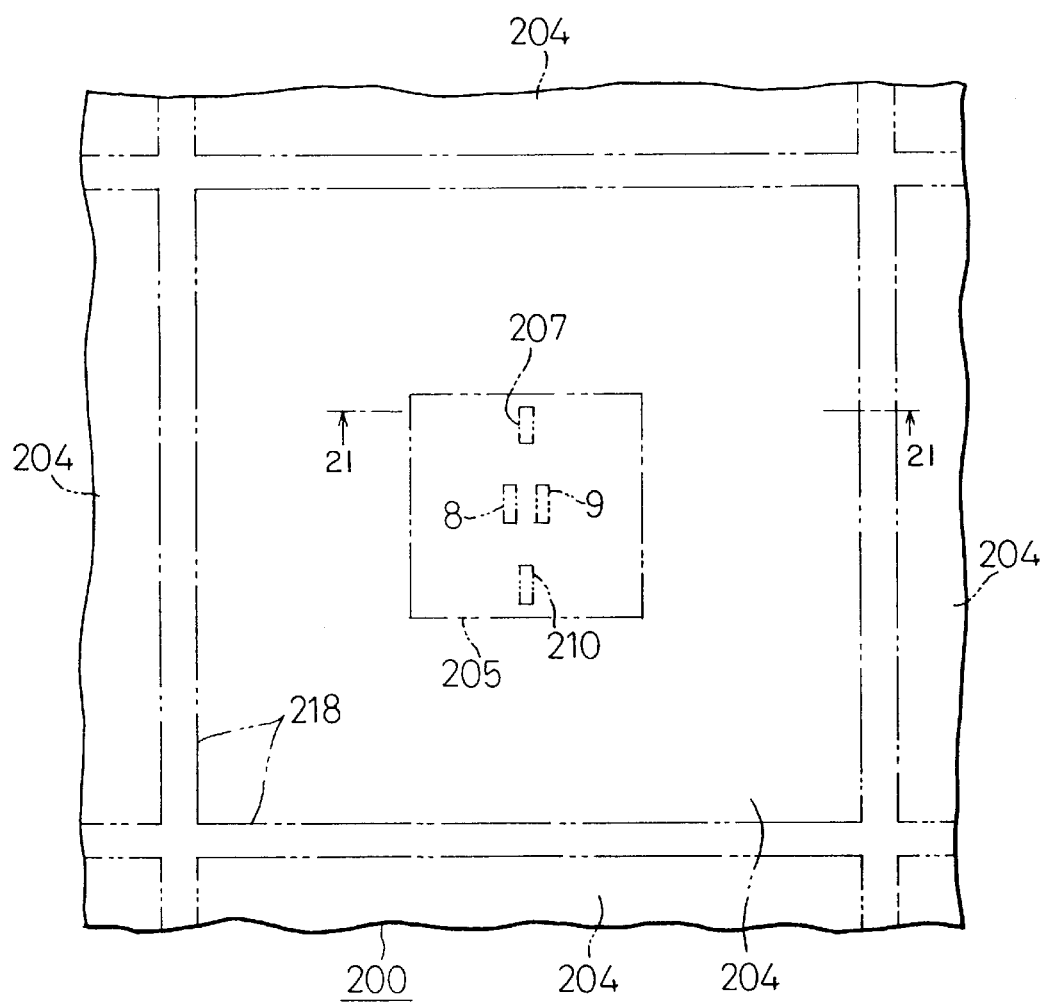
FIG. 20 is a plan view of a silicon wafer for producing a semiconductor pressure sensor according to a third embodiment.
Figure 21:
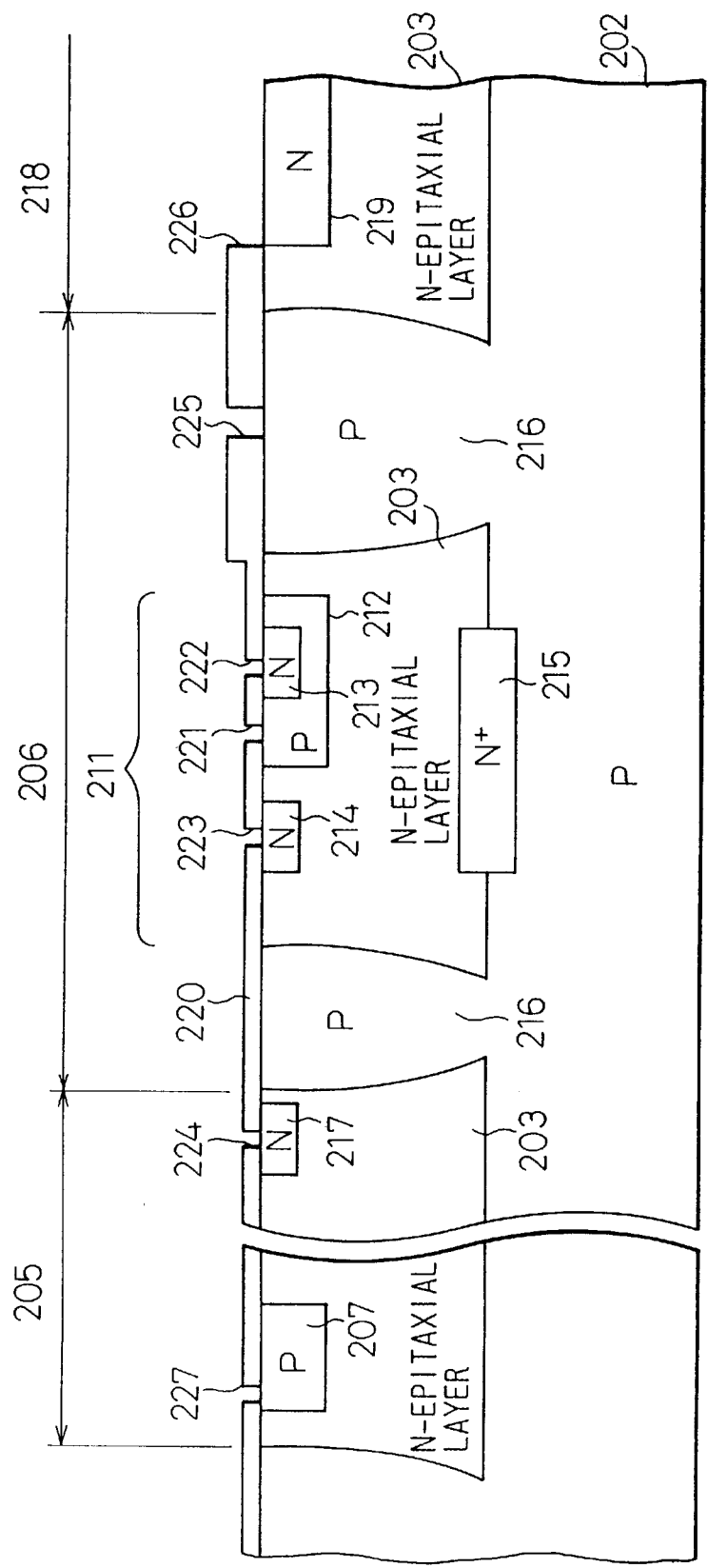
FIG. 21 is a sectional view along the line B—B of FIG. 20.

FIG. 20 is a plan view of a silicon wafer 201 of before the electrochemical etching is effected, and FIG. 21 is a sectional view along B—B of FIG. 20.

Figure 22:
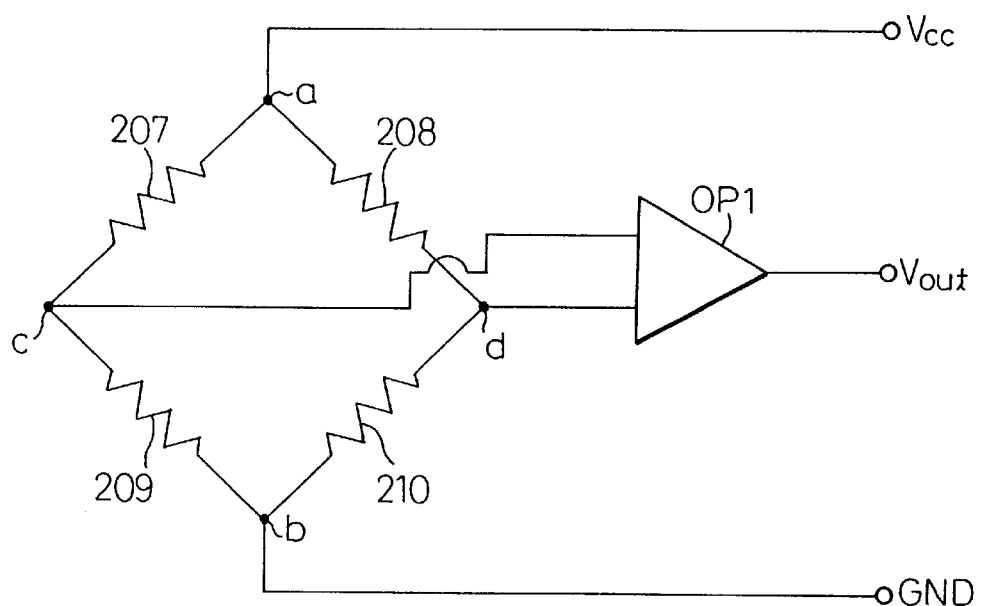
FIG. 22 is a diagram of an electric circuit of a semiconductor pressure sensor.

An n-type epitaxial layer 203 that serves as an n-type silicon layer is formed on a p-type silicon substrate 202. A number of chip-forming regions 204 are formed in a silicon wafer 201. A diaphragm-forming region 205 is formed in a central portion in each chip-forming region 204 and a peripheral circuit region 206 is formed in the periphery thereof. Four p-type impurity diffusion regions (piezo-resistance layers) 207, 208, 209 and 210 are formed in the surface of the n-type epitaxial layer 203 in the diaphragm-forming region 205, the four p-type impurity diffusion regions (piezo-resistance layers) 207, 208, 209 and 210 being full bridge-connected as shown in FIG. 3. Referring to FIG. 22, a voltage Vcc is applied to a first connection terminal a of the bridge circuit, ground potential is applied to a second connection terminal b, and output Vout is obtained from third and fourth connection terminals c and d via an amplifier OP1.

In the peripheral circuit region 206 shown in FIG. 21, an npn transistor 211 is formed to constitute the amplifier OP1 of FIG. 22. That is, a p-type base region 212 is formed in the n-type epitaxial layer 203, an n-type emitter region 213 is formed in the p-type base region 212, and an n-type collector region 214 is formed in the n-type epitaxial layer 203. There is further formed an n+-type buried layer 215. A p-type region 216 is formed in the n-type epitaxial layer 203 that surrounds the npn transistor 211, and the npn transistor 211 is isolated by a pn junction.

An n-type impurity region 217 for applying etching voltage is formed in the n-type epitaxial layer 203 in the diaphragm-forming region 205. An n-type impurity region 219 for applying etching voltage is extending in the n-type epitaxial layer 203 on the scribe line 218.

The surface of the n-type epitaxial layer 203 is covered by a silicon oxide film 220 in which are formed an opening 221 for contact to the p-type base region 212, an opening 222 for contact to the n-type emitter region 213, an opening 223 for contact to the n-type collector region 214, an opening 224 for contact to the n-type impurity region 217 for applying etching voltage, an opening 225 for contact to the p-type region 216, an opening 226 for contact to the n-type impurity region 219 for applying etching voltage, and an opening 227 for contact to the p-type impurity diffusion regions (piezo-resistance layers) 207, 208, 209 and 210.

Figure 23:
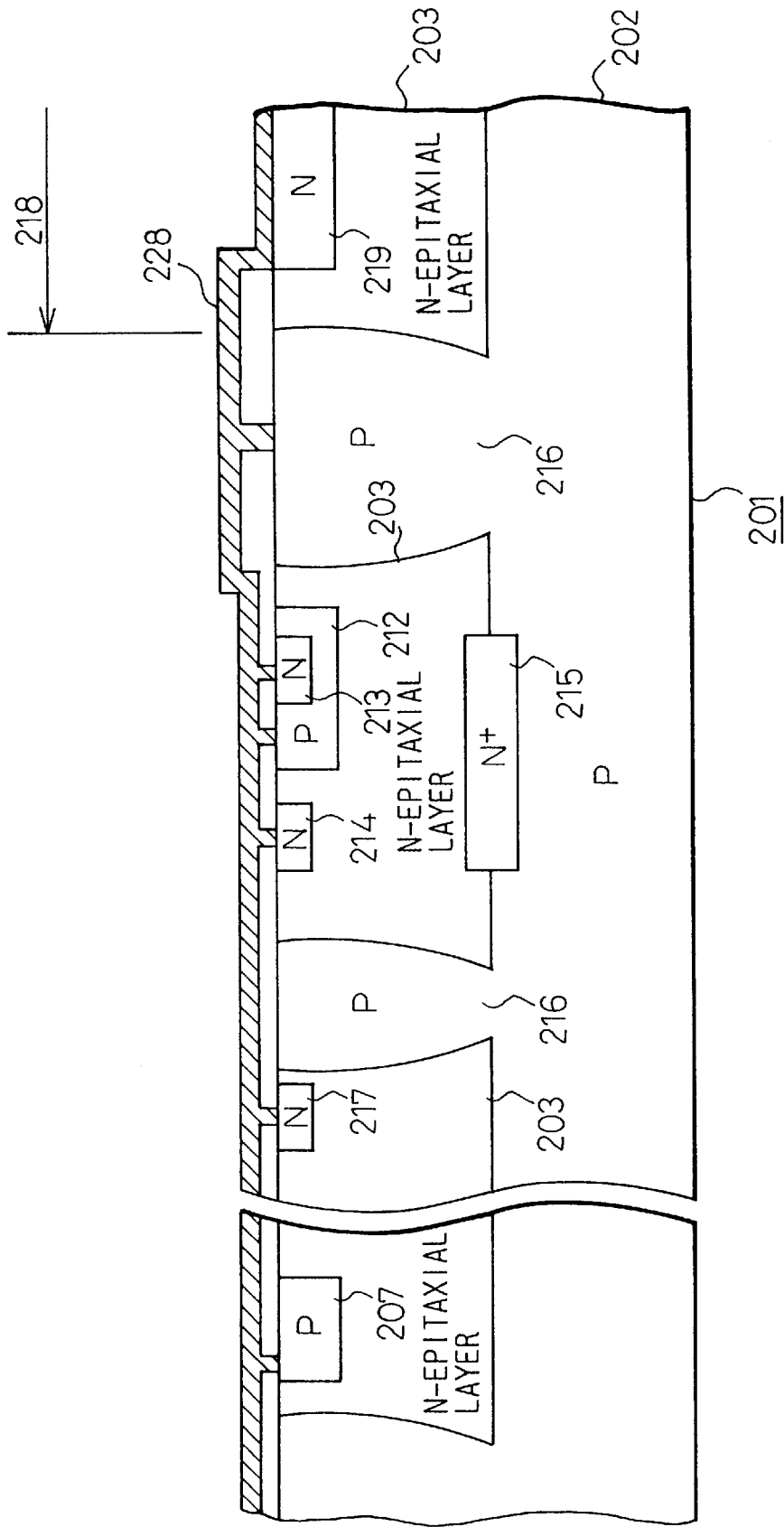
FIG. 23 is a sectional view illustrating a step for producing the semiconductor pressure sensor of the third embodiment.

Referring to FIG. 23, an aluminum film 228 which serves as a metal wiring material is formed on the whole surface of the silicon wafer 201.

Figure 24:
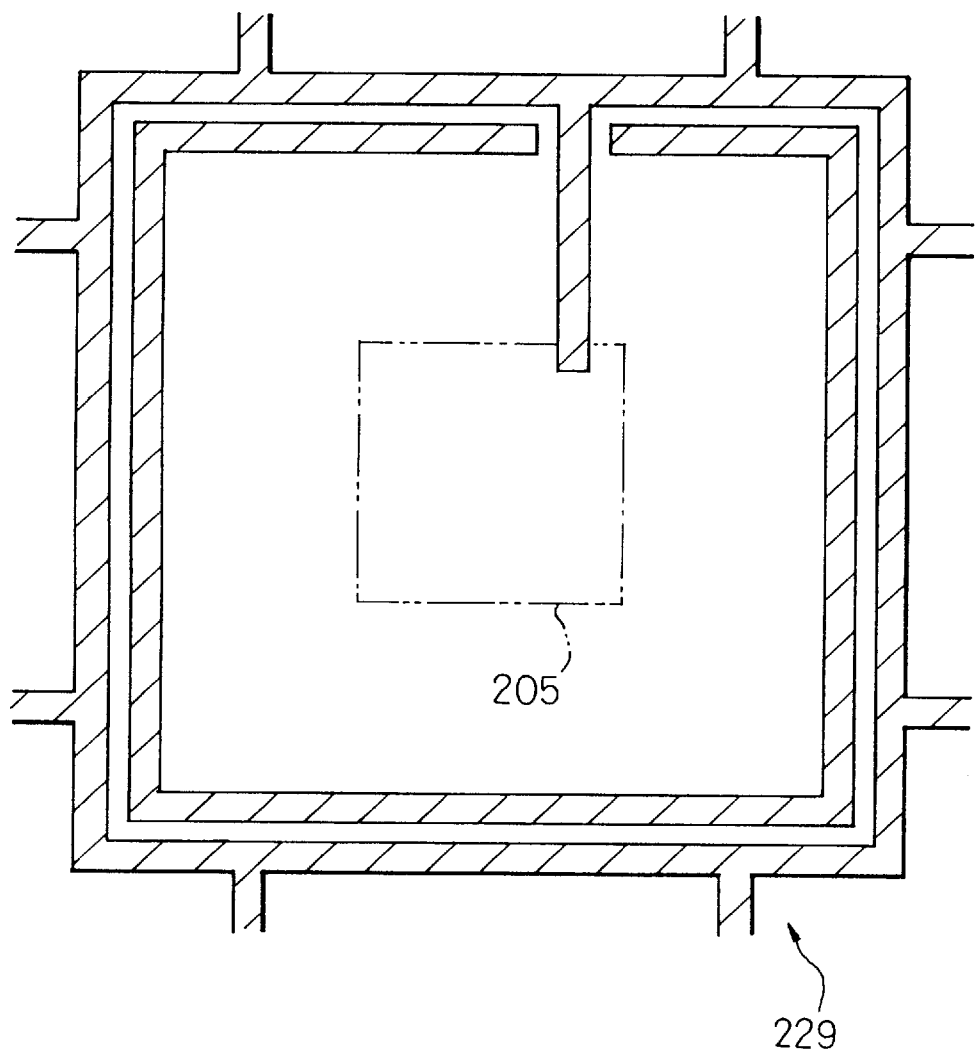
FIG. 24 is a plan view illustrating a photomask.
Figure 25:
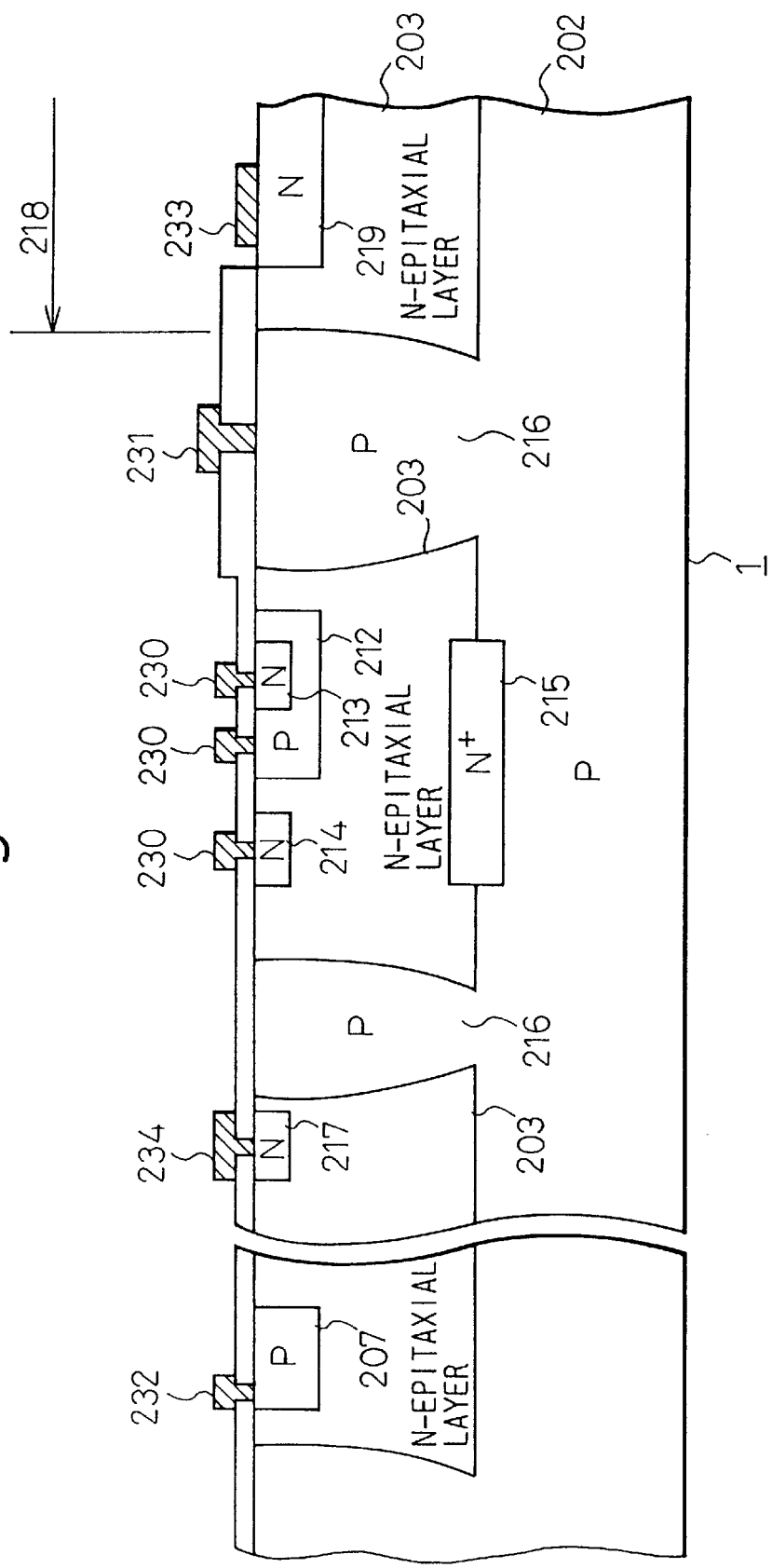
FIG. 25 is a sectional view illustrating a step for producing the semiconductor pressure sensor of the third embodiment.
Figure 26:
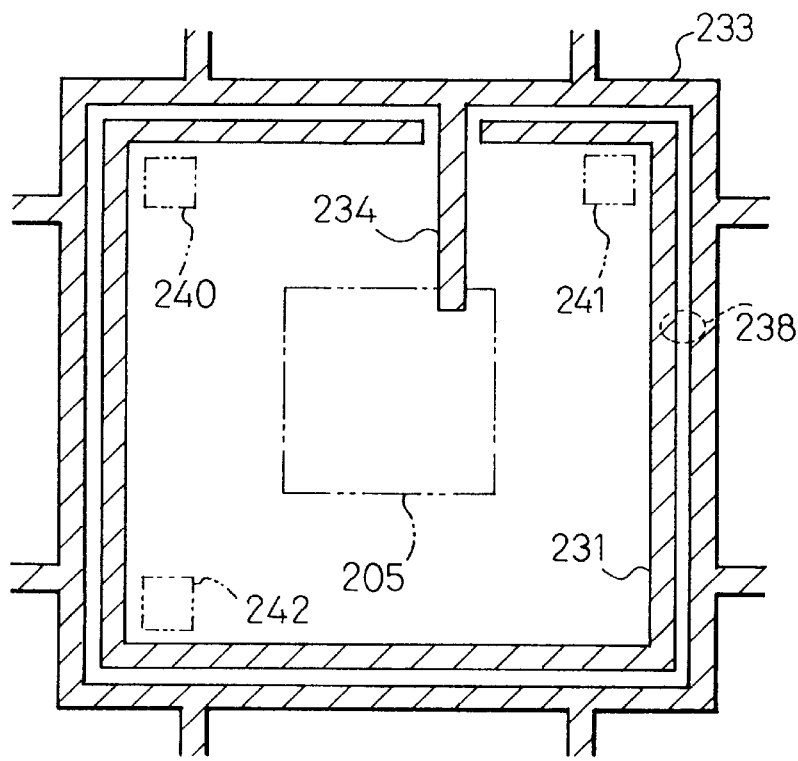
FIG. 26 is a plan view illustrating a step for producing the semiconductor pressure sensor of the third embodiment.

The aluminum film 228 is etched by using an aluminum wiring photomask (for positive use) 229 that is shown in FIG. 24. As a result, as shown in FIGS. 25 and 26, there is left aluminum wiring 230 for a peripheral circuit, aluminum wiring for a peripheral circuit (metal wiring for connection to substrate) 231, aluminum wiring 232 for a bridge circuit, aluminum wiring for electrochemical etching (metal wiring for electrochemical etching) 233, and aluminum wiring 234 for electrochemical etching. Here, the aluminum wiring 230 for a peripheral circuit is the wiring of the transistor 211 in the peripheral circuit region 6, and the aluminum wiring 232 for bridge circuit is the wiring for forming the bridge circuit of FIG. 3. The aluminum wiring 231 for peripheral circuit is the aluminum wiring for a ground potential that extends in the chip-forming region neighboring the scribe line, is electrically connected to the p-type region 216, and works to acquire ground potential of the bridge circuit of FIG. 22. Furthermore, the aluminum wiring 233 for electrochemical etching is the aluminum wiring extending on the scribe line, and the aluminum wiring 234 for electrochemical etching is the wiring that extends from the aluminum wiring 233 to the n-type impurity region 217 for applying etching voltage.

Figure 27:
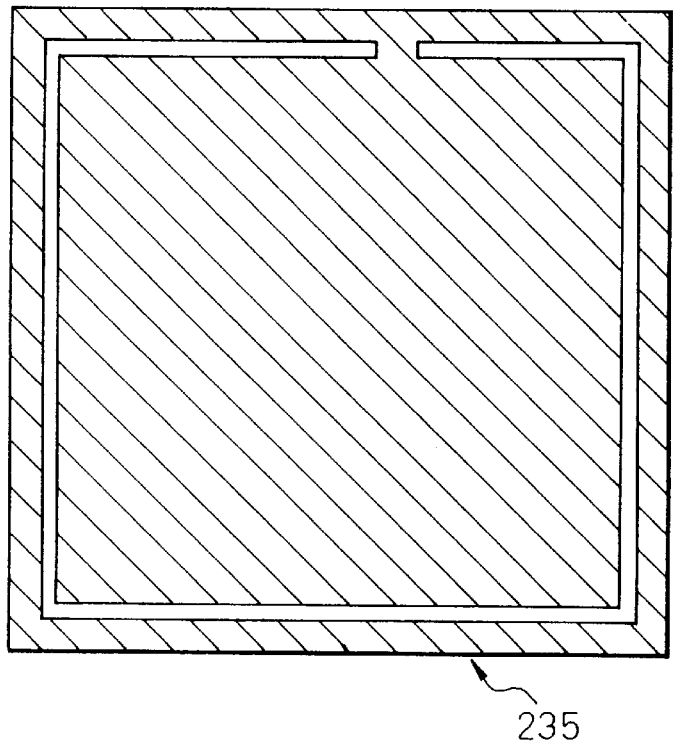
FIG. 27 is a plan view illustrating a mask for removing material that causes short-circuiting.
Figure 28:
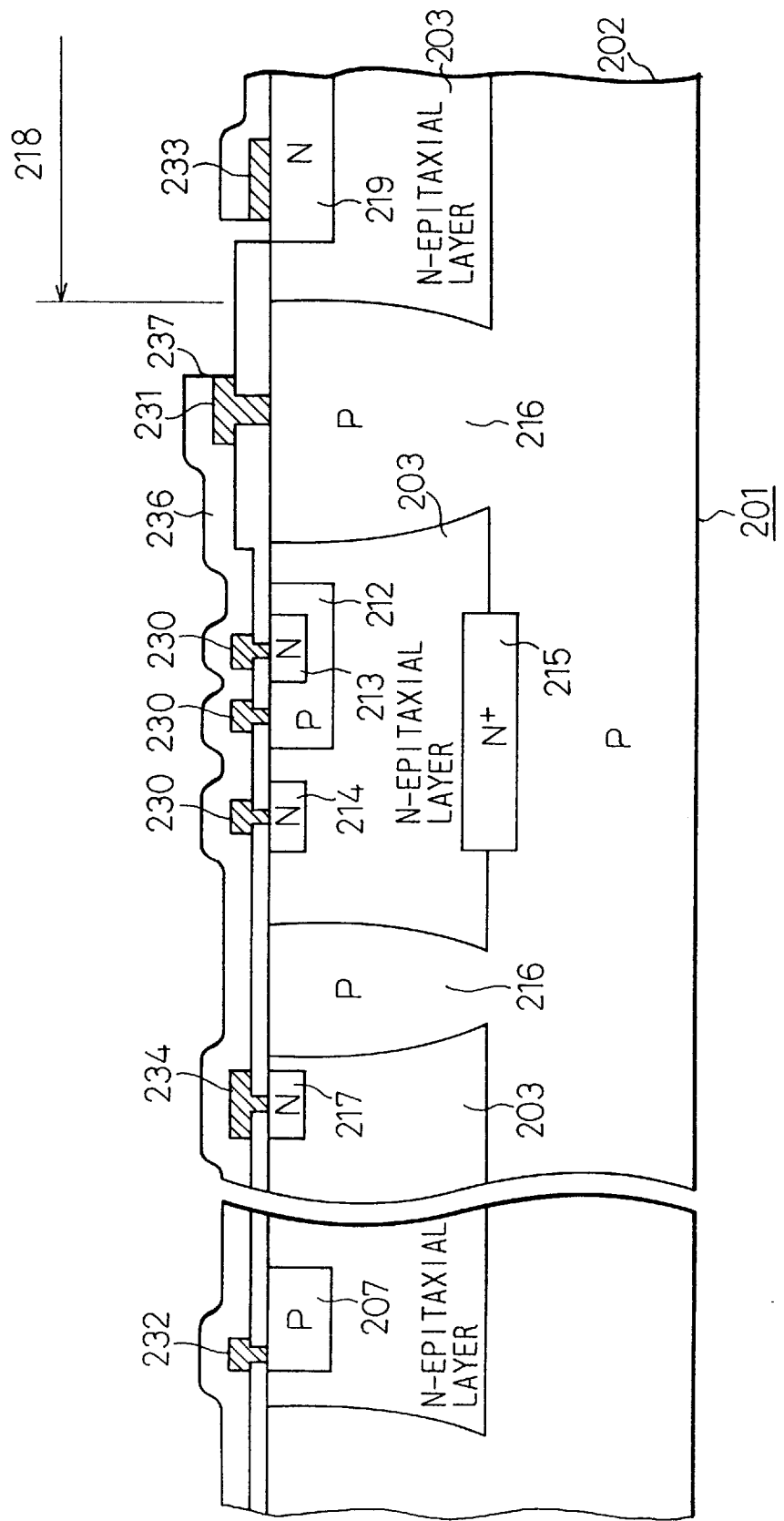
FIG. 28 is a sectional view illustrating a step for producing the semiconductor pressure sensor of the third embodiment.
Figure 29:
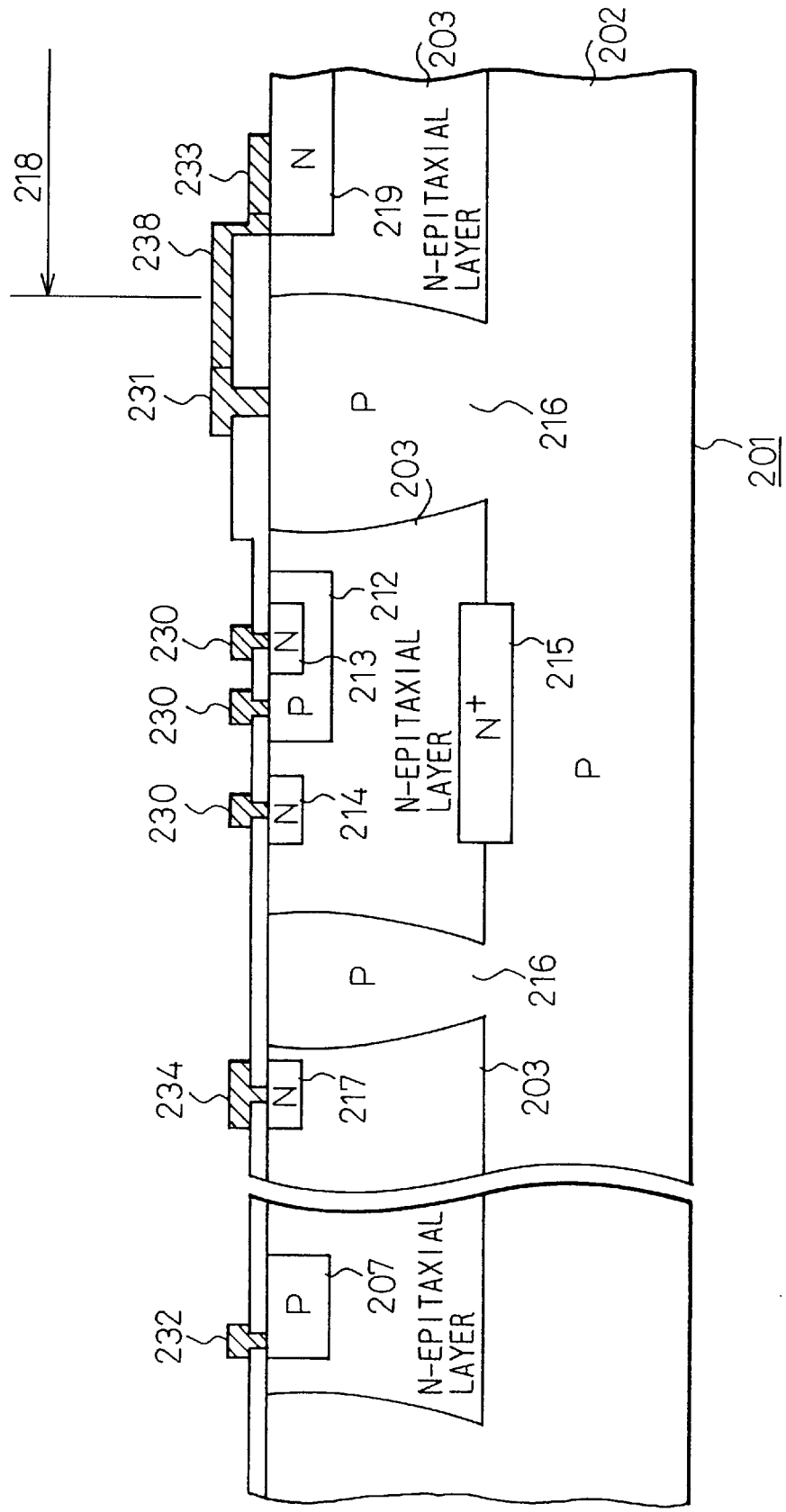
FIG. 29 is a sectional view illustrating a step for producing the semiconductor pressure sensor of the third embodiment.

Then, a mask (for positive use) 235 for removing material that can cause short-circuits is prepared as shown in FIG. 27. The mask (for positive use) 235 for removing material that causes short-circuit has an opening formed between the aluminum wiring 231 for peripheral circuit and the aluminum wiring 233 for electrochemical etching. By using the mask 235 for removing the material that can cause short-circuits, the resist 236 is patterned as shown in FIG. 28. The resist pattern has an opening 237 formed between the aluminum wiring 231 for peripheral circuit and the aluminum wiring 233 for electrochemical etching.

The photoetching is effected using the resist pattern. The aluminum wiring 231 for peripheral circuit and the aluminum wiring 233 for electrochemical etching are completely isolated from each other by the photoetching. That is, despite the fact that there exists aluminum 238 that may cause short-circuiting between the aluminum wiring 231 for peripheral circuit and the aluminum wiring 233 for electro-chemical etching in FIG. 26 (i.e., despite the fact that there exists aluminum 238 that causes short-circuiting in FIG. 29), the aluminum 238 that causes short-circuiting is removed.

Figure 30:
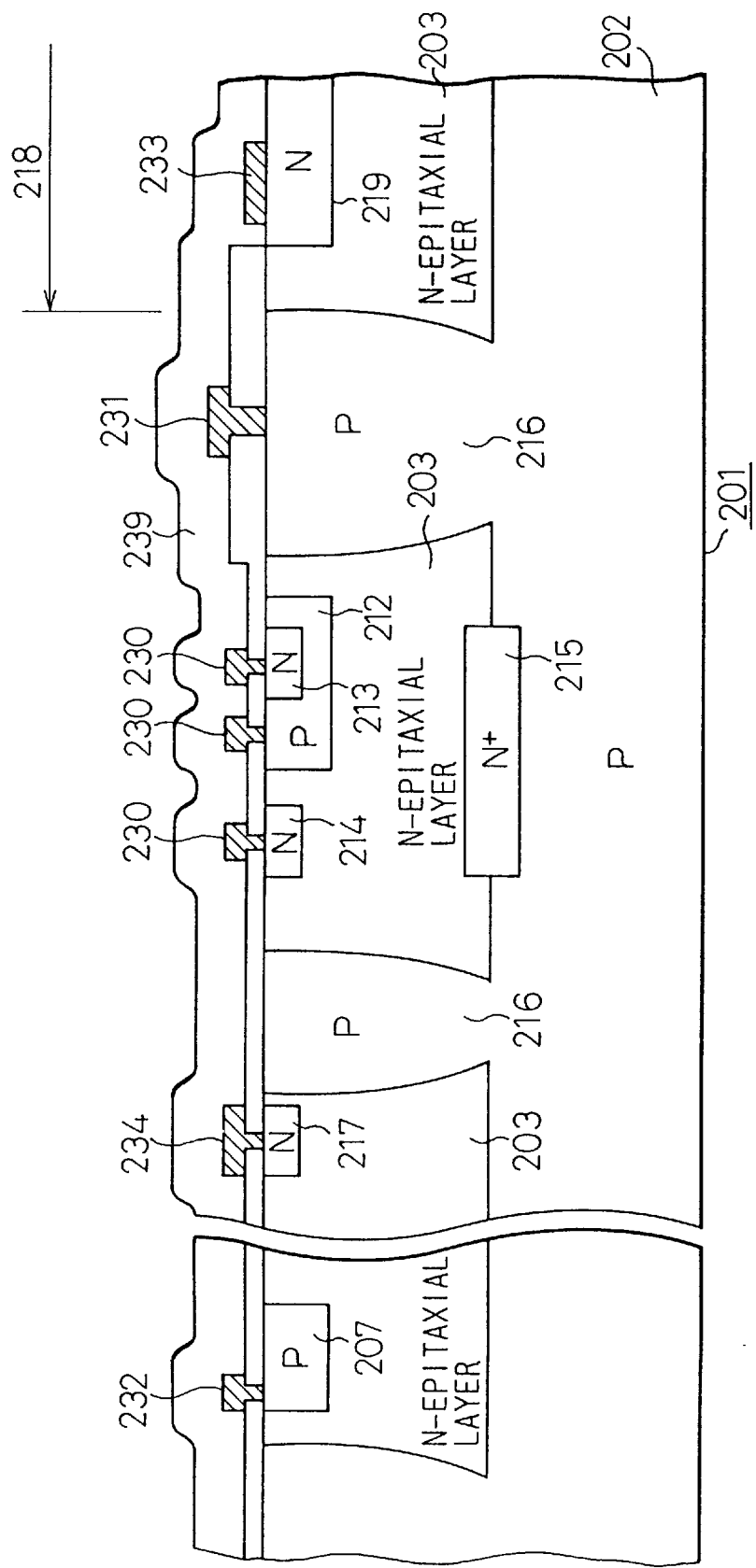
FIG. 30 is a sectional view illustrating a step for producing the semiconductor pressure sensor of the third embodiment.
Figure 31:
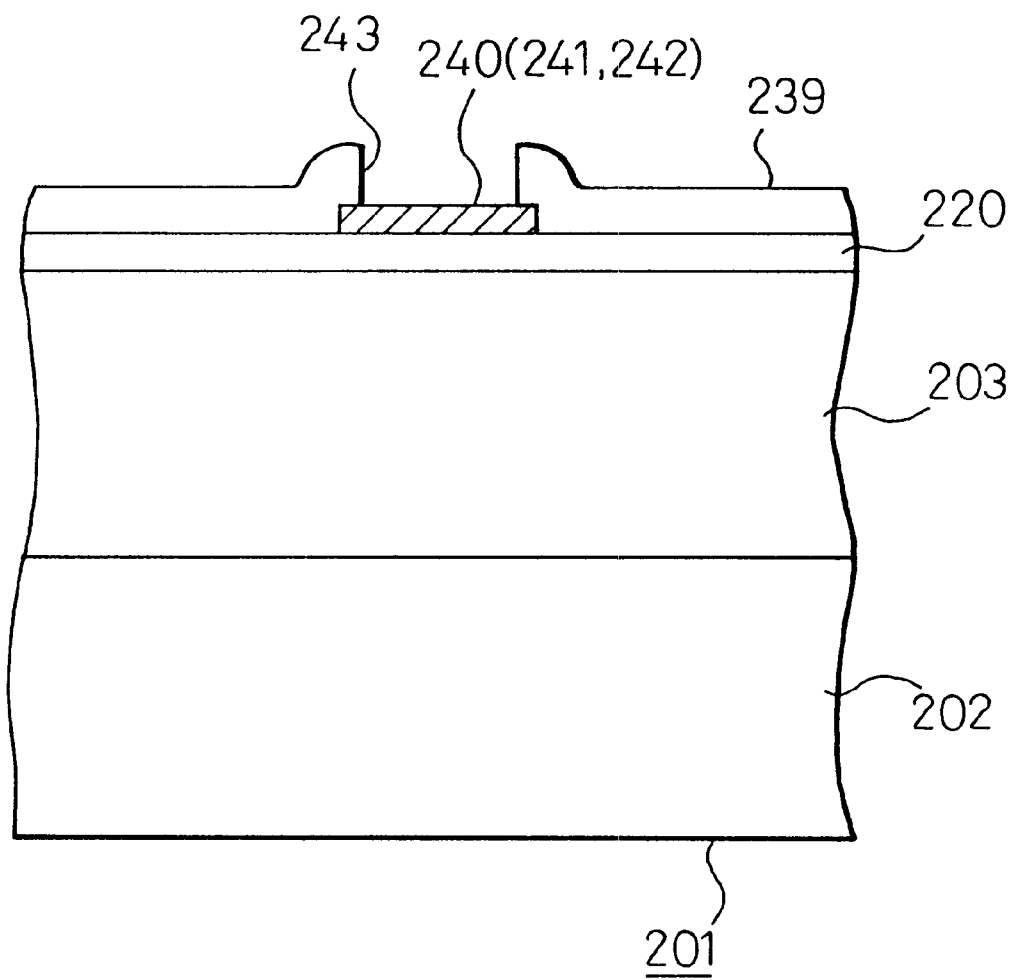
FIG. 31 is a sectional view illustrating a step for producing the semiconductor pressure sensor of the third embodiment.

Thereafter as shown in FIG. 30, a passivation film 239 is formed on the whole surface of the silicon wafer 201. As the passivation film 239, there is used a silicon nitride film, a silicon oxide film, or a laminate of the silicon nitride film and the silicon oxide film. In FIG. 26, there have been formed an aluminum pad 240 for applying a voltage Vcc of FIG. 22, an aluminum pad 241 for ground potential and an aluminum pad 242 for output. Referring to FIG. 31, the passivation film 239 in the pad portions are removed by etching to form openings 243. At the same time, the passivation film 239 is removed by etching from a pad portion (not shown) of the aluminum wiring 233 for electrochemical etching on the silicon wafer 201.

Figure 32:
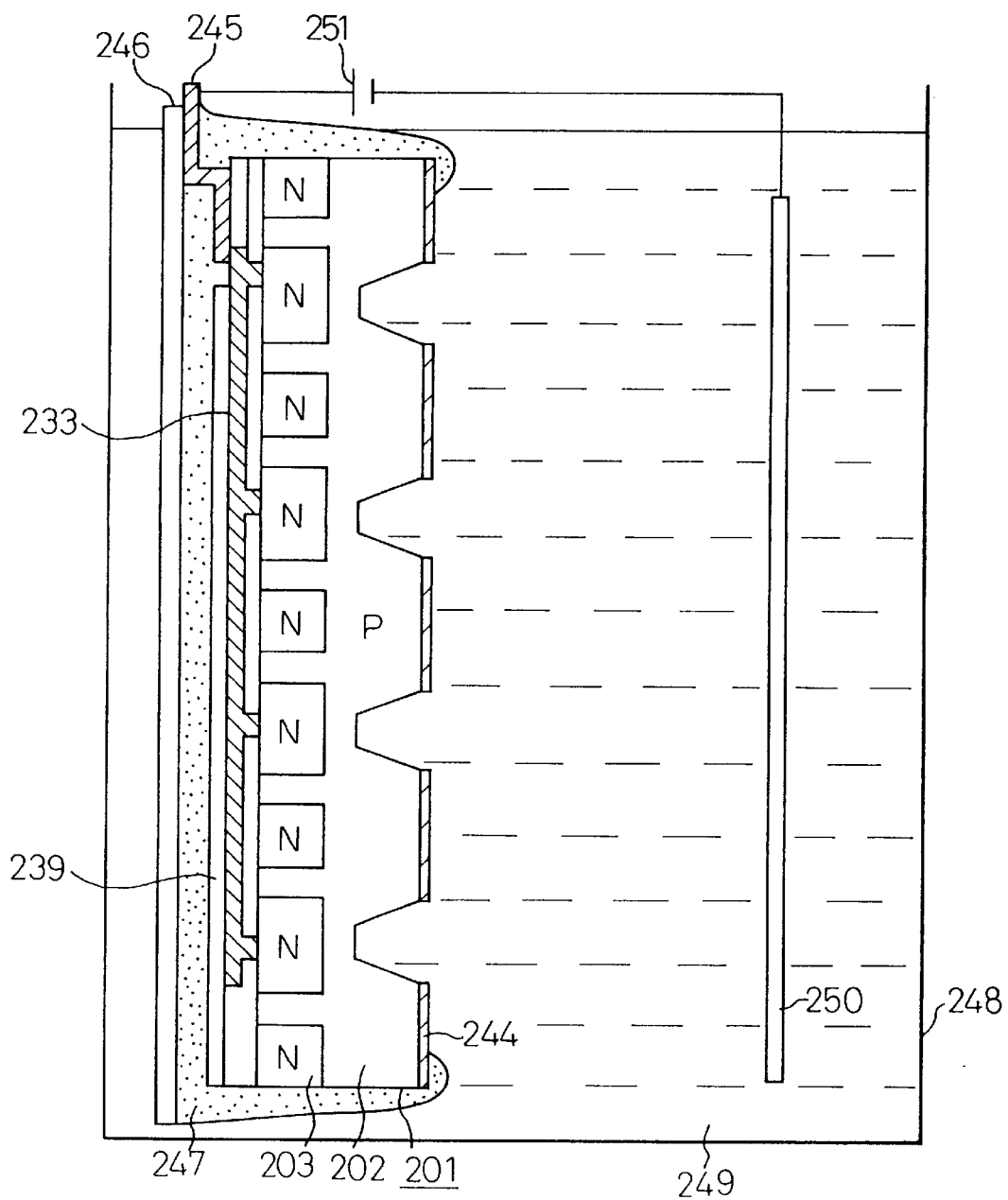
FIG. 32 is a sectional view illustrating a step for producing the semiconductor pressure sensor of the third embodiment.
Figure 33:
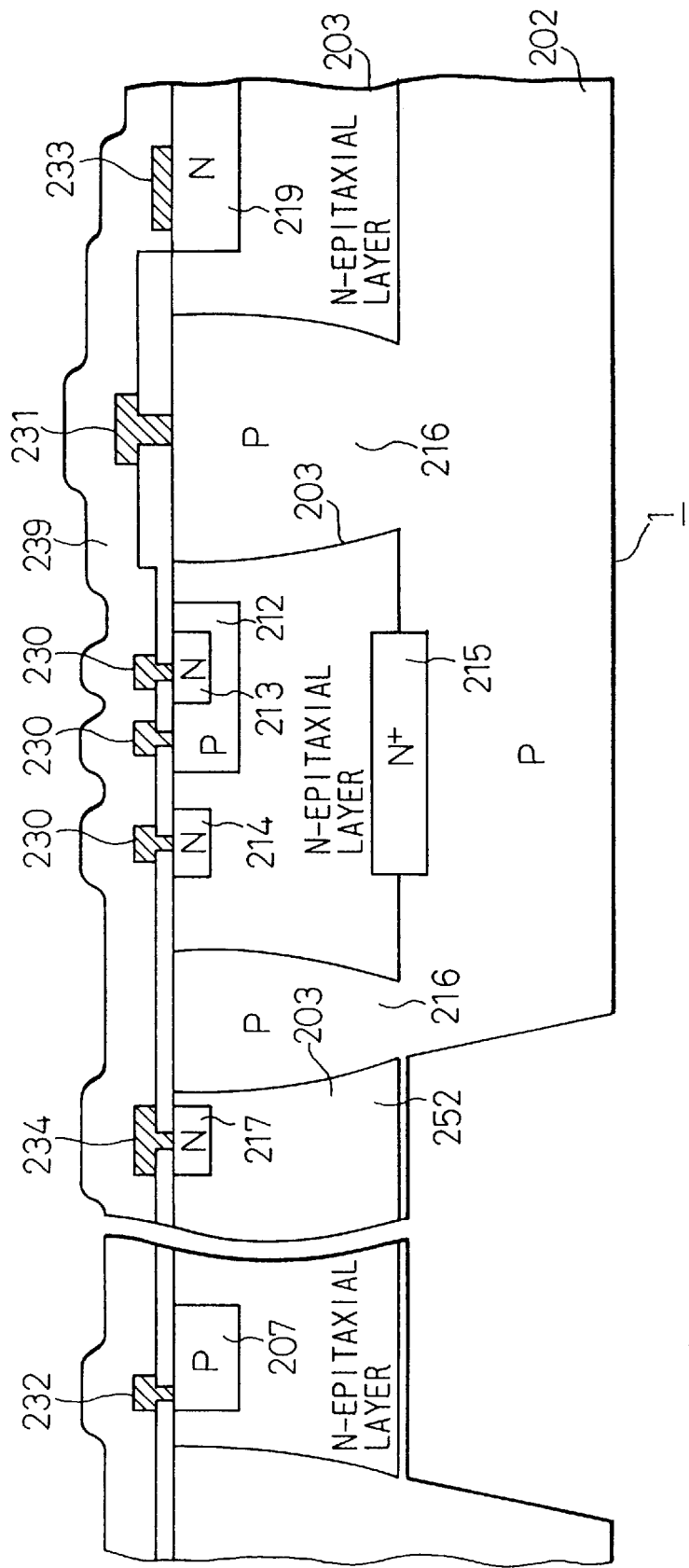
FIG. 33. is a sectional view illustrating a step for producing the semiconductor pressure sensor of the third embodiment.

Then, the electrochemical etching is effected as shown in FIG. 32. That is, a mask material 244 is formed on a region where no diaphragm is formed on the surface of the silicon wafer 201 where the n-type epitaxial layer 203 does not exist. Then, a ceramic support substrate 246 is secured to the silicon wafer 201 with a platinum electrode 245 therebetween. The surface of the silicon wafer 201 (the surface where n-type epitaxial layer 3 is formed) that is not subjected to etching is protected with wax 247. A platinum electrode 45 is electrically connected to the aluminum wiring 233 for electrochemical etching. A container 248 is filled with a KOH aqueous solution (33% by weight, 82° C.). The silicon wafer 201 is immersed in the KOH aqueous solution 249 in the container 248, and a platinum electrode 250 is disposed so as to be opposed to the silicon wafer 201. A constant-voltage source (2 volts) 251 is connected between the platinum electrode 245 of the silicon wafer 201 and the platinum electrode 250 to apply a constant voltage across the two electrodes 245 and 250. Then, the p-type silicon substrate 202 undergoes electrochemical etching, and the etching stops near the junction portion relative to the n-type epitaxial layer 203. As a result, a diaphragm (thin portion) 252 is formed in the diaphragm-forming region 205 as shown in FIG. 33.

The silicon wafer 201 is then cut along the scribe lines into chips.

As described above, this method is concerned with a method of producing a semiconductor pressure sensor wherein the n-type epitaxial layer 203 is formed on the p-type silicon substrate 202, the diaphragm 252 is formed by removing the p-type silicon substrate 202, and the aluminum wiring 231 for a peripheral circuit extends on the surface of the n-type epitaxial layer 203 being electrically connected to the p-type silicon substrate 202. The aluminum film 228 is formed on the whole surface of the silicon wafer 201 made up of the p-type silicon substrate 202 on which the n-type epitaxial layer 203 is formed (first step), and the aluminum film 228 is simultaneously photoetched using a piece of mask 229 but leaving the aluminum wiring 231 for a peripheral circuit and the aluminum wiring 233 for electrochemical etching electrically connected to the n-type epitaxial layer 203 (second step). Then, a resist pattern is formed having an opening between the aluminum wiring 231 for peripheral circuit and the aluminum wiring 233 for electrochemical etching, and the photoetching is effected through the opening 237 (third step). Therefore, the aluminum wiring 231 for the peripheral circuit and the aluminum wiring 233 for electrochemical etching are not electrically connected together. Then, a voltage is applied to the aluminum wiring 233 for electrochemical etching in order to electrochemically etch the p-type silicon substrate 202 and to form the diaphragm 252 (fourth step). During the electrochemical etching, short-circuiting is avoided between the aluminum wiring 231 for a peripheral circuit and the aluminum wiring 233 for electrochemical etching, and no current leaks from the aluminum wiring 233 for electrochemical etching to the p-type silicon substrate 202 via the aluminum wiring 231 for a peripheral circuit. Accordingly, it is possible to reliably form the diaphragm 252 having a predetermined thickness.

In the conventional steps of producing wafers, the aluminum wiring material is photoetched to form aluminum wiring, a passivation film is deposited thereon, and the passivation film is removed from the bonding pad portions. Therefore, in case it is learned that the aluminum wiring 231 for peripheral circuit and the aluminum wiring 233 for electrochemical etching are short-circuited after the passivation film is deposited, the wafer is no longer usable. When the presence of short-circuiting is learned prior to depositing the passivation film, the aluminum wiring may shrink and break if it is subjected to the photoetching again. When the presence of short-circuiting is learned prior to depositing the passivation film, furthermore, the short-circuiting may occur even if the aluminum wiring material is entirely removed and even if a new aluminum wiring material is formed on the whole surface again followed by photoetching to form the aluminum wiring. According to the embodiment of the present invention, on the other hand, the aluminum wiring material is photoetched and, then, aluminum is etched by using a resist pattern having an opening formed between the aluminum wiring 231 for peripheral circuit and the aluminum wiring 233 for electrochemical etching. Accordingly, there exists no possibility of short-circuits between the aluminum wiring 231 for peripheral circuit and the aluminum wiring 233 for electrochemical etching, and the electrochemical etching can be stably carried out.

Embodiment 4

Described below is a fourth embodiment. The description is based mainly upon differences from the third embodiment.

The method of producing a semiconductor pressure sensor of this embodiment will be described with reference to FIGS. 34 to 45.

Figure 34:
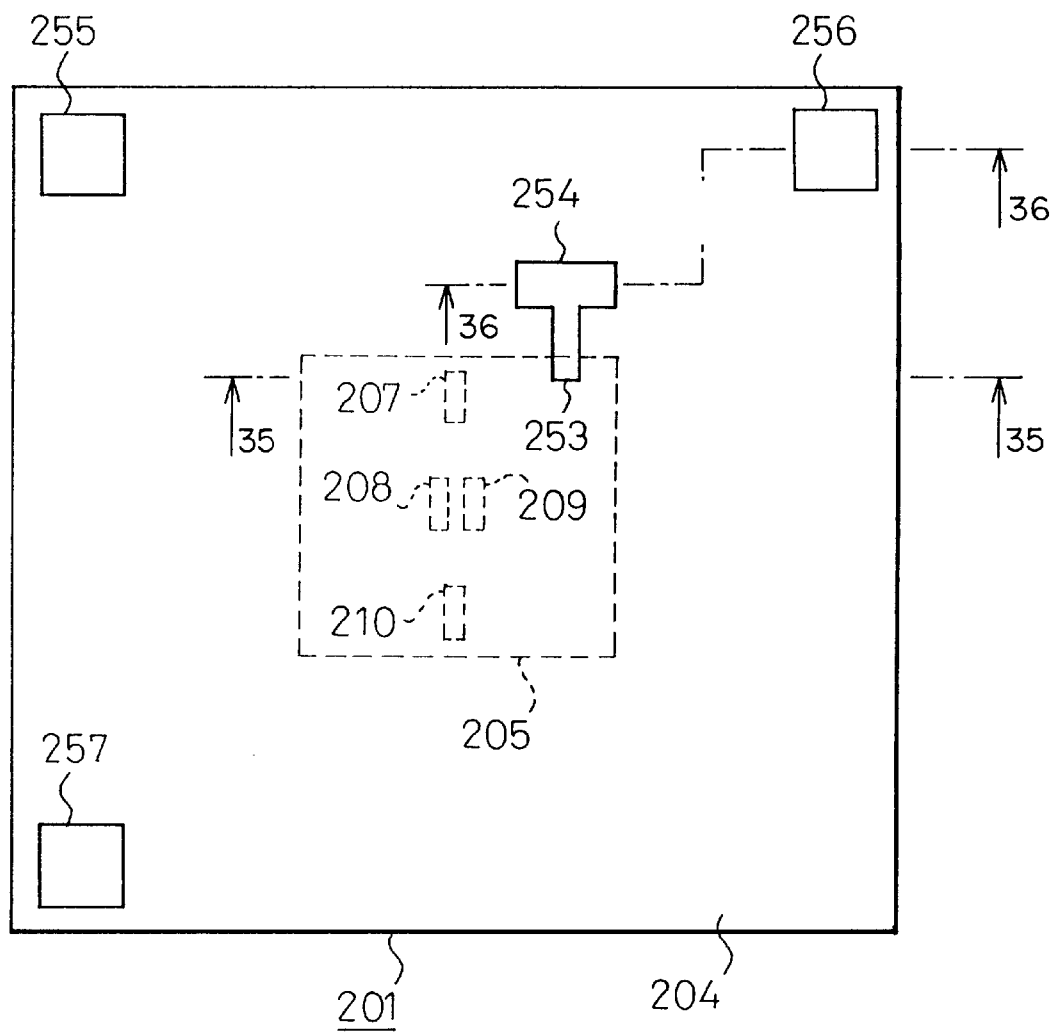
FIG. 34 is a plan view of a silicon wafer at the time of producing a semiconductor pressure sensor of a fourth embodiment.
Figure 35:
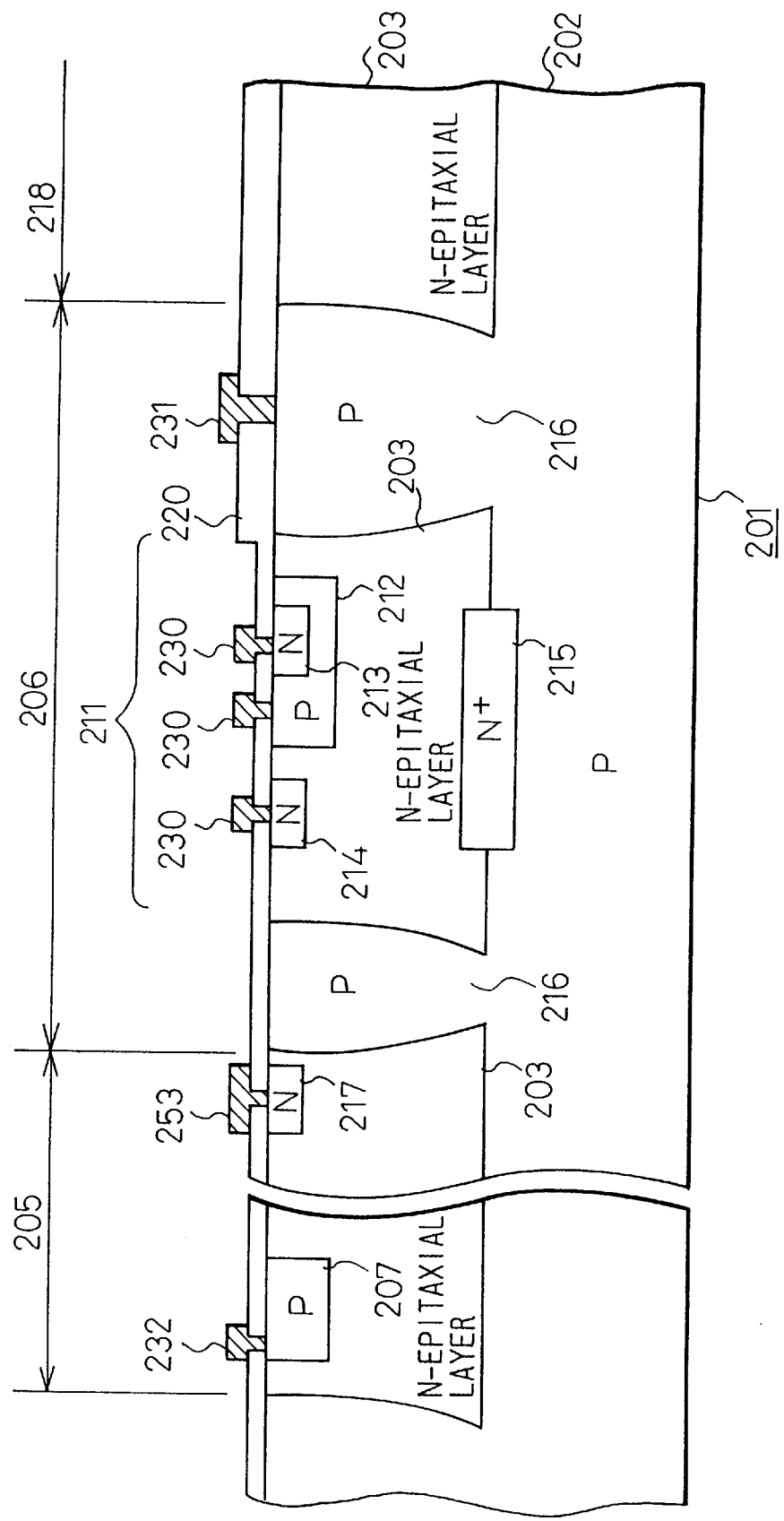
FIG. 35 is a sectional view along the line C—C of FIG. 34.
Figure 36:
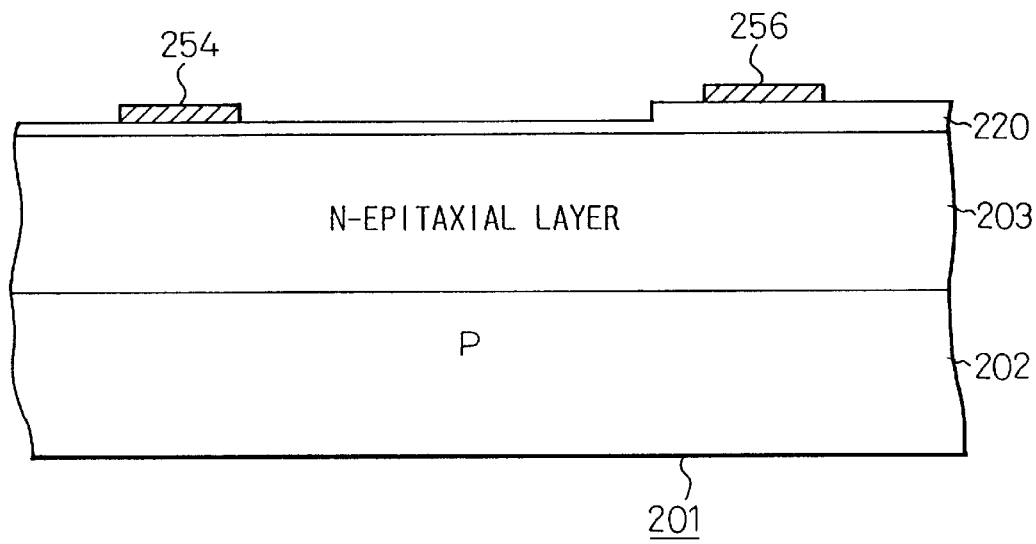
FIG. 36 is a sectional view along the line D—D of FIG. 34.

FIG. 34 is a plan view of a silicon wafer 201 of before the electrochemical etching is effected, FIG. 35 is a sectional view along C—C of FIG. 34, and FIG. 36 is a sectional view along D—D of FIG. 34.

An n-type epitaxial layer 203 is formed on a p-type silicon substrate 202. A diaphragm-forming region 205 is formed in a central portion in each chip-forming region 204 of the silicon wafer 201 and a peripheral circuit region 206 is formed in the periphery thereof. Four p-type impurity diffusion regions (piezo-resistance layers) 207, 208, 209 and 210 are formed in the surface of the n-type epitaxial layer 203 in the diaphragm-forming region 205, the four p-type impurity diffusion regions (piezo-resistance layers) 207, 208, 209 and 210 being full bridge-connected as shown in FIG. 3. An npn transistor 211 is formed in the peripheral circuit region 206 to constitute the amplifier OP1 of FIG. 22. That is, a p-type base region 212 is formed in the n-type epitaxial layer 203, an n-type emitter region 213 is formed in the p-type base region 212, and an n-type collector region 214 is formed in the n-type epitaxial layer 203. There is further formed an n+-type buried layer 215. A p-type region 216 is formed in the n-type epitaxial layer 203 that surrounds the npn transistor 211, and the npn transistor 211 is isolated by a pn junction.

An n-type impurity region 217 for applying etching voltage is formed in the n-type epitaxial layer 203 in the diaphragm-forming region 205.

The surface of the n-type epitaxial layer 203 is covered by a silicon oxide film 220. The p-type base region 212, n-type emitter region 213 and n-type collector 214 are electrically connected together through the aluminum wiring 230 for a peripheral circuit. The p-type region 216 is electrically connected by the aluminum wiring 231 for a peripheral circuit that is the metal wiring for connection to substrate, the aluminum wiring 231 extends as shown in FIG. 26. The p-type impurity diffusion regions 207, 208, 209 and 210 are electrically connected together, through the aluminum wiring 232, as a bridge circuit. In the n-type impurity region 217 for applying etching voltage, is formed aluminum wiring 253 for electrochemical etching, and aluminum wiring 253 for electrochemical etching extending toward the outside of the diaphragm-forming region 205 and forming an aluminum pad 254. Referring to FIG. 34, an aluminum pad 255 for applying voltage Vcc of FIG. 22, an aluminum pad 256 for ground potential, and an aluminum pad 257 for output are formed. The aluminum pad 256 for ground potential is connected to the aluminum wiring 231 for a peripheral circuit and provides ground potential for the bridge circuit of FIG. 22.

Figure 37:
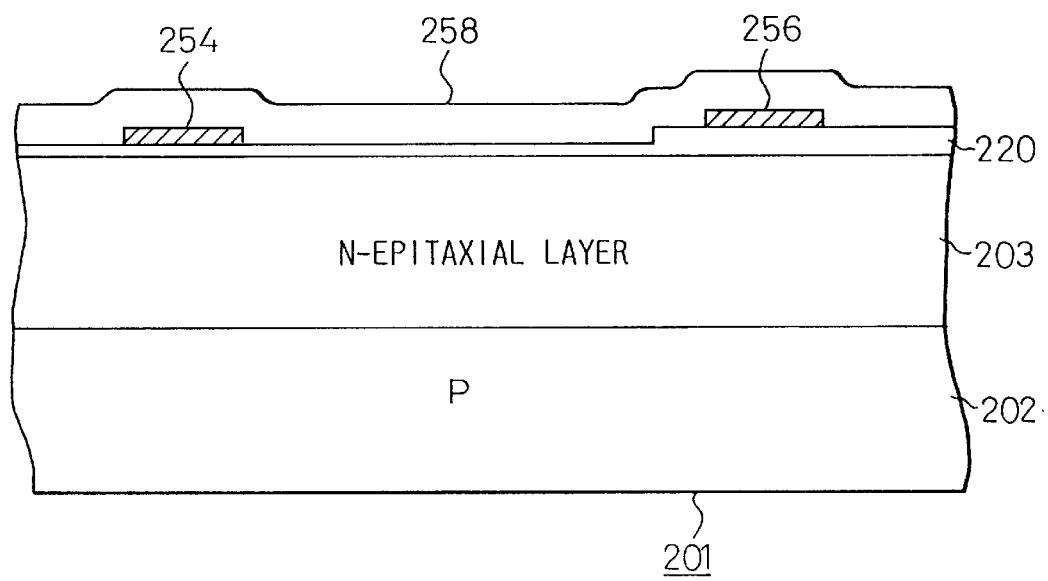
FIG. 37 a sectional view illustrating a step for producing the semiconductor pressure sensor of the fourth embodiment.
Figure 38:
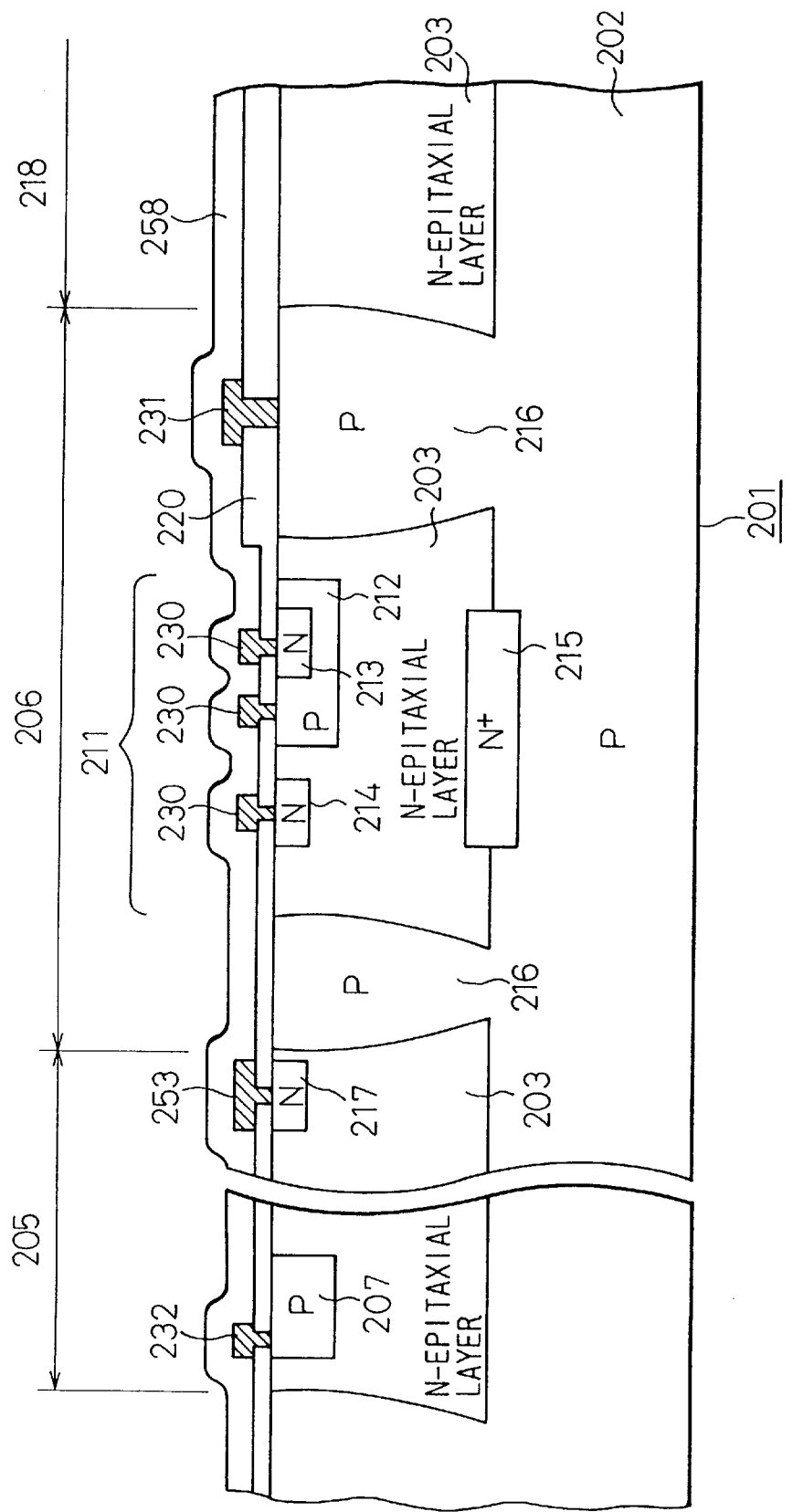
FIG. 38 is a sectional view illustrating a step for producing the semiconductor pressure sensor of the fourth embodiment.

As shown in FIGS. 37 and 38, a passivation film 258 is formed on the whole upper surface of the silicon wafer 201. As the passivation film 258, there is used a silicon nitride film, a silicon oxide film, or a laminate of the silicon nitride film and the silicon oxide film.

Figure 39:
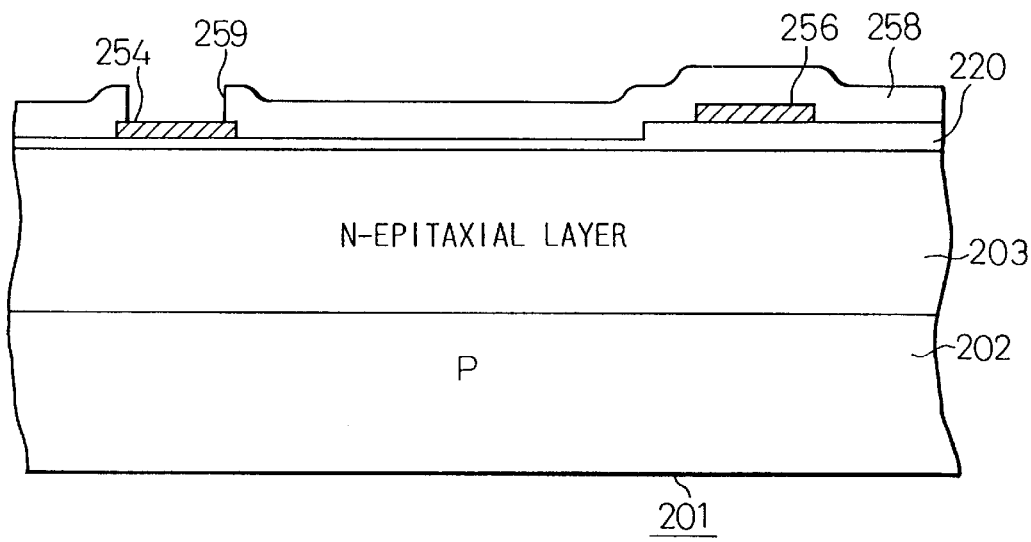
FIG. 39 is a sectional view illustrating a step for producing the semiconductor pressure sensor of the fourth embodiment.
Figure 40:
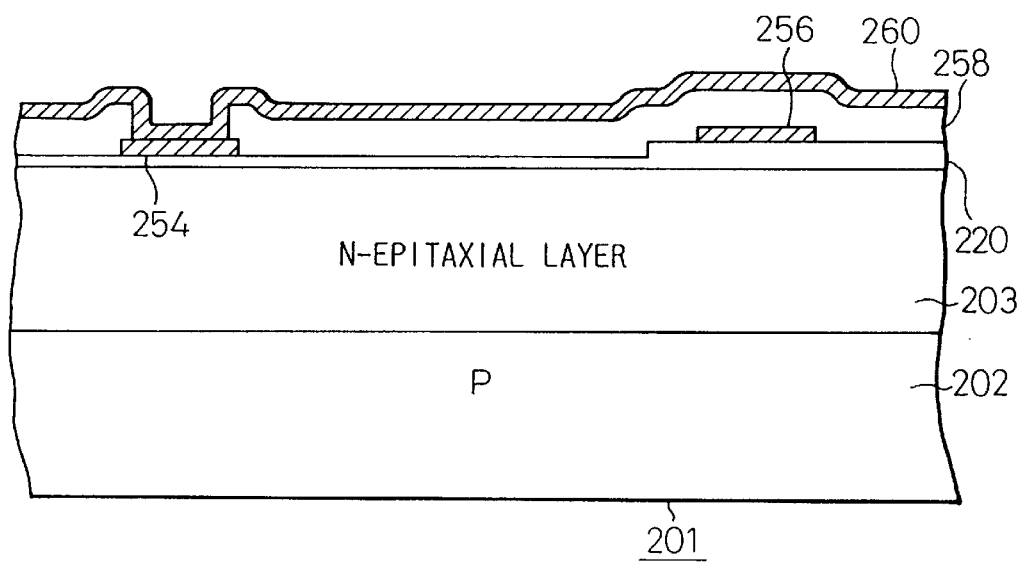
FIG. 40 a sectional view illustrating a step for producing the semiconductor pressure sensor of the fourth embodiment.

Then, as shown in FIG. 39, the passivation film 258 on the aluminum pad 254 is removed by etching to form an opening 259. Then, as shown in FIG. 40, an aluminum film (conductor for electrochemical etching) 260 is formed on the whole surface of the silicon wafer 201.

Figure 41:
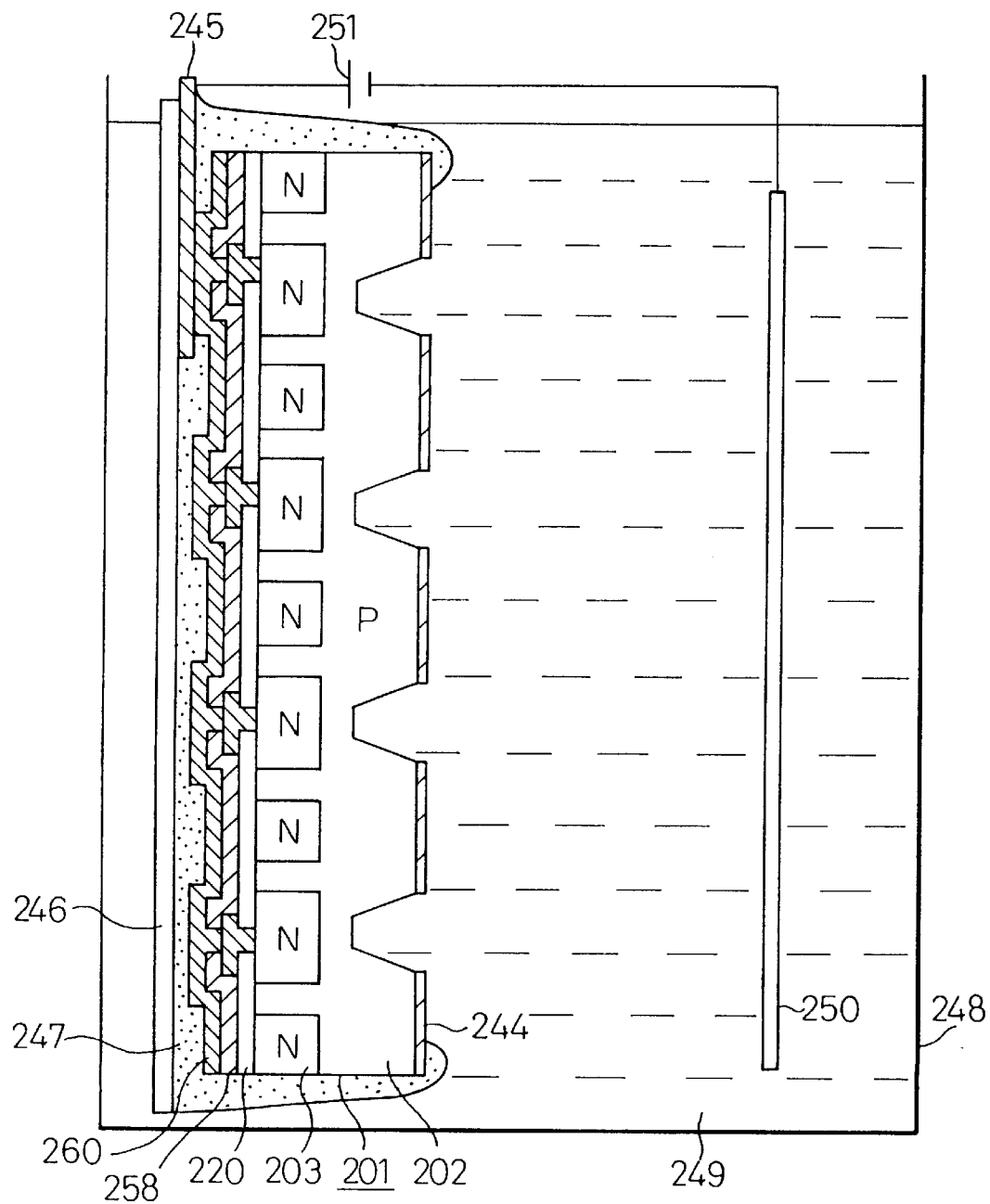
FIG. 41 is a sectional view illustrating a step for producing the semiconductor pressure sensor of the fourth embodiment.
Figure 42:
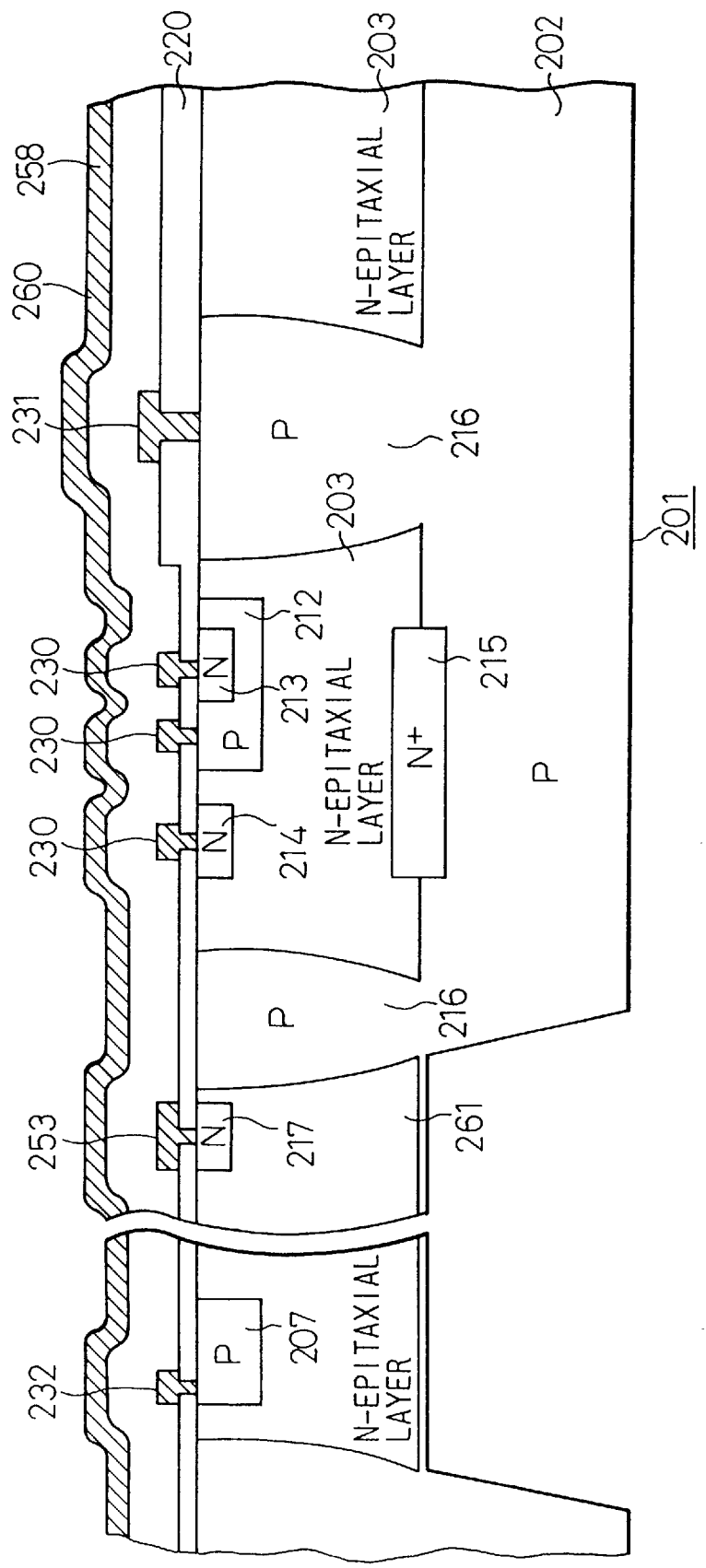
FIG. 42 is a sectional view illustrating a step for producing the semiconductor pressure sensor of the fourth embodiment.

Then, the electrochemical etching is effected as shown in FIG. 41. That is, a mask material 244 is formed on a region where no diaphragm is formed on the surface of the silicon wafer 201 where the n-type epitaxial layer 203 does not exist. Then, a ceramic support substrate 246 is secured to the silicon wafer 201 with a platinum electrode 245 sandwiched therebetween. The surface of the silicon wafer 201 (surface where n-type epitaxial layer 3 is formed) that is not subjected to the etching is protected with wax 247. The platinum electrode 245 is electrically connected to the aluminum wiring 260. A container 248 is filled with a KOH aqueous solution (33% by weight, 82° C.). The silicon wafer 201 is immersed in the KOH aqueous solution 249 in the container 248, and a platinum electrode 250 is disposed so as to be opposed to the silicon wafer 201. A constant-voltage source (2 volts) 251 is connected between the platinum electrode 245 of the silicon wafer 201 and the platinum electrode 250 to apply a constant voltage across the two electrodes 245 and 250. Then, the p-type silicon substrate 202 undergoes electrochemical etching, and the etching stops near the junction portion relative to the n-type epitaxial layer 203. As a result, a diaphragm (thin portion) 261 is formed in the diaphragm-forming region 205 as shown in FIG. 42.

Figure 43:
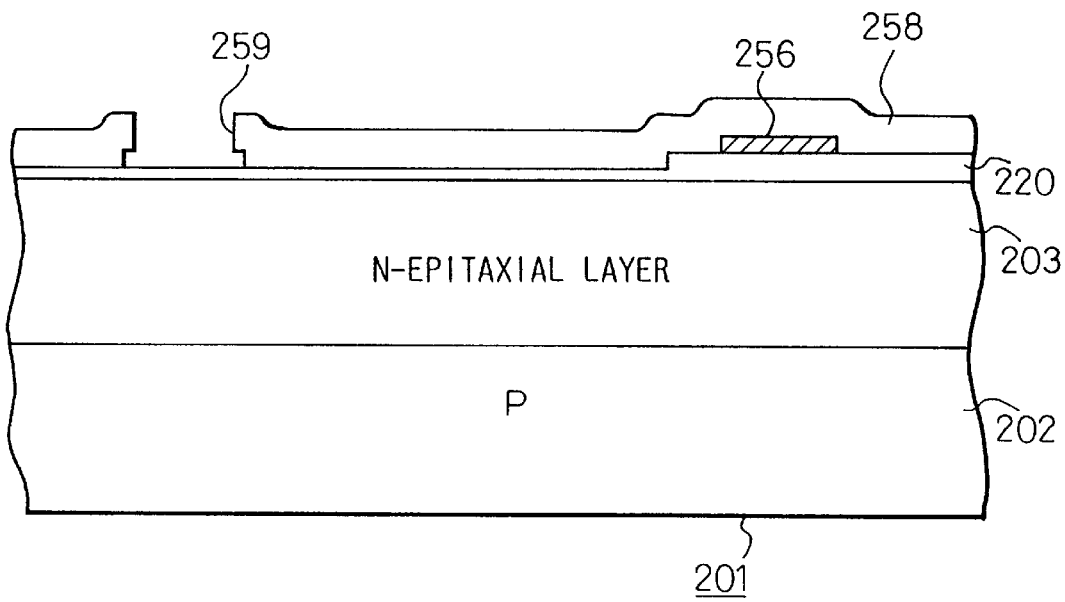
FIG. 43 is a sectional view illustrating a step for producing the semiconductor pressure sensor of the fourth embodiment.
Figure 44:
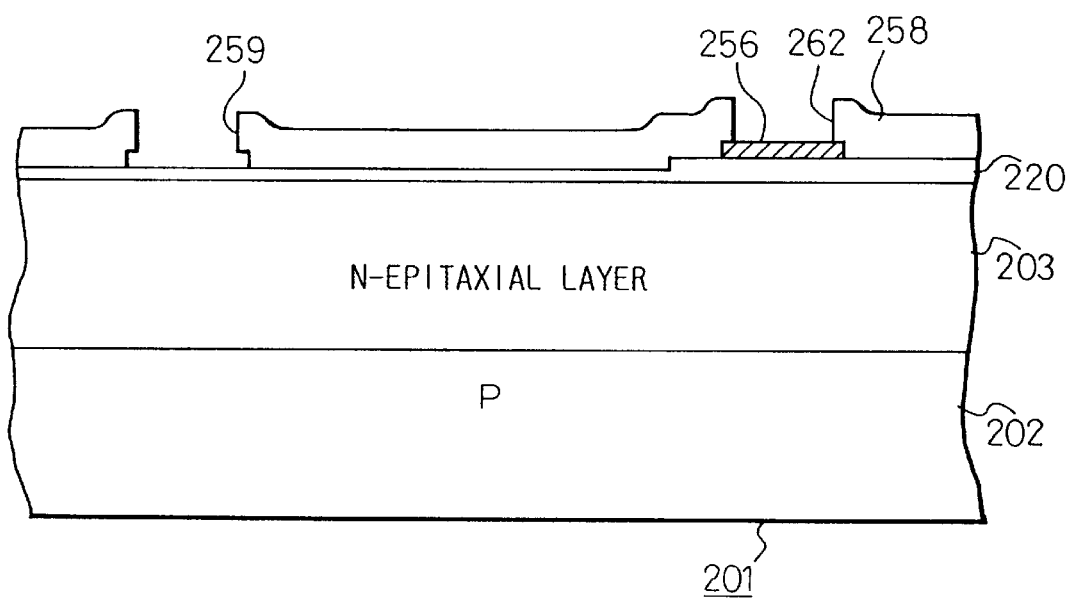
FIG. 44 is a sectional view illustrating a step for producing the semiconductor pressure sensor of the fourth embodiment.

Then, the aluminum film 260 is removed from the whole surface as shown in FIG. 43. Thereafter, as shown in FIG. 44, the passivation film 258 on the aluminum pads 255, 256 and 257 are removed by etching to form openings 262.

The silicon wafer 201 is then cut along the scribe lines into chips.

As described above, this method is concerned with a method of producing a semiconductor pressure sensor wherein the n-type epitaxial layer 203 is formed on the p-type silicon substrate 202, the diaphragm 261 is formed by removing the p-type silicon substrate 202, and the aluminum wiring 231 for a peripheral circuit extends on the surface of the n-type epitaxial layer 203 while being electrically connected to the p-type silicon substrate 202. The aluminum wiring 231 for a peripheral circuit is formed on the silicon wafer 201 made up of the p-type silicon substrate 202 on which the n-type epitaxial layer 203 is formed (first step), the passivation film 258 is formed on the silicon wafer 201 (second step), an aluminum film 260 electrically connected to the n-type epitaxial layer 203 is formed on the passivation film 258 (third step), and a voltage is applied to the aluminum film 260 to electrochemically etch the p-type silicon substrate 202 in order to form the diaphragm 261 (fourth step). Since no aluminum film 260 has been formed on the passivation film 258 during the electrochemical etching, no current leaks from the aluminum film 260 to the p-type silicon substrate 202. As a result, a diaphragm 261 of a predetermined thickness is reliably formed.

In the second step, the passivation film 258 is formed so as to cover the whole surface of the aluminum wiring 231 for a peripheral circuit and in the fourth step, the aluminum pad 256 of the aluminum wiring 231 for a peripheral circuit is exposed after the electrochemical etching. At the time of effecting the electrochemical etching, therefore, the passivation film 258 has been so formed as to cover the whole surface of the aluminum wiring 231 for a peripheral circuit. Therefore, the platinum electrode 245 which is in contact with the aluminum film 260 will not be brought into contact with the aluminum wiring 231 for a peripheral circuit, and the platinum electrode 245 can be placed at any place to improve workability.

Figure 45:
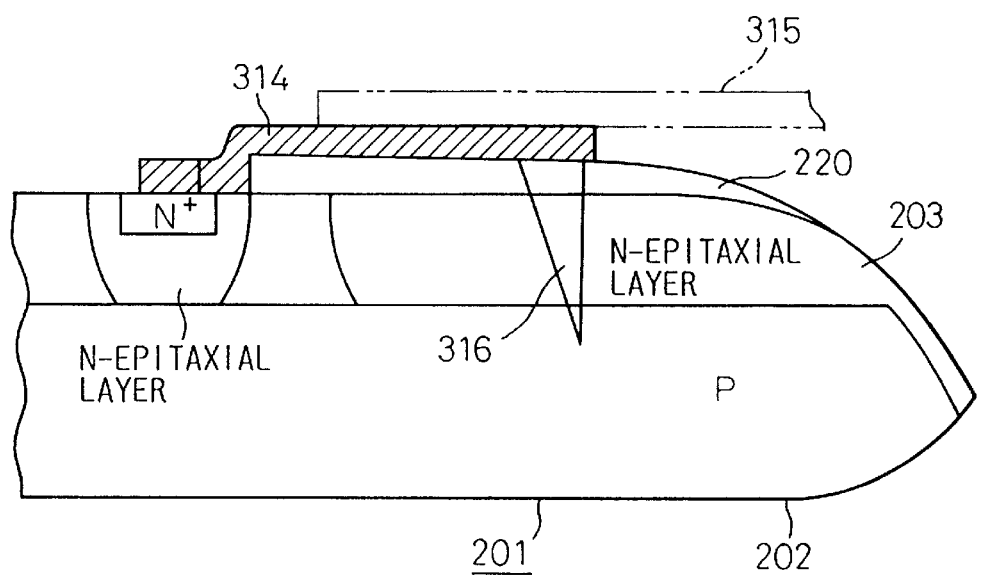
FIG. 45 is a sectional view illustrating a step for producing the semiconductor pressure sensor of the fourth embodiment.

As shown in FIG. 45, furthermore, the electrochemical etching has heretofore been carried out by forming a wiring pattern 314 for etching along the outer periphery of the wafer 201, and by connecting the wiring pattern 314 for etching to the platinum electrode 315 for etching, causing, however, short-circuiting between the wiring pattern 314 for etching and the p-type silicon substrate 202 via conductors 316 formed by scars during handling. According to the embodiment of the invention, on the other hand, the electrochemical etching is effected by forming an aluminum film 260 on the passivation film 258, preventing leakage of current between the wiring for etching along the outer periphery of the wafer 201 and the p-type silicon substrate.

So far, furthermore, the electrochemical etching has been carried out by arranging a wiring material for etching on the scribe lines or on the outer peripheral portions of the wafer, and by introducing impurities for contact in the scribe lines or in the outer peripheral portions of the wafer (corresponds to n-type impurity region 219 for applying etching voltage in FIG. 30). According to this embodiment, however, no such contrivance is necessary on the scribe lines or on the peripheral portions of the wafer.

The conductor for electrochemical etching disposed on the passivation film 258 may be any other electrically conducting material in addition to aluminum film 260.

Embodiment 5

Next, described below is a fifth embodiment. The description is based mainly upon differences from the fourth embodiment.

The method of producing a semiconductor pressure sensor of this embodiment will be described with reference to FIGS. 46 to 50.

Figure 46:
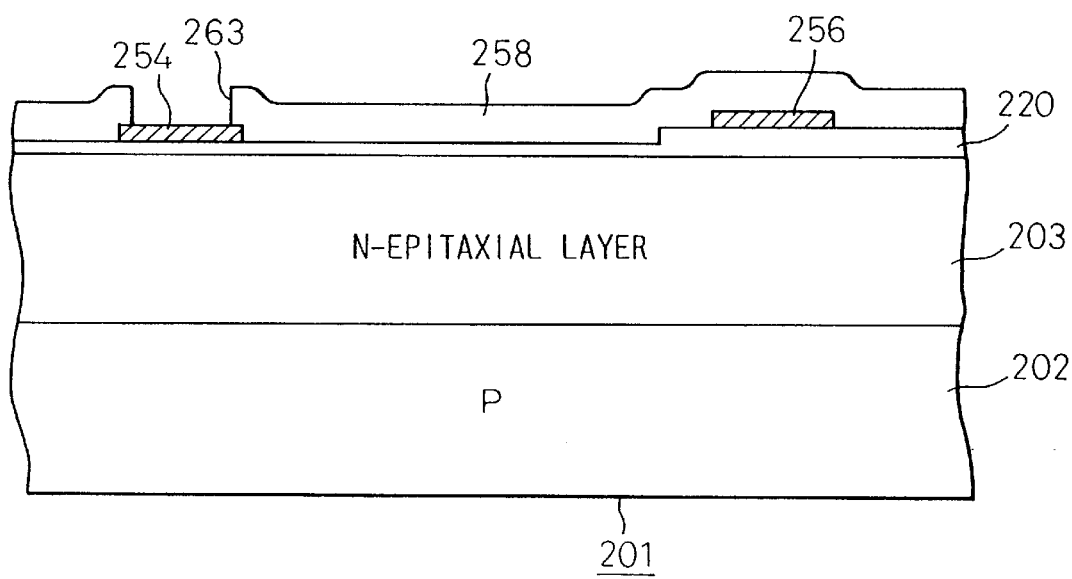
FIG. 46 is a sectional view illustrating a step for producing the semiconductor pressure sensor of a fifth embodiment.
Figure 47:
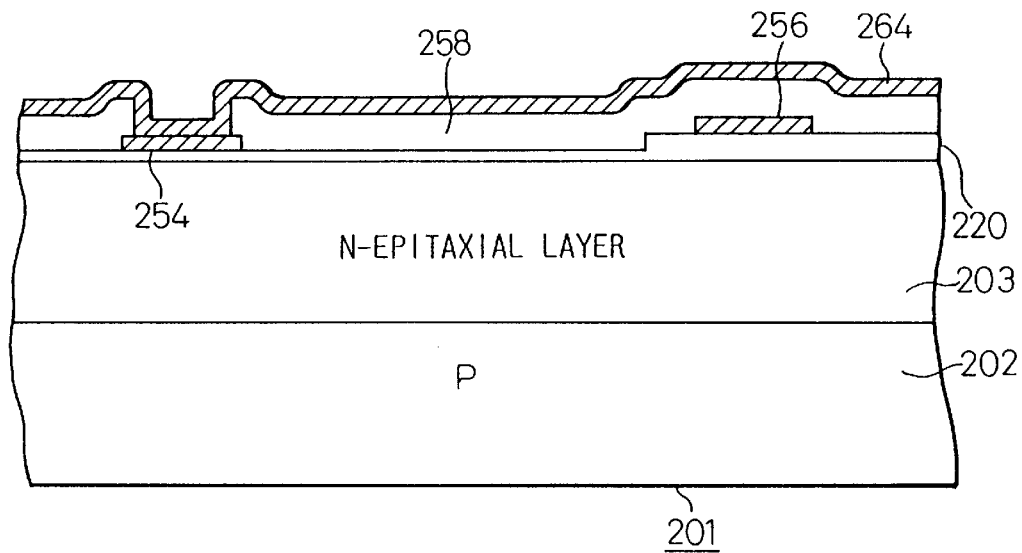
FIG. 47 is a sectional view illustrating a step for producing the semiconductor pressure sensor of the fifth embodiment.

In the state of the fourth embodiment shown in FIGS. 37 and 38, the passivation film 258 on the aluminum pad 254 is etched to form an opening 263 as shown in FIG. 46. Then, as shown in FIG. 47, an aluminum film (conductor for electrochemical etching) 264 is formed on the whole surface of the silicon wafer 201.

Figure 48:
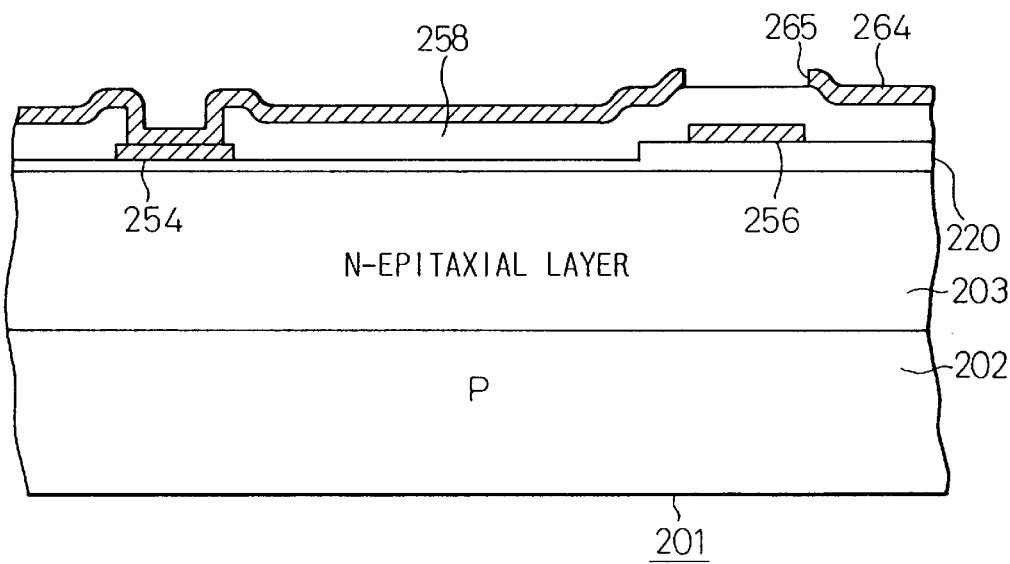
FIG. 48 is a sectional view illustrating a step for producing the semiconductor pressure sensor of the fifth embodiment.
Figure 49:
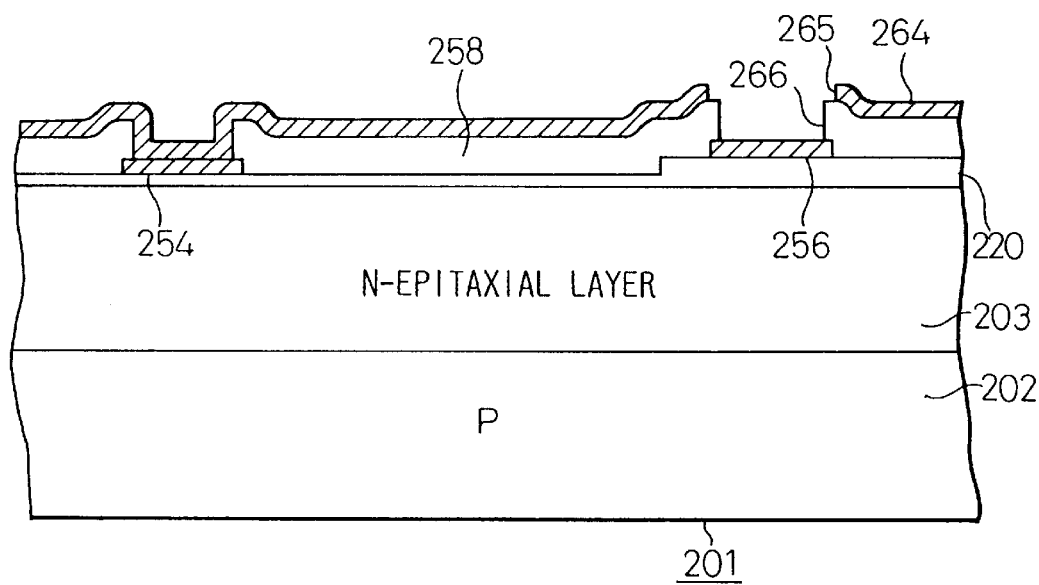
FIG. 49 is a sectional view illustrating a step for producing the semiconductor pressure sensor of the fifth embodiment.

Then, as shown in FIG. 48, the aluminum film 264 is etched on the aluminum pads 255, 256 and 257 to form openings 265. At the same time, the aluminum film 264 is removed from the diaphragm-forming region. Referring next to FIG. 49, the passivation film 258 is removed by etching on the aluminum pads 255, 256 and 257 to form openings 266.

Next, the electrochemical etching is effected as shown in FIG. 41.

Then, the silicon wafer 201 is cut along the scribe lines into chips.

Figure 50:
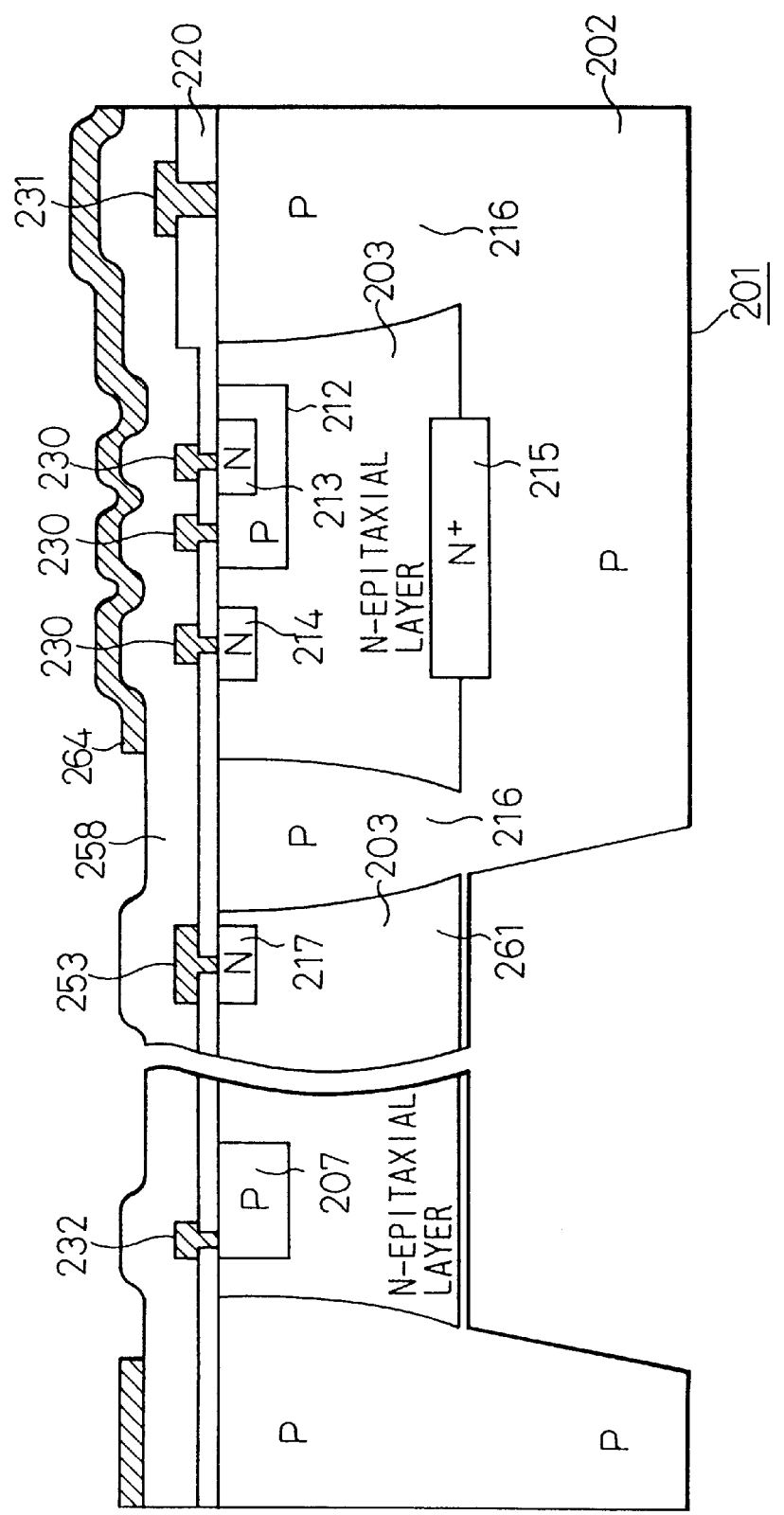
FIG. 50 is a sectional view illustrating a step for producing the semiconductor pressure sensor of the fifth embodiment.

As a result, a semiconductor pressure sensor is produced as shown in FIG. 50. The semiconductor pressure sensor has a passivation film 258 formed on the upper surface of the silicon wafer 201, and further has an aluminum film 264 formed thereon.

According to this embodiment, as described above, a passivation film 258 is formed so as to cover the whole surface of the aluminum wiring 231 for peripheral circuit in the step of forming passivation film (second step in the fourth embodiment), and holes are formed in the aluminum film 264 and in the passivation film 258 on the aluminum pads 256 for ground potential (pads of the metal wiring for connection to the substrate) in the step of forming the conductor for electrochemical etching (third step in the fourth embodiment). In contrast with the fourth embodiment, therefore, there is no need of removing the aluminum film 264 and the passivation film 258 at the pads for ground potential after the electrochemical etching has been effected.

Embodiment 6

Next, described below is a sixth embodiment. The description is based mainly upon differences from the fourth embodiment.

The method of producing a semiconductor pressure sensor of this embodiment will be described with reference to FIGS. 51 to 54.

Figure 51:
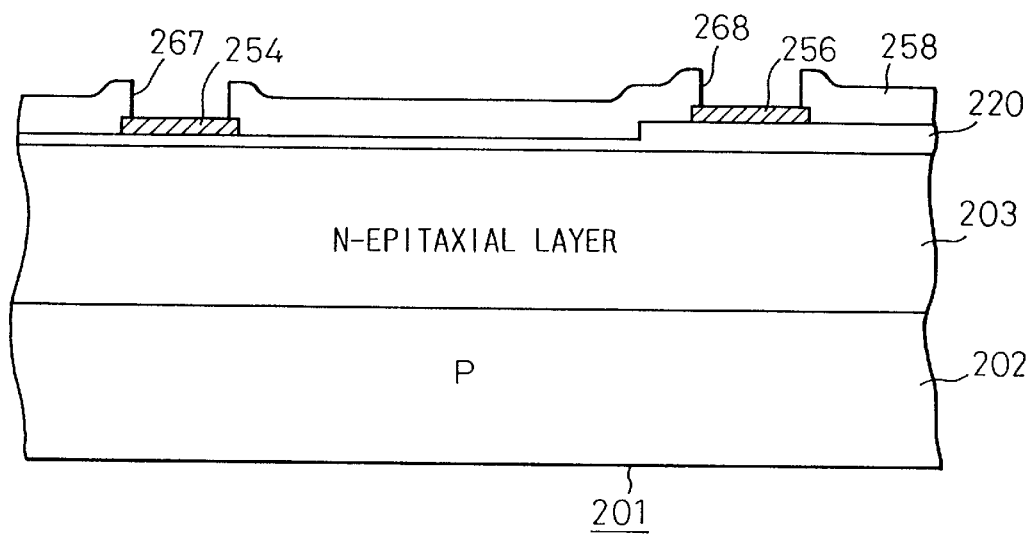
FIG. 51 is a sectional view illustrating a step for producing the semiconductor pressure sensor of a sixth embodiment.
Figure 52:
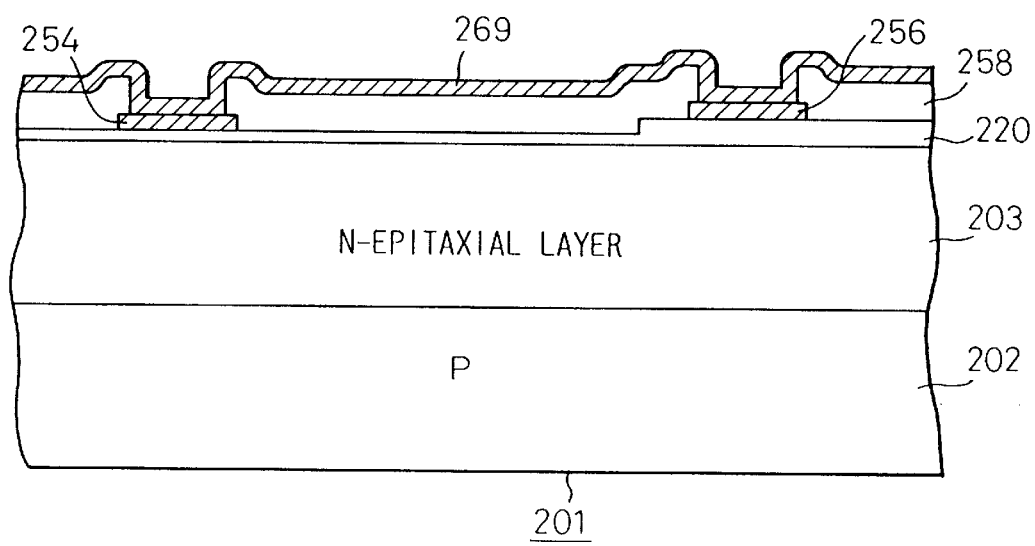
FIG. 52 is a sectional view illustrating a step for producing semiconductor pressure sensor of the sixth embodiment.

In the state of the fourth embodiment shown in FIGS. 37 and 38, the passivation film 258 on the aluminum pads 254, 255, 256 and 257 is etched to form openings 267, 268 as shown in FIG. 51. Then, as shown in FIG. 52, an aluminum film (conductor for electrochemical etching) 269 is formed on the whole surface of the silicon wafer 201.

Figure 53:
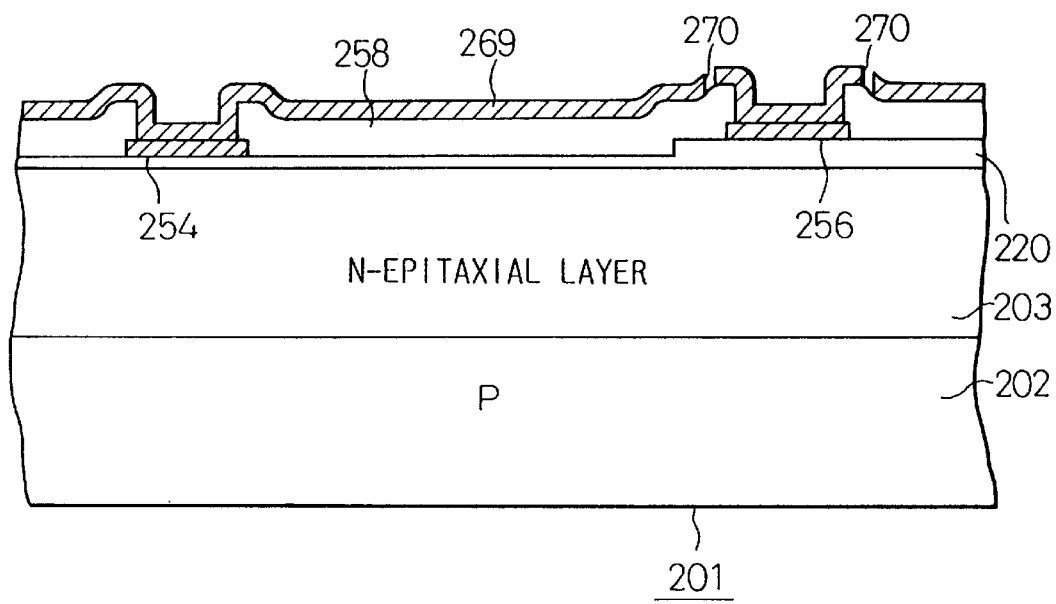
FIG. 53 is a sectional view illustrating a step for producing the semiconductor pressure sensor of the sixth embodiment.

Then, as shown in FIG. 53, the aluminum film 269 is etched around the aluminum pads 255, 256 and 257 to form annular grooves 270 along the whole circumference that work as openings for isolation. At the same time, the aluminum film 269 is removed from the diaphragm-forming region.

Next, the electrochemical etching is effected as shown in FIG. 41.

Then, the silicon wafer 201 is cut along the scribe lines into chips.

Figure 54:
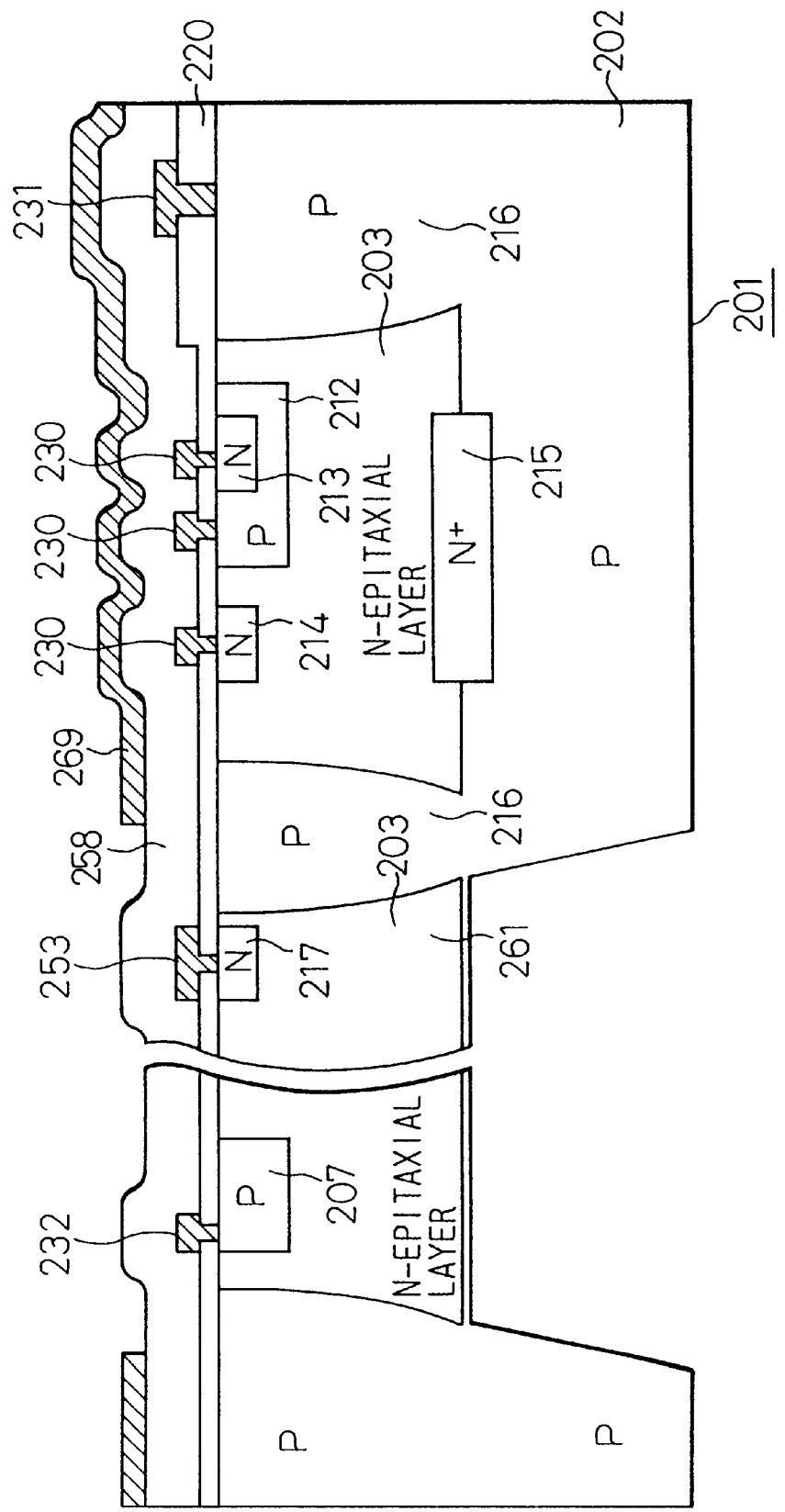
FIG. 54 is a sectional view illustrating a step for producing the semiconductor pressure sensor of the sixth embodiment.

As a result, a semiconductor pressure sensor is produced as shown in FIG. 54. The semiconductor pressure sensor has a passivation film 258 formed on the upper surface of the silicon wafer 201, and further has an aluminum film 269 formed thereon.

According to this embodiment as described above, a passivation film 258 is so formed that the aluminum pads 256 for ground potential (pad of the metal wiring for connection to the substrate) are allowed to be exposed in the step of forming passivation film (second step in the fourth embodiment), and grooves 70 are formed in the aluminum film 269 around the aluminum pads for ground potential 256 (pads of the metal wiring for connection to the substrate) in the step of forming the conductor for electrochemical etching (third step in the fourth embodiment). In contrast with the fourth embodiment, therefore, there is no need of removing the aluminum film 269 and the passivation film 258 at the pads for ground potential after the electrochemical etching has been effected.

Though the foregoing embodiments have dealt with the cases of forming a diaphragm of semiconductor pressure sensor, it should be noted that the invention is in no way limited to the above-mentioned embodiments but can be applied to the case of forming thin portions (beams) in a semiconductor acceleration sensor.

Furthermore, the etching solution is not limited to the KOH aqueous solution but may be a tetramethylammonium hydroxide aqueous solution (TMAH: (CH3)4NOH), an alkaline anisotropic etching solution such as ethylene diamine or the like, or an isotropic etching solution such as hydrofluoric acid or the like.

According to the third aspect of the present invention as will be obvious from the aforementioned embodiments, there is provided a method of producing semiconductor devices having an n-type silicon layer formed on a p-type silicon substrate, a thin portion formed by removing said p-type silicon substrate, and a metal wiring for connection to a substrate that extends on the surface of said n-type silicon layer and is electrically connected to said p-type silicon substrate, said method of producing semiconductor devices comprising a first step for forming a metal wiring for connection to the substrate on a silicon wafer made up of the p-type silicon substrate on which the n-type silicon layer is formed, a second step for forming a passivation film on said silicon wafer, a third step for forming a conductor for electrochemical etching that is electrically connected to the n-type silicon layer on said passivation film, and a fourth step for forming a thin portion by electrochemically etching the p-type silicon substrate by applying a voltage to the conductor for electrochemical etching.

Furthermore, in the second step, the passivation film may be so formed as to cover the whole surface of the metal wiring for connection to a substrate and in the fourth step, pads of the metal wiring for connection to substrate may be exposed after the electrochemical etching.

Moreover, in the second step, the passivation film may be so formed as to cover the whole surface of the metal wiring for connection to substrate and in the third step, openings may be formed in the conductor for electrochemical etching and the passivation film at the pads of the metal wiring for connection to substrate. In the second step, furthermore, the passivation film may be so formed that the pads of the metal wiring for connection to substrate are exposed and in the third step, openings for isolation may be formed in the conductor for electrochemical etching around the pads of the metal wiring for connection to substrate.

According to the present invention as described above in detail, no current is allowed to leak from the metal wiring for electrochemical etching to the p-type silicon substrate, and a thin portion having a predetermined thickness is reliably formed.

According to the present invention, furthermore, no current is allowed to leak from the conductor for electrochemical etching to the p-type silicon substrate, a thin portion having a predetermined thickness is reliably formed, and an electrode can be disposed at any place to come into contact with the conductor for electrochemical etching.

Moreover, in the present invention, neither the conductor for electrochemical etching nor the passivation film needs be removed after the electrochemical etching.

Embodiment 7

Figure 55:
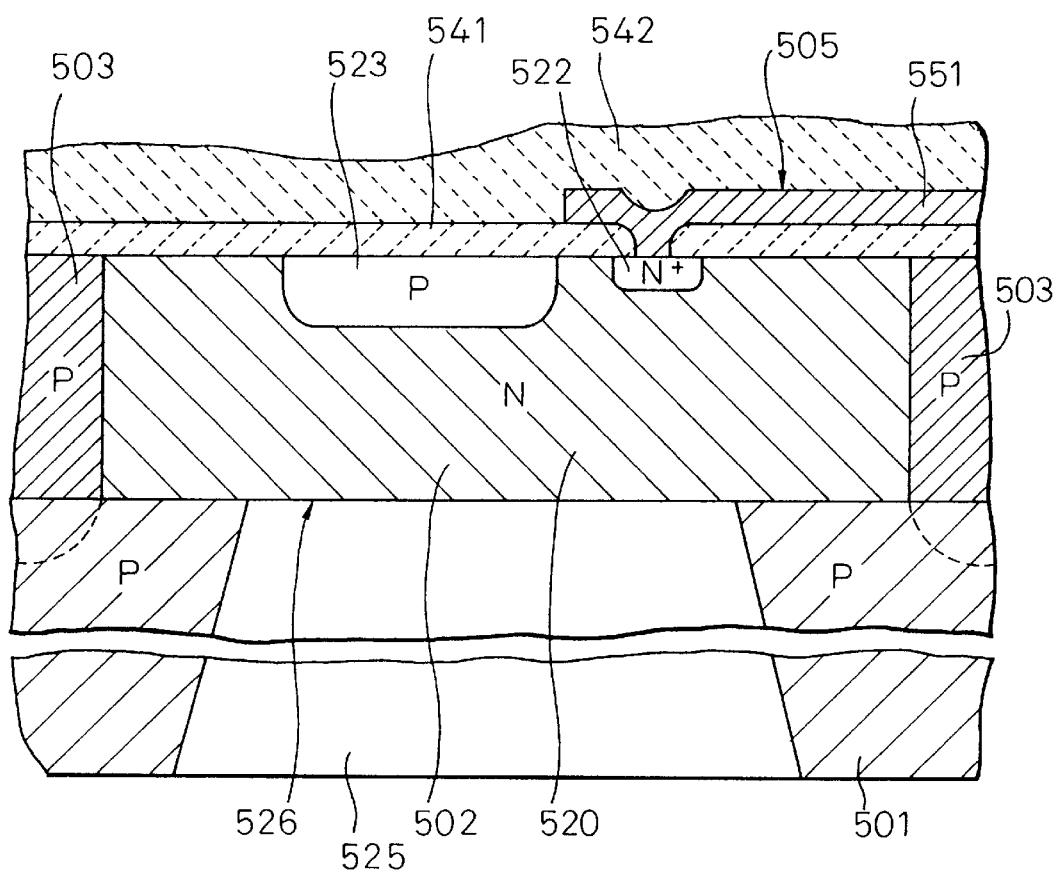
FIG. 55 is a sectional view schematically illustrating a portion of the semiconductor pressure sensor of Embodiment 7 according to the present invention.
Figure 56:
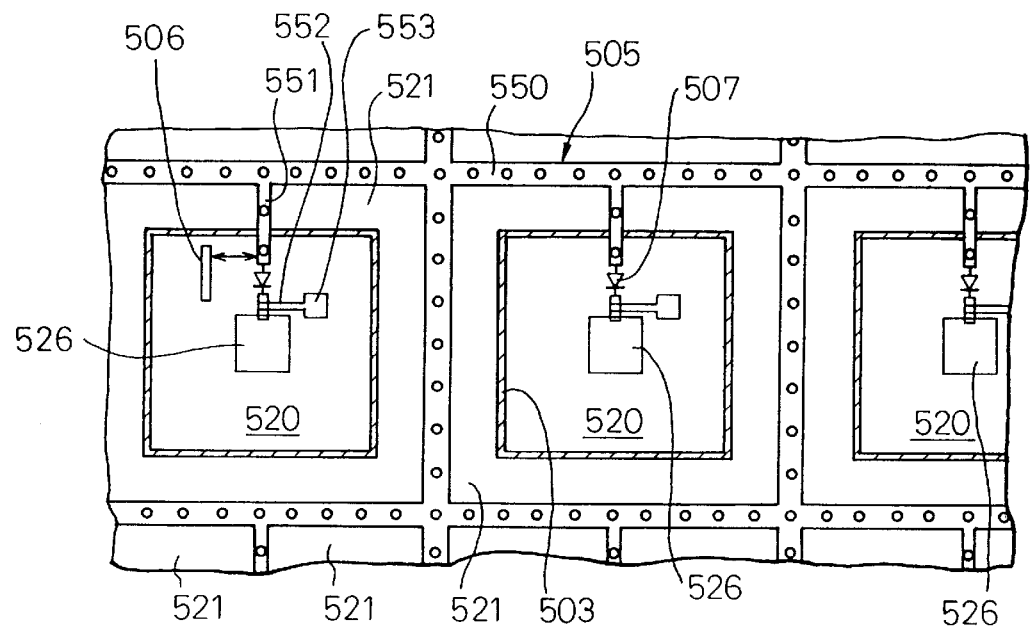
FIG. 56 is a plan view of the semiconductor pressure sensor of FIG. 55.

FIGS. 55 and 56 show a semiconductor pressure sensor as a semiconductor dynamic sensor according to the present invention. An epitaxial wafer in which an N-type epitaxial layer 502 is formed on a P-type substrate 501 consisting of a single silicon crystal having surface orientation (100) or (110) is prepared. In the N-type epitaxial layer 502, a square P-type chip isolating layer 503 is so formed to reach the P-type substrate thereby dividing the N-type epitaxial layer 502 into a chip region 520 surrounded by the chip isolating layer 503 and a scribe region 521 surrounding the chip isolating layer 503. The chip regions 520 are arranged lengthwise and breadthwise over the wafer and each has a surface in which an $N^+$-type region 522 and a P-type strain gauge element 523 are formed. The surfaces of the chip region 520 and the chip isolating layer 503 are covered with a field oxide film 541, on which an etching voltage applying wiring 505 and a circuit wiring 506 are formed of aluminum. The circuit wiring 506 includes all wiring members other than the etching voltage applying wiring 505, which are formed on each of the chip regions 520.

The etching voltage applying wiring is composed of a main line 550 in the form of a square lattice extending along the center line of the scribe region 521 in the form of a square lattice and a branch line 551 extending from the main line 550, running on the field oxide film 541, crossing over the chip isolating layer 503, and running on the chip region 520 to a reduced thickness region 526 of the chip region 520. The branch line 551, in the intermediate portion, has a diode 507 with the cathode directed to the end of the branch line 551. The diode 507 is formed by forming a P-type junction isolating region (not shown) which surrounds a portion of the chip region 520 or the scribe region 521, but may also be formed in any other known ways. As shown in FIG. 55, the branch line 551 has an end connected to the N$^+$-type region 522 in order to apply the necessary voltage to the N-type chip region 520 during electrochemical stop etching.

A groove 525 is formed by electrochemical stop etching and the reduced thickness region 526 is formed from the chip region 520 and defines the bottom of the groove 525. The P-type strain gauge element 523 and the N$^+$-type region 522 are formed in the surface portion of the reduced region 526.

Figure 57:
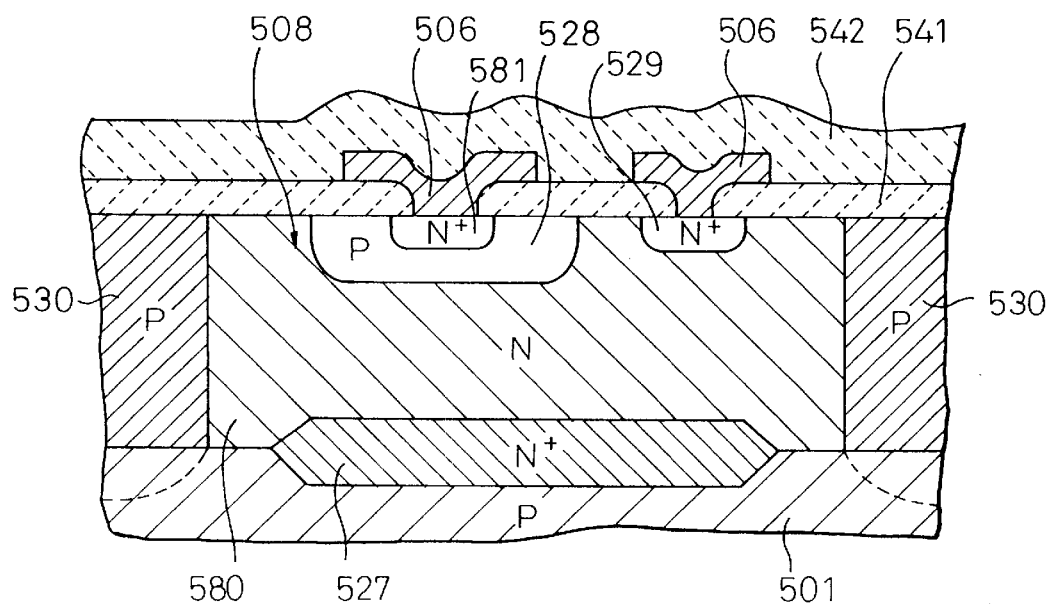
FIG. 57 is a sectional view schematically illustrating another portion of the semiconductor pressure sensor of FIG. 55.

As shown in FIG. 57, a bipolar integrated circuit is also formed in a portion of the chip region 520 other than the reduced thickness region 526. The integrated circuit shown in FIG. 57 includes a bipolar transistor 508 as a main component thereof. A junction isolating region 530 is formed in the same process step as that for forming the chip isolating layer 503 to isolate the side wall of an N-type collector region 580. A buried N$^+$-type collector region 527 is formed in the bottom of the N-type collector region 580; a P-type base region 528 is formed in the same process step as that in which the P-type strain gauge element 523 is formed; a surface collector region 529 is formed in the same process step as that in which the N$^+$-type region 522 is formed; and an emitter region 581 is formed in the same process step as that in which the N$^+$-region 522 is formed. The regions 528, 529, and 581 are connected to different circuit wiring members 6 to form a circuitry together with other integrated circuits which are not shown.

An inspection pad connection wiring 552 is further branched from the branch line 551 and is connected to an inspection pad 553 at the end thereof. The inspection pad connecting wiring 552 and the inspection pad 553 are both formed at the same time as the branch line 551 on the chip region 20 via an intervening field oxide film 541. A protective insulating film 542 entirely covers the wafer surface except for the surface of the inspection pad 553.

The above-described device structure is formed in a conventional process as described below.

Figure 58A:
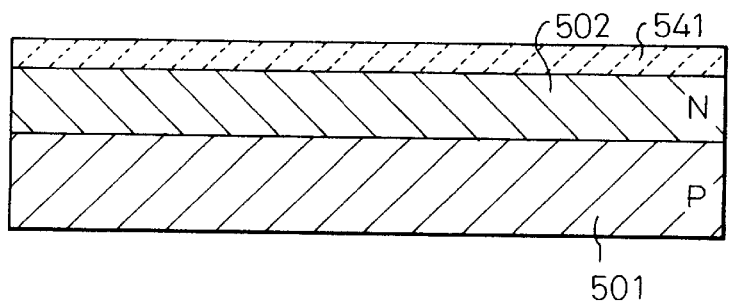
FIGS. 58(A) to 58(D) are sectional views schematically illustrating the process steps for producing the semiconductor pressure sensor shown in FIGS. 55 to 57 according to the present invention.
Figure 58B:
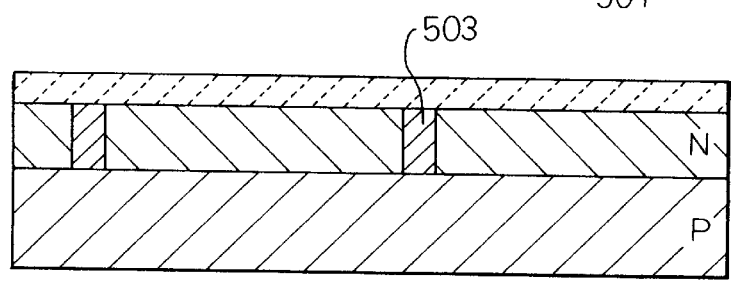
Figure 58C:
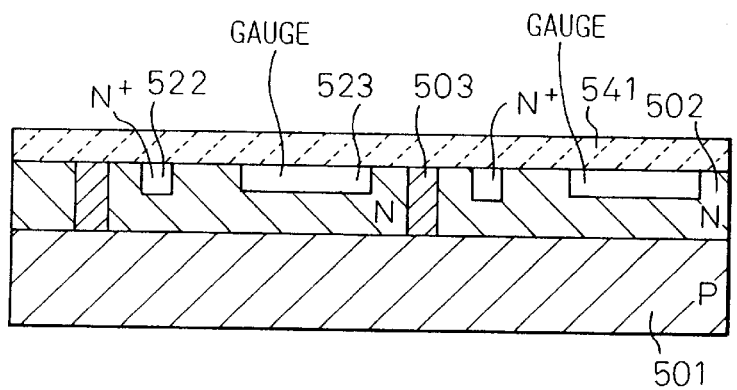
Figure 58D:
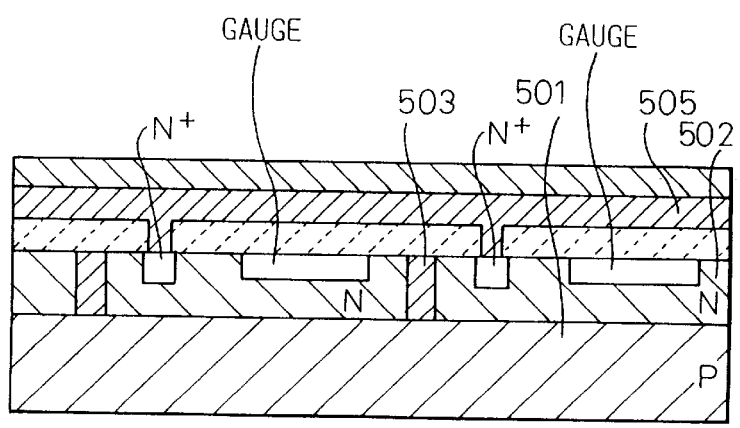
Figure 60:
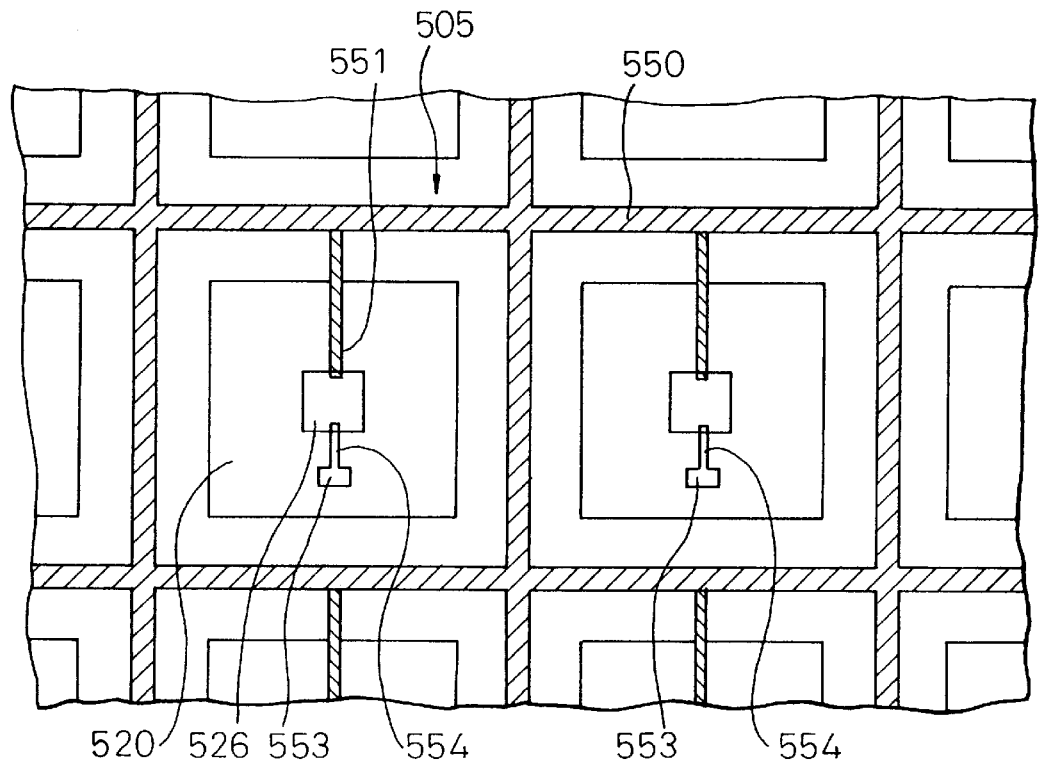
FIG. 60 is a plan view schematically illustrating the semiconductor pressure sensor of Embodiment 8 according to the present invention.
Figure 61:
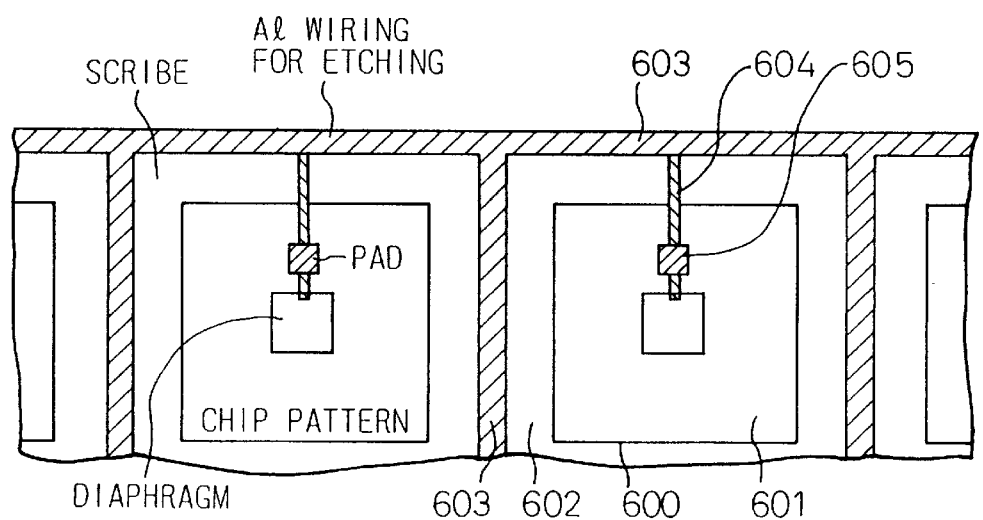
FIG. 61 is a plan view schematically illustrating a conventional semiconductor pressure sensor.

A wafer, in which an N-type region 502 has been epitaxially grown on a P-type substrate 501, is heat-treated, for example, at 800 to 1100° C., in a dry or wet oxygen gas atmosphere, to form a 5000 to 10000 Å thick field oxide film 541 (FIG. 58(A)), followed by forming a chip isolating layer 503 (FIG. 58(B)), an N$^+$-type region 522 and a P-type strain gauge element 523 (FIG. 58(C)) in that order. An etching voltage applying wiring 505 and a circuit wiring 506 are then formed, followed by forming a surface protective film 542 (FIG. 58(D)).

Thereafter, a nitride mask having an opening is formed on the rear surface of the wafer; which is then surface-coated with a wax and fixed to a holder plate via the intervening wax coating; an electrode lead is connected to the etching voltage applying wiring 505 and protrudes upward; the wafer is immersed in an electrolyte solution of a KOH aquarius solution with the electrode lead kept not wetted by the solution; and electrochemical stop etching is then conducted by applying a DC current between the electrode lead and an electrode plate disposed facing the rear surface of the wafer with a plus potential imparted to the electrode lead, thereby effecting anisotropic etching to form a groove 525.

This embodiment has the following features.

In this embodiment, the minimum gap between the etching voltage applying wiring 505 and the neighboring circuit wiring 506 was 48 μm and the minimum gap between members of the circuit wiring 506 was 9.6 μm. This prevented the occurrence of a short circuit or a layer short circuit in the etching voltage applying wiring 505, particularly in the branch line 551, so that no defects occurred in electrochemical stop etching and successful results were obtained in many lots.

Test

Percent defective of electrochemical stop etching due to a short circuit or a layer short circuit between the etching voltage applying wiring 505 and the circuit wiring 506 was studied. The results are summarized in FIG. 59.

The test was carried out under the following conditions. Ten wafers were prepared for each of different etching voltage applying wiring gaps of three, four, five, seven, nine, and eleven times greater than the circuit wiring gap. To minimize the chip defects due to the process parameters other than the etching voltage applying wiring gap, the ten wafers were sampled from different lots. In FIG. 59, the axis of ordinates represents the average percent defective for the ten wafers. After scribing the wafer, the electrochemical stop etching was judged defective when the junction leakage current between the chip region 520 and the P-type substrate 501 exceeded a reference value.

The results showed that the average percent defective (i.e., the percent chip defective due to defective etching) is almost zero when the gap ratio of the etching voltage application wiring gap to the circuit wiring gap is 5 or more. The percent etching defective sharply increases when the gap ratio is less than 4. Therefore, the reduction in the chip yield can be prevented by using an increased gap ratio, preferably of 4 or more. The sharp change between gap ratios of 3 and 4 has not yet been fully clarified. When the gap ratio is more than 10, the area necessary for the etching voltage applying wiring gap increases and the number of the chips on a wafer is decreased to lower the chip yield. Therefore, the gap ratio is most preferably from 4 to 10.

As already described, this embodiment is also characterized by the fact that the inspection pad connecting wiring 52 is further branched from the branch line 551 of the etching voltage applying wiring 505 and has an inspection pad 553 at the tip thereof. The use of the inspection pad 553 has already been described.

This feature provides an advantage because, even if the etching proceeds while the wafer is wet with water to cause the corrosion of the inspection pad 553 to occur, the etching voltage is surely applied from the etching voltage applying wiring 505 through the N$^+$-type region 22 to the chip region during electrochemical stop etching and the etching termination time does not vary and does not cause the resulting chip defect to occur. A suitable protective insulating film 42 is an SiN-based film.

Embodiment 8

In this embodiment, an inspection pad connecting wiring 554 has a tip which is not connected to the branch line 551 as in Embodiment 7 but is connected to an N$^+$-type region (not shown) formed in the surface portion of the reduced thickness region 526 at the same time as the N$^+$-type region 22.

Because of the feature that the inspection pad connecting wiring 554 to be connected to the inspection pad 553 is formed separately from the branch line 551, even if corrosion occurs in the inspection pad 553, the voltage applied from the etching voltage applying wiring 505 to the N$^+$-type region 22 does not vary and does not cause the variation in the thickness of the reduced thickness region 526 to occur, so that the chip yield is improved.

It will be readily recognized by a person skilled in the art that the scribe region 21 is subjected to dicing cut; that the advantageous feature of the present invention may not only be used in pressure sensors having a reduced thickness region 26 in the form of a diaphragm, but also be used in other devices such as an acceleration sensor having a reduced thickness region in the form of a beam; and that the material of the etching voltage applying wiring 505 is not necessarily limited to aluminum but may be other metal materials in which corrosion occurs in the presence of water during electrochemical stop etching.

I claim:

1. A semiconductor device comprising:
   a first conductivity type semiconductor substrate in which a reduced thickness region is formed;
   a second conductivity type semiconductor layer disposed on said first conductivity type semiconductor substrate;
   circuit wiring disposed on said second conductivity type semiconductor layer, a pair of wiring lines of said circuit wiring that are closest to each other being separated by a first distance; and
   etching wiring contacting said semiconductor layer at a region where said reduced thickness region is located thereunder, said etching wiring being utilized for applying an etching voltage to said region during formation of said reduced thickness region,
   wherein a minimum distance between said etching wiring and said circuit wiring is defined by a second distance greater than said first distance.

2. A semiconductor device according to claim 1 further comprising:
   a chip region disposed on said second conductivity type semiconductor layer, said circuit wiring formed on said chip region; and
   an isolating layer surrounding said chip region.

3. A semiconductor device according to claim 2, wherein said chip region has an integrated circuit element region to which said circuit wiring is connected.

4. A semiconductor device according to claim 3, wherein said second distance is four to ten times greater than said first distance.

5. A semiconductor device according to claim 4, wherein said etching wiring and said circuit wiring are made of metal.

6. A semiconductor device according to claim 1, wherein a member of said circuit wiring that is nearest to said etching wiring is connected to said first conductivity type substrate.

7. A semiconductor device according to claim 6 further comprising:
   a chip region disposed on said second conductivity type semiconductor layer, said circuit wring formed on said chip region; and
   an isolating layer surrounding said chip region.

8. A semiconductor device according to claim 7, wherein said second distance is four to ten times greater than said first distance.

9. A semiconductor device according to claim 8, wherein said etching wiring and said circuit wiring are made of metal.

10. A semiconductor device according to claim 1, wherein said etching wiring and said circuit wiring are disposed on an insulating film.

11. A semiconductor device according to claim 10 further comprising:
    a chip region disposed on said second conductivity type semiconductor layer, said circuit wring formed on said chip region; and
    an isolating layer surrounding said chip region.

12. A semiconductor device according to claim 11, wherein said second distance is four to ten times greater than said first distance.

13. A semiconductor device according to claim 12, wherein said etching wiring and said circuit wiring are made of metal.

14. A semiconductor device according to claim 1, wherein said second distance is four times or more greater than said first distance.

15. A semiconductor device according to claim 14, wherein said etching wiring and said circuit wiring are made of metal.

16. A semiconductor device according to claim 14, wherein said second is up to ten times greater than said first distance.

17. A semiconductor device according to claim 16, wherein said etching wiring and said circuit wiring are made of metal.

18. A semiconductor device according to claim 2, further comprising:
    a branch wiring member branched from said etching wiring in said chip region; and
    an inspection pad connected to said branch wiring member for receiving a voltage to detect a junction leakage current between said first conductivity type semiconductor substrate and said second conductivity type semiconductor layer.

19. A semiconductor device according to claim 18, wherein said branch wiring member is made of the same material as that of said etching wiring.

20. A semiconductor device according to claim 19, wherein said branch wiring member is covered with a protective insulating film and said inspection pad is exposed in an opening of said protective insulating film.

21. A semiconductor device according to claim 2, further comprising:
    an additional wiring member connected to said reduced thickness region and disposed in said chip region at a position different from that of said etching wiring; and
    an inspection pad connected to said additional wiring member for receiving a voltage to detect a junction leakage current between said first conductivity type semiconductor substrate and said second conductivity type semiconductor layer.

22. A semiconductor device according to claim 21, wherein said additional wiring member is made of the same material as that of said etching wiring.

23. A semiconductor device according to claim 22, wherein said additional wiring member is covered with a protective insulating film and said inspection pad is exposed in an opening of said protective insulating film.

24. A semicoductor device comprising:
    a first conductivity type semiconductor substrate in which a reduced thickness region is formed;
    a second conductivity type semiconductor layer disposed on said first conductivity type semiconductor substrate;
    a circuit wiring disposed on said second conductivity type semiconductor layer, a pair of wiring lines of said circuit wiring that are closest to each other being separated by a first distance;
    etching wiring connected to said semiconductor layer at a region where said reduced thickness region is located thereunder, said etching wiring being utilized for applying an etching voltage to said region during formation of said reduced thickness region;
    a chip region disposed on said second conductivity type semiconductor layer, said circuit wiring being disposed in said chip region;

a branch wiring member branched from said etching wiring in said chip region; and an inspection pad connected to said branch wiring member for receiving a voltage to detect the amount of junction leakage current between said first conductivity type semiconductor substrate and said second conductivity type semiconductor layer.

25. A semiconductor device according to claim 24, wherein said branch wiring member is made of the same material as said etching wiring.

26. A semiconductor device according to claim 25, wherein said branch wiring member is covered with a protective insulating film and said inspection pad is exposed in an opening of said protective insulating film.

27. A semiconductor device comprising:

a first conductivity type semiconductor substrate in which a reduced thickness region is formed;

a second conductivity type semiconductor layer disposed on said first conductivity type semiconductor substrate;

a circuit wiring disposed on said second conductivity type semiconductor layer, a pair of wiring lines of said circuit wiring that are closest to each other being separated by a first distance;

etching wiring connected to said semiconductor layer at a region where said reduced thickness region is located thereunder, said etching wiring being utilized for applying an etching voltage to said region during formation of said reduced thickness region;

a chip region disposed on said second conductivity type semiconductor layer, said circuit wiring being disposed in said chip region;

an additional wiring member connected to said reduced thickness region and disposed in said chip region at a position different from that of said etching wiring; and an inspection pad connected to said additional wiring member for receiving a voltage to detect a junction leakage current between said first conductivity type semiconductor substrate and said second conductivity type semiconductor layer.

28. A semiconductor device according to claim 27 wherein said additional wiring member is made of the same material as said etching wiring.

29. A semiconductor device according to claim 28, wherein said additional wiring member is covered with a protective insulating film and said inspection pad is exposed in an opening of said protective insulating film.

30. A semiconductor device comprising:

a first conductivity type semiconductor substrate in which a reduced thickness region is formed;

a second conductivity type semiconductor layer disposed on said first conductivity type semiconductor substrate;

circuit wiring disposed on said second conductivity type semiconductor layer, a pair of wiring lines of said circuit wiring that are closest to each other being separated by a first distance;

etching wiring connected to said semiconductor layer at a region where said reduced thickness region is located thereunder, said etching wiring being utilized for applying an etching voltage to said region during formation of said reduced thickness region, a chip region disposed on said second conductivity type semiconductor layer, said circuit wiring formed on said chip region;

an isolating layer surrounding said chip region, a branch wiring member branched from said etching wiring in said chip region; and an inspection pad connected to said branch wiring member for receiving a voltage to detect a junction leakage current between said first conductivity type semiconductor substrate and said second conductivity type semiconductor layer, wherein a minimum distance between said etching wiring and said circuit wiring is defined by a second distance greater than said first distance.

31. A semiconductor device comprising:

a first conductivity type semiconductor substrate in which a reduced thickness region is formed;

a second conductivity type semiconductor layer disposed on said first conductivity type semiconductor substrate;

circuit wiring disposed on said second conductivity type semiconductor layer, a pair of wiring lines of said circuit wiring that are closest to each other being separated by a first distance;

etching wiring connected to said semiconductor layer at a region where said reduced thickness region is located thereunder, said etching wiring being utilized for applying an etching voltage to said region during formation of said reduced thickness region, a chip region disposed on said second conductivity type semiconductor layer, said circuit wring formed on said chip region;

an isolating layer surrounding said chip region, an additional wiring member connected to said reduced thickness region and disposed in said chip region at a position different from that of said etching wiring; and an inspection pad connected to said additional wiring member for receiving a voltage to detect a junction leakage current between said first conductivity type semiconductor substrate and said second conductivity type semiconductor layer, wherein a minimum distance between said etching wiring and said circuit wiring is defined by a second distance greater than said first distance.

32. A semiconductor device comprising:

a first conductivity type semiconductor substrate in which reduced thickness regions are formed and a second conductivity type semiconductor layer disposed on said first conductivity type semiconductor substrate, said substrate being composed of a plurality of chip patterns, each containing at least one reduced thickness region, and a plurality of scribe regions between said chip patterns;

circuit wiring disposed on said second conductivity type semiconductor layer in each said chip pattern, a pair of wiring lines of said circuit wiring that are closest to each other being separated by a first distance in each said chip pattern; and etching wiring contacting said semiconductor layer at etching wiring regions where said reduced thickness regions are located thereunder, said etching wiring being utilized for applying an etching voltage to said etching wiring regions during formation of said reduced thickness regions, wherein a minimum distance between said etching wiring and said circuit wiring in each said chip pattern is defined by a second distance greater than said first distance.

* * * * *